US010134998B2

(12) United States Patent
Seo et al.

(10) Patent No.: US 10,134,998 B2
(45) **Date of Patent: *Nov. 20, 2018**

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Satoshi Seo, Kanagawa (JP); Nobuharu Ohsawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 116 days.

This patent is subject to a terminal disclaimer.

(21) Appl. No.: 15/155,283

(22) Filed: May 16, 2016

(65) Prior Publication Data

US 2016/0343949 A1 Nov. 24, 2016

(30) Foreign Application Priority Data

May 21, 2015 (JP) ................................ 2015-103759

(51) Int. Cl.
*H01L 51/00* (2006.01)
*H01L 51/50* (2006.01)
(Continued)

(52) U.S. Cl.
CPC .......... *H01L 51/0052* (2013.01); *C09K 11/06* (2013.01); *H01L 51/006* (2013.01);
(Continued)

(58) Field of Classification Search
CPC ............. H01L 51/0062; H01L 51/5012; H01L 51/5016; C09K 11/06; C09K 2211/1466; C09K 2211/1475; C09K 2211/1483
See application file for complete search history.

(56) References Cited

U.S. PATENT DOCUMENTS 5,597,890 A 1/1997 Jenekhe
5,599,899 A 2/1997 Jenekhe et al.
(Continued)

FOREIGN PATENT DOCUMENTS

CN 101490862 A 7/2009
EP 1202608 A 5/2002
(Continued)

OTHER PUBLICATIONS

International Search Report (Application No. PCT/IB2016/052683) dated Aug. 30, 2016.
(Continued)

*Primary Examiner* — C Melissa Koslow
(74) *Attorney, Agent, or Firm* — Fish & Richardson P.C.

(57) ABSTRACT

A light-emitting element containing a light-emitting material with high light emission efficiency is provided. The light-emitting element includes a high molecular material and a guest material. The high molecular material includes at least a first high molecular chain and a second high molecular chain. The guest material has a function of exhibiting fluorescence or converting triplet excitation energy into light emission. The first high molecular chain and the second high molecular chain each include a first skeleton, a second skeleton, and a third skeleton, and the first skeleton and the second skeleton are bonded to each other through the third skeleton. The first high molecular chain and the second high molecular chain have a function of forming an excited complex.

9 Claims, 35 Drawing Sheets

(51) Int. Cl.
*C09K 11/06* (2006.01)
*H01L 27/32* (2006.01)

(52) U.S. Cl.
CPC ...... *H01L 51/0035* (2013.01); *H01L 51/0043* (2013.01); *H01L 51/0059* (2013.01); *H01L 51/0062* (2013.01); *H01L 51/0067* (2013.01); *H01L 51/0072* (2013.01); *C09K 2211/1416* (2013.01); *C09K 2211/1433* (2013.01); *C09K 2211/1466* (2013.01); *C09K 2211/1475* (2013.01); *C09K 2211/1483* (2013.01); *H01L 27/323* (2013.01); *H01L 27/3211* (2013.01); *H01L 27/3244* (2013.01); *H01L 27/3281* (2013.01); *H01L 51/5012* (2013.01); *H01L 51/5016* (2013.01); *H01L 2251/5361* (2013.01)

(56) References Cited

U.S. PATENT DOCUMENTS

| | | | |
|---|---|---|---|
| 5,726,282 | A | 3/1998 | Jenekhe et al. |
| 5,814,833 | A | 9/1998 | Jenekhe |
| 5,959,070 | A | 9/1999 | Jenekhe et al. |
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,597,967 | B2 | 10/2009 | Kondakova et al. |
| 7,906,226 | B2 | 3/2011 | Matsuura et al. |
| 7,993,760 | B2 | 8/2011 | Komori et al. |
| 8,034,465 | B2 | 10/2011 | Liao et al. |
| 8,105,701 | B2 | 1/2012 | Matsuura et al. |
| 8,274,214 | B2 | 9/2012 | Ikeda et al. |
| 8,470,455 | B2 | 6/2013 | Matsuura et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,159,942 | B2 | 10/2015 | Seo et al. |
| 9,175,213 | B2 | 11/2015 | Seo et al. |
| 9,276,228 | B2 | 3/2016 | Seo et al. |
| 9,356,250 | B2 | 5/2016 | Ohsawa et al. |
| 9,604,928 | B2 | 3/2017 | Shitagaki et al. |
| 2003/0175553 | A1 | 9/2003 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2007/0090756 | A1 | 4/2007 | Okada et al. |
| 2009/0184635 | A1 | 7/2009 | Pan et al. |
| 2012/0205632 | A1 | 8/2012 | Shitagaki et al. |
| 2012/0217487 | A1 | 8/2012 | Yamazaki et al. |
| 2014/0175420 | A1 | 6/2014 | Pan et al. |
| 2015/0069352 | A1 | 3/2015 | Kim et al. |
| 2016/0049607 | A1 | 2/2016 | Seo et al. |
| 2016/0093823 | A1* | 3/2016 | Seo .................... H01L 51/5016 257/40 |
| 2016/0308139 | A1 | 10/2016 | Seo et al. |
| 2016/0343954 | A1 | 11/2016 | Seo et al. |

FOREIGN PATENT DOCUMENTS

| | | | |
|---|---|---|---|
| JP | 05-202355 | A | 8/1993 |
| JP | 2007-214465 | A | 8/2007 |
| JP | 2008-288344 | A | 11/2008 |
| JP | 2009-544773 | | 12/2009 |
| JP | 2010-182699 | A | 8/2010 |
| JP | 2012-212879 | A | 11/2012 |
| JP | 2014-045179 | A | 3/2014 |
| JP | 5461181 | | 4/2014 |
| JP | 2014-527290 | | 10/2014 |
| JP | 2016-072632 | A | 5/2016 |
| KR | 2009-0035004 | A | 4/2009 |
| TW | 200820823 | | 5/2008 |
| WO | WO-1995/012628 | | 5/1995 |
| WO | WO-2008/011953 | | 1/2008 |
| WO | WO-2013/013754 | | 1/2013 |
| WO | WO-2016/051309 | | 4/2016 |

OTHER PUBLICATIONS

Written Opinion (Application No. PCT/IB2016/052683) dated Aug. 30, 2016.

Yersin.H et al., Highly Efficient OLEDs with Phosphorescent Materials, 2008, pp. 1-97,283-309.

Tokito.S et al., “Improvement in performance by doping”, Organic EL Display, Aug. 20, 2004, pp. 67-99, Ohmsha.

Jeon.W et al., “Ideal host and guest system in phosphorescent OLEDs”, Organic Electronics, 2009, vol. 10, pp. 240-246, Elsevier.

Su.S et al., “RGB Phosphorescent Organic Light-Emitting Diodes by Using Host Materials with Heterocyclic Cores:Effect of Nitrogen Atom Orientations”, Chem. Mater. (Chemistry of Materials), 2011, vol. 23, No. 2, pp. 274-284.

Rausch.A et al., “Matrix Effects on the Tnplet State of the OLED Emitter Ir(4,6-dFppy)2(pic)(FIrpic):Investigations by High-Resolution Optical Spectroscopy”, Inorg. Chem. (Inorganic Chemistry), 2009, vol. 48, No. 5, pp. 1928-1937.

Gong.X et al., “Phosphorescence from iridium complexes doped into polymer blends”, J. Appl. Phys. (Journal of Applied Physics) , Feb. 1, 2004, vol. 95, No. 3, pp. 948-953.

Zhao.Q et al., “Synthesis and Photophysical, Electrochemical, and Electrophosphorescent Properties of a Series of Iridium(III) Complexes Based on Quinoline Derivatives and Different β-Diketonate Ligands”, Organometallics, Jun. 14, 2006, vol. 25, No. 15, pp. 3631-3638.

Hino.Y et al., “Red Phosphorescent Organic Light-Emitting Diodes Using Mixture System of Small-Molecule and Polymer Host”, Jpn. J. Appl. Phys. (Japanese Journal of Applied Physics) , Apr. 21, 2005, vol. 44, No. 4B, pp. 2790-2794.

Tsuboyama.A et al., “Homoleptic Cyclometalated Iridium Complexes with Highly Efficient Red Phosphorescence and Application to Organic Light-Emitting Diode”, J. Am. Chem. Soc. (Journal of The American Chemical Society), 2003, vol. 125, No. 42, pp. 12971-12979.

Kondakova.M et al., “High-efficiency, low-voltage phosphorescent organic light-emitting diode devices with mixed host”, J. Appl. Phys. (Journal of Applied Physics) , Nov. 4, 2008, vol. 104, pp. 094501-1-094501-17.

Chen.F et al., “Triplet Exciton Confinement in Phosphorescent Polymer Light-Emitting Diodes”, Appl. Phys. Lett. (Applied Physics Letters) , Feb. 17, 2003, vol. 82, No. 7, pp. 1006-1008.

Lee.J et al., “Stabilizing the efficiency of phosphorescent organic light-emitting diodes”, SPIE Newsroom, Apr. 21, 2008, pp. 1-3.

Tokito.S et al., “Confinement of Triplet Energy on Phosphorescent Molecules for Highly-Efficient Organic Blue-Light-Emitting Devices”, Appl. Phys. Lett. (Applied Physics Letters) , Jul. 21, 2003, vol. 83, No. 3, pp. 569-571.

Endo.A et al., “Efficient Up-Conversion of Triplet Excitons Into a Singlet State and Its Application for Organic Light Emitting Diodes”, Appl. Phys. Lett. (Applied Physics Letters) , Feb. 24, 2011, vol. 98, No. 8, pp. 083302-1-083302-3.

Itano.K et al., “Exciplex formation at the organic solid-state interface: Yellow emission in organic light-emitting diodes using green-fluorescent tris(8-quinolinolato)alumin um and hole-transporting molecular materials with low ionization potentials”, Appl. Phys. Lett. (Applied Physics Letters) , Feb. 9, 1998, vol. 72, No. 6, pp. 636-638.

Park.Y et al., “Efficient triplet harvesting by fluorescent molecules through exciplexes for high efficiency organic light-emitting diodes”, Appl. Phys. Lett. (Applied Physics Letters) , Apr. 18, 2013, vol. 102, No. 15, pp. 153306-1-153306-5.

* cited by examiner

LIGHT-EMITTING ELEMENT, DISPLAY DEVICE, ELECTRONIC DEVICE, AND LIGHTING DEVICE

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method of driving any of them, and a method of manufacturing any of them.

BACKGROUND ART

In recent years, research and development have been extensively conducted on light-emitting elements using electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be manufactured to be thin and lightweight, and has high response speed.

In a light-emitting element whose EL layer contains an organic compound as a light-emitting substance and is provided between a pair of electrodes (e.g., an organic EL element), application of a voltage between the pair of electrodes causes injection of electrons from a cathode and holes from an anode into the EL layer having a light-emitting property and thus a current flows. By recombination of the injected electrons and holes, the light-emitting organic compound is brought into an excited state to provide light emission.

As the organic compound contained in the light-emitting element, a low molecular compound or a high molecular compound can be used. Since the high molecular compound is thermally stable and can easily form a thin film with excellent uniformity by a coating method or the like, a light-emitting element containing the high molecular compound has been developed (e.g., see Patent Document 1).

Note that an excited state formed by an organic compound can be a singlet excited state (S*) or a triplet excited state (T*). Light emission from the singlet excited state is referred to as fluorescence, and light emission from the triplet excited state is referred to as phosphorescence. The formation ratio of S* to T* in the light-emitting element is 1:3. In other words, a light-emitting element containing a compound emitting phosphorescence (phosphorescent compound) has higher light emission efficiency than a light-emitting element containing a compound emitting fluorescence (fluorescent compound). Therefore, light-emitting elements containing phosphorescent compounds capable of converting a triplet excited state into light emission has been actively developed in recent years (e.g., see Patent Document 2).

Energy needed for exciting an organic compound depends on an energy difference between the LUMO level and the HOMO level of the organic compound, and the energy difference approximately corresponds to the energy of the singlet excited state. In the light-emitting element containing a phosphorescent compound, triplet excitation energy is converted into light emission energy. Thus, when the energy difference between the singlet excited state and the triplet excited state of an organic compound is large, the energy needed for exciting the organic compound is higher than the light emission energy by the amount corresponding to the energy difference. The energy difference between the energy needed for exciting the organic compound and the light emission energy increases the driving voltage in the light-emitting element and affects element characteristics. Thus, a method for reducing the driving voltage has been searched (see Patent Document 3).

Among light-emitting elements containing phosphorescent compounds, a light-emitting element that emits blue light in particular has yet been put into practical use because it is difficult to develop a stable compound having a high triplet excitation energy level. For this reason, the development of a light-emitting element containing a more stable fluorescent compound has been conducted and a technique for increasing the light emission efficiency of a light-emitting element containing a fluorescent compound (fluorescent element) has been searched.

As one of materials capable of partly converting the energy of the triplet excited state into light emission, a thermally activated delayed fluorescent (TADF) emitter has been known. In a thermally activated delayed fluorescent emitter, a singlet excited state is generated from a triplet excited state by reverse intersystem crossing, and the singlet excited state is converted into light emission.

In order to increase light emission efficiency of a light-emitting element using a thermally activated delayed fluorescent emitter, not only efficient generation of a singlet excited state from a triplet excited state but also efficient emission from a singlet excited state, that is, a high fluorescence quantum yield is important in a thermally activated delayed fluorescent emitter. It is, however, difficult to design a light-emitting material that meets these two.

Patent Document 4 discloses a method: in a light-emitting element containing a thermally activated delayed fluorescent emitter and a fluorescent compound, singlet excitation energy of the thermally activated delayed fluorescent emitter is transferred to the fluorescent compound and light emission is obtained from the fluorescent compound.

REFERENCE

Patent Documents

[Patent Document 1] Japanese Published Patent Application No. H5-202355

[Patent Document 2] Japanese Published Patent Application No. 2010-182699

[Patent Document 3] Japanese Published Patent Application No. 2012-212879

[Patent Document 4] Japanese Published Patent Application No. 2014-45179

DISCLOSURE OF INVENTION

In a light-emitting element containing a light-emitting organic compound, to increase light emission efficiency or to reduce driving voltage, it is preferable that an energy difference between the singlet excited state and the triplet excited state of a host material be small.

In order to increase light emission efficiency of a light-emitting element containing a fluorescent compound, efficient generation of a singlet excited state from a triplet excited state is preferable. In addition, efficient energy transfer from a singlet excited state of the host material to a singlet excited state of the fluorescent compound is preferable.

In view of the above, an object of one embodiment of the present invention is to provide a light-emitting element that contains a fluorescent compound or a phosphorescent compound and has high light emission efficiency. Another object of one embodiment of the present invention is to provide a light-emitting element with low power consumption. Another object of one embodiment of the present invention is to provide a novel light-emitting element. Another object of one embodiment of the present invention is to provide a novel light-emitting device. Another object of one embodiment of the present invention is to provide a novel display device.

Note that the description of the above object does not preclude the existence of other objects. In one embodiment of the present invention, there is no need to achieve all the objects. Objects other than the above objects will be apparent from and can be derived from the description of the specification and the like.

One embodiment of the present invention is a light-emitting element containing a compound which forms an excited complex efficiently. Alternatively, one embodiment of the present invention is a light-emitting element in which a triplet exciton is converted into a singlet exciton and light can be emitted from a compound containing the singlet exciton or light can be emitted from a fluorescent compound due to energy transfer of the singlet exciton.

Thus, one embodiment of the present invention is a light-emitting element including a high molecular material and a guest material. The high molecular material includes at least a first high molecular chain and a second high molecular chain. The guest material has a function of exhibiting fluorescence. The first high molecular chain and the second high molecular chain each include a first skeleton, a second skeleton, and a third skeleton. The first skeleton and the second skeleton are bonded to each other through the third skeleton. The first skeleton has a function of transferring holes. The second skeleton has a function of transferring electrons. The first high molecular chain and the second high molecular chain have a function of forming an excited complex.

Another embodiment of the present invention is a light-emitting element including a high molecular material and a guest material. The high molecular material includes at least a first high molecular chain and a second high molecular chain. The guest material has a function of converting triplet excitation energy into light emission. The first high molecular chain and the second high molecular chain each include a first skeleton, a second skeleton, and a third skeleton. The first skeleton and the second skeleton are bonded to each other through the third skeleton. The first skeleton has a function of transferring holes. The second skeleton has a function of transferring electrons. The first high molecular chain and the second high molecular chain have a function of forming an excited complex.

Another embodiment of the present invention is a light-emitting element including a high molecular material. The high molecular material includes at least a first high molecular chain and a second high molecular chain. The first high molecular chain and the second high molecular chain each include a first skeleton, a second skeleton, a third skeleton, and a fourth skeleton. The first skeleton and the second skeleton are bonded to each other through the third skeleton. The first skeleton has a function of transferring holes. The second skeleton has a function of transferring electrons. The fourth skeleton has a function of exhibiting fluorescence. The first high molecular chain and the second high molecular chain have a function of forming an excited complex.

Another embodiment of the present invention is a light-emitting element including a high molecular material. The high molecular material includes at least a first high molecular chain and a second high molecular chain. The first high molecular chain and the second high molecular chain each include a first skeleton, a second skeleton, a third skeleton, and a fourth skeleton. The first skeleton and the second skeleton are bonded to each other through the third skeleton. The first skeleton has a function of transferring holes. The second skeleton has a function of transferring electrons. The fourth skeleton has a function of converting triplet excitation energy into light emission. The first high molecular chain and the second high molecular chain have a function of forming an excited complex.

Another embodiment of the present invention is a light-emitting element including a high molecular material and a guest material. The high molecular material includes at least a first high molecular chain and a second high molecular chain. The guest material has a function of exhibiting fluorescence. The first high molecular chain and the second high molecular chain each include a first skeleton, a second skeleton, and a third skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The first high molecular chain and the second high molecular chain have a function of forming an excited complex.

Another embodiment of the present invention is a light-emitting element including a high molecular material and a guest material. The high molecular material includes at least a first high molecular chain and a second high molecular chain. The guest material has a function of converting triplet excitation energy into light emission. The first high molecular chain and the second high molecular chain each include a first skeleton, a second skeleton, and a third skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The first high molecular chain and the second high molecular chain have a function of forming an excited complex.

Another embodiment of the present invention is a light-emitting element including a high molecular material. The high molecular material includes at least a first high molecular chain and a second high molecular chain. The first high molecular chain and the second high molecular chain each include a first skeleton, a second skeleton, a third skeleton, and a fourth skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The fourth skeleton has a function of exhibiting fluorescence. The first high molecular chain and the second high molecular chain have a function of forming an excited complex.

Another embodiment of the present invention is a light-emitting element including a high molecular material. The high molecular material includes at least a first high molecular chain and a second high molecular chain. The first high molecular chain and the second high molecular chain each include a first skeleton, a second skeleton, a third skeleton, and a fourth skeleton. The first skeleton and the second skeleton are bonded to each other through the third skeleton. The first skeleton includes at least one of a π-electron rich heteroaromatic skeleton and an aromatic amine skeleton. The second skeleton includes a π-electron deficient heteroaromatic skeleton. The fourth skeleton has a function of converting triplet excitation energy into light emission. The first high molecular chain and the second high molecular chain have a function of forming an excited complex.

In each of the above structures, the π-electron rich heteroaromatic skeleton preferably includes at least one of a thiophene skeleton, a furan skeleton, and a pyrrole skeleton. The π-electron deficient heteroaromatic skeleton preferably includes at least one of a pyridine skeleton, a diazine skeleton, and a triazine skeleton. The third skeleton preferably includes at least one of a biphenyl skeleton and a fluorene skeleton.

In each of the above structures, the first high molecular chain and the second high molecular chain have a function of forming the excited complex with the first skeleton in the first high molecular chain and the second skeleton in the second high molecular chain. In addition, the excited complex preferably has a function of exhibiting thermally activated delayed fluorescence at room temperature.

Another embodiment of the present invention is a display device including the light-emitting element having any of the above-described structures, and at least one of a color filter and a transistor. Another embodiment of the present invention is an electronic device including the above-described display device and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. Thus, the light-emitting device in this specification refers to an image display device and a light source (e.g., a lighting device). The light-emitting device may be included in a module in which a connector such as a flexible printed circuit (FPC) or a tape carrier package (TCP) is connected to a light-emitting device, a module in which a printed wiring board is provided on the tip of a TCP, or a module in which an integrated circuit (IC) is directly mounted on a light-emitting element by a chip on glass (COG) method.

With one embodiment of the present invention, a light-emitting element containing a fluorescent compound or a phosphorescent compound which has high light emission efficiency can be provided. With one embodiment of the present invention, a light-emitting element with low power consumption can be provided. With one embodiment of the present invention, a novel light-emitting element can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BEST MODE FOR CARRYING OUT THE INVENTION

Figure 1A:
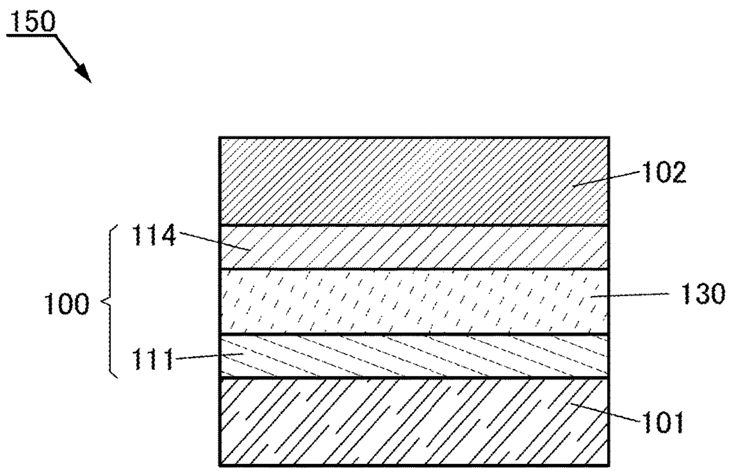
FIGS. 1A and 1B are schematic cross-sectional views of a light-emitting element of one embodiment of the present invention and FIG. 1C illustrates the correlation of energy levels in a light-emitting layer.

Embodiments of the present invention will be described below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet excitation energy, that is, the lowest level of excitation energy in a singlet excited state. A triplet excited state (T*) refers to a triplet state having excitation energy. A T1 level means the lowest level of the triplet excitation energy, that is, the lowest level of excitation energy in a triplet excited state.

In this specification and the like, a fluorescent compound refers to a compound that emits light in the visible light region when the relaxation from the singlet excited state to the ground state occurs. A phosphorescent compound refers to a compound that emits light in the visible light region at room temperature when the relaxation from the triplet excited state to the ground state occurs. That is, a phosphorescent compound refers to a compound that can convert triplet excitation energy into visible light.

Thermally activated delayed fluorescence emission energy refers to an emission peak (including a shoulder) on the shortest wavelength side of thermally activated delayed fluorescence. Phosphorescence emission energy or triplet excitation energy refers to an emission peak (including a shoulder) on the shortest wavelength side of phosphorescence emission. Note that the phosphorescence emission can be observed by time-resolved photoluminescence in a low-temperature (e.g., 10 K) environment.

Note that in this specification and the like, "room temperature" refers to a temperature higher than or equal to 0° C. and lower than or equal to 40° C.

In this specification and the like, a high molecular material and a high molecular compound are each a polymer which has molecular weight distribution and whose average molecular weight is $1\times10^3$ to $1\times10^8$. A low molecular compound is a compound which does not have molecular weight distribution and whose molecular weight is less than or equal to $1\times10^4$.

In addition, the high molecular material and the high molecular compound are a material and a compound in which one kind of structural units or plural kinds of structural units are polymerized. That is, the structural unit refers to a unit at least one of which is included in each of the high molecular material and the high molecular compound.

In addition, the high molecular material and the high molecular compound may each be any of a block copolymer, a random copolymer, an alternating copolymer, and a graft copolymer, or another embodiment.

In the case where an end group of each of the high molecular material and the high molecular compound includes a polymerization active group, light emission characteristics and luminance lifetime of the light-emitting element may be reduced. Thus, the end group of each of the high molecular material and the high molecular compound is preferably a stable end group. As the stable end group, a group which is covalently bonded to a main chain is preferable, and a group which is bonded to an aryl group or a heterocycle group through a carbon-carbon bond is particularly preferable.

In this specification and the like, a wavelength range of blue refers to a wavelength range of greater than or equal to 400 nm and less than 490 nm, and blue light emission refers to light emission with at least one emission spectrum peak in the wavelength range. A wavelength range of green refers to a wavelength range of greater than or equal to 490 nm and less than 580 nm, and green light emission refers to light emission with at least one emission spectrum peak in the wavelength range. A wavelength range of red refers to a wavelength range of greater than or equal to 580 nm and less than or equal to 680 nm, and red light emission refers to light emission with at least one emission spectrum peak in the wavelength range.

Embodiment 1

In this embodiment, a light-emitting element of one embodiment of the present invention will be described below with reference to FIGS. 1A to 1C and FIG. 2.

Structure Example 1 of Light-Emitting Element

First, a structure of the light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111 and an electron-injection layer 114, in addition to the light-emitting layer 130.

Although description is given assuming that the electrode 101 and the electrode 102 of the pair of electrodes serve as an anode and a cathode, respectively in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the light-emitting layer 130, and the electron-injection layer 114 may be stacked in this order from the anode side.

The structure of the EL layer 100 is not limited to the structure illustrated in FIG. 1A, and a structure including at least one layer selected from the hole-injection layer 111 and the electron-injection layer 114 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

Figure 1B:
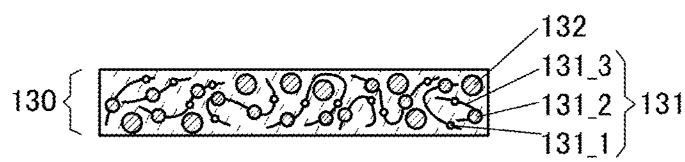

FIG. 1B is a schematic cross-sectional view illustrating an example of the light-emitting layer 130 in FIG. 1A. The light-emitting layer 130 in FIG. 1B includes a high molecular material 131 and a guest material 132.

The high molecular material 131 includes a skeleton 131_1, a skeleton 131_2, and a skeleton 131_3 as structural units. The skeleton 131_1 and the skeleton 131_2 are bonded or polymerized to each other through the skeleton 131_3.

The guest material 132 may be a light-emitting organic compound, and the light-emitting organic compound is preferably a substance capable of emitting fluorescence (hereinafter also referred to as a fluorescent compound). A structure in which a fluorescent compound is used as the guest material 132 will be described below. The guest material 132 may be rephrased as the fluorescent compound.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. Accordingly, in a light-emitting element that contains a fluorescent compound, the probability of generation of singlet excitons, which contribute to light emission, is 25% and the probability of generation of triplet excitons, which do not contribute to light emission, is 75%. Therefore, it is important to convert the triplet excitons, which do not contribute to light emission, into singlet excitons, which contribute to light emission, for increasing the light emission efficiency of the light-emitting element.

Thus, the high molecular material 131 preferably has a function of generating the singlet excited state from the triplet excited state.

<Light Emission Mechanism of Light-Emitting Element>

Next, the light emission mechanism of the light-emitting layer 130 is described below.

In the high molecular material 131 in the light-emitting layer 130, it is preferable that the skeleton 131_1 include a skeleton having a function of transporting holes (a hole-transport property) and the skeleton 131_2 include a skeleton having a function of transporting electrons (an electron-transport property). Alternatively, it is preferable that the skeleton 131_1 include at least one of a π-electron rich heteroaromatic skeleton and an aromatic amine skeleton and the skeleton 131_2 include a π-electron deficient heteroaromatic skeleton.

In one embodiment of the present invention, the high molecular material 131 has a function of forming an excited complex (also referred to as an excited dimer) with two high molecular chains of the high molecular material 131. In particular, the skeleton having a hole-transport property and the skeleton having an electron-transport property of the high molecular material 131 preferably form an excited complex in two high molecular chains including the same structural units. Alternatively, at least one of the π-electron rich heteroaromatic skeleton and the aromatic amine skeleton included in the high molecular material 131 and the π-electron deficient heteroaromatic skeleton included in the high molecular material 131 preferably form an excited complex in two high molecular chains including the same structural units. Note that in this specification and the like, the high molecular chains including the same structural units are high molecular chains which include at least the same kinds of structural units (here, the skeleton 131_1, the skeleton 131_2, and the skeleton 131_3), and may have different bond directions, bond angles, bond lengths, and the like of the structural units. In addition, the structural units may have different substituents, and different skeletons may be provided between the structural units. In addition, polymerization methods of the structural units may be different.

In other words, the high molecular material 131 has a function of forming an excited complex with a first high molecular chain and a second high molecular chain of the high molecular material 131. In particular, the skeleton having a hole-transport property in the first high molecular chain and the skeleton having an electron-transport property in the second high molecular chain of the high molecular material 131 preferably form an excited complex. Alternatively, at least one of the π-electron rich heteroaromatic skeleton and the aromatic amine skeleton in the first high molecular chain of the high molecular material 131 and the π-electron deficient heteroaromatic skeleton in the second high molecular chain of the high molecular material 131 preferably form an excited complex.

In the case where the high molecular material 131 includes the skeleton having a hole-transport property included in the skeleton 131_1 and the skeleton having an electron-transport property included in the skeleton 131_2, a donor-acceptor excited complex is easily formed by two high molecular chains; thus, efficient formation of an excited complex is possible. Alternatively, in the case where the high molecular material 131 includes at least one of the π-electron rich heteroaromatic skeleton and the aromatic amine skeleton included in the skeleton 131_1, and the π-electron deficient heteroaromatic skeleton included in the skeleton 131_2, a donor-acceptor excited complex is easily formed by two high molecular chains; thus, efficient formation of an excited complex is possible.

Thus, to increase both the donor property and the acceptor property in the high molecular chains of the high molecular material 131, a structure where the conjugation between the skeleton having a hole-transport property and the skeleton having an electron-transport property is reduced is preferably used. Alternatively, a structure where the conjugation between the π-electron deficient heteroaromatic skeleton and at least one of the π-electron rich heteroaromatic skeleton and the aromatic amine skeleton is reduced is preferably used. Thus, an overlap between a region where the highest occupied molecular orbital (HOMO) is distributed and a region where the lowest unoccupied molecular orbital (LUMO) is distributed can be small. In addition, a difference between a singlet excitation energy level and a triplet excitation energy level of the high molecular material 131 can be reduced. Moreover, the triplet excitation energy level of the high molecular material 131 can be high.

Note that a molecular orbital refers to spatial distribution of electrons in a molecule, and can show the probability of finding of electrons. In addition, with the molecular orbital, electron configuration of the molecule (spatial distribution and energy of electrons) can be described in detail.

Furthermore, in the excited complex formed by the two high molecular chains including the same structural units, one high molecular chain includes the HOMO and the other high molecular chain includes the LUMO; thus, an overlap between the HOMO and the LUMO is extremely small. That is, in the excited complex, a difference between a singlet excitation energy level and a triplet excitation energy level is small. Therefore, in the excited complex formed by the two high molecular chains of the high molecular material 131, a difference between a singlet excitation energy level and a triplet excitation energy level is small and is preferably larger than 0 eV and smaller than or equal to 0.2 eV.

In the case where the high molecular material 131 includes the skeleton having a hole-transport property and the skeleton having an electron-transport property, the carrier balance can be easily controlled. As a result, a carrier recombination region can also be controlled easily. In order to achieve this, it is preferable that the composition ratio of the skeleton 131_1 (including the skeleton having a hole-transport property) to the skeleton 131_2 (including the skeleton having an electron-transport property) be in the range of 1:9 to 9:1 (molar ratio), and it is further preferable that the proportion of the skeleton 131_2 (including the skeleton having an electron-transport property) be higher than the proportion of the skeleton 131_1 (including the skeleton having a hole-transport property).

Figure 1C:
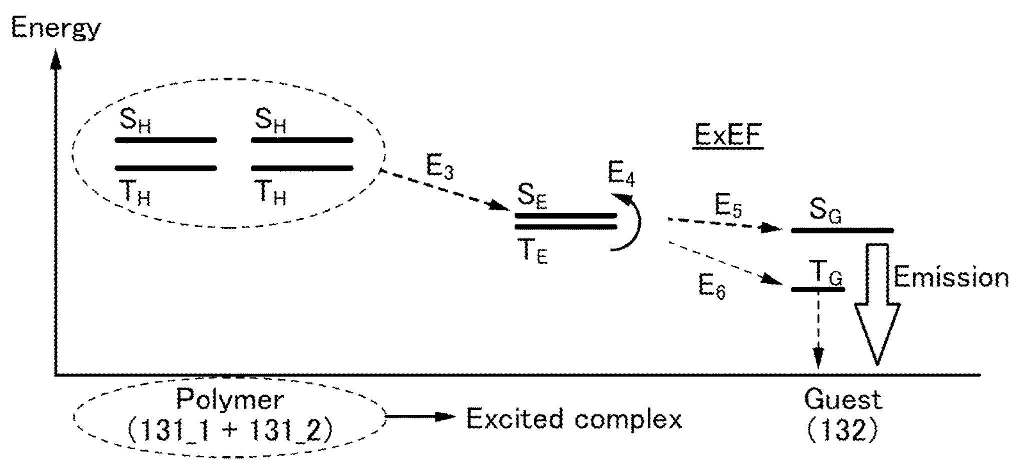

FIG. 1C shows a correlation of energy levels of the high molecular material 131 and the guest material 132 in the light-emitting layer 130. The following explains what terms and signs in FIG. 1C represent:

Polymer (131_1+131_2): the skeleton 131_1 in the first high molecular chain and the skeleton 131_2 in the second high molecular chain, which are close to each other, of the high molecular material 131;

Guest (132): the guest material 132 (the fluorescent compound);

$S_H$: the S1 level of the high molecular material 131;

$T_H$: the T1 level of the high molecular material 131;

$S_G$: the S1 level of the guest material 132 (the fluorescent compound);

$T_G$: the T1 level of the guest material 132 (the fluorescent compound);

$S_E$: the S1 level of the excited complex; and $T_E$: the T1 level of the excited complex.

In the light-emitting layer 130, the high molecular material 131 is present in the largest proportion by weight, and the guest material 132 (the fluorescent compound) is dispersed in the high molecular material 131. The S1 level of the high molecular material 131 in the light-emitting layer 130 is preferably higher than the S1 level of the guest material 132 (the fluorescent compound) in the light-emitting layer 130. The T1 level of the high molecular material 131 in the light-emitting layer 130 is preferably higher than the T1 level of the guest material 132 (the fluorescent compound) in the light-emitting layer 130.

In the light-emitting element of one embodiment of the present invention, an excited complex is formed by the two high molecular chains of the high molecular material 131 included in the light-emitting layer 130. The lowest singlet excitation energy level ($S_E$) of the excited complex and the lowest triplet excitation energy level ($T_E$) of the excited complex are close to each other (see Route $E_3$ in FIG. 1C).

An excited complex is an excited state formed by two high molecular chains. In photoexcitation, the excited complex is formed by interaction between one high molecular chain in an excited state and the other high molecular chain in a ground state. The two high molecular chains that have formed the excited complex return to a ground state by emitting light and then serve as the original two high molecular chains. In electrical excitation, one high molecular chain brought into an excited state immediately interacts with the other high molecular chain to form an excited complex. Alternatively, one high molecular chain receives a hole and the other high molecular chain receives an electron to immediately form an excited complex. In this case, any of the high molecular chains can form an excited complex without forming an excited state with a single high molecular chain and; accordingly, most excitons in the light-emitting layer 130 can exist as excited complexes. Because the excitation energy levels ($S_E$ and $T_E$) of the excited complex are lower than the singlet excitation energy level ($S_H$) of a single high molecular chain of the high molecular material 131 that forms the excited complex, the excited state of the high molecular material 131 can be formed with lower excitation energy. Accordingly, the driving voltage of the light-emitting element 150 can be reduced.

Since the singlet excitation energy level ($S_E$) and the triplet excitation energy level ($T_E$) of the excited complex are close to each other, the excited complex has a function of exhibiting thermally activated delayed fluorescence. In other words, the excited complex has a function of converting triplet excitation energy into singlet excitation energy by reverse intersystem crossing (upconversion) (see Route $E_4$ in FIG. 1C). Thus, the triplet excitation energy generated in the light-emitting layer 130 is partly converted into singlet excitation energy by the excited complex. In order to cause this conversion, the energy difference between the singlet excitation energy level ($S_E$) and the triplet excitation energy level ($T_E$) of the excited complex is preferably larger than 0 eV and smaller than or equal to 0.2 eV.

Furthermore, the singlet excitation energy level ($S_E$) of the excited complex is preferably higher than the singlet excitation energy level ($S_G$) of the guest material 132. In this way, the singlet excitation energy of the formed excited complex can be transferred from the singlet excitation energy level ($S_E$) of the excited complex to the singlet excitation energy level ($S_G$) of the guest material 132, so that the guest material 132 is brought into the singlet excited state, causing light emission (see Route $E_5$ in FIG. 1C).

To obtain efficient light emission from the singlet excited state of the guest material 132, the fluorescence quantum yield of the guest material 132 is preferably high, and specifically, 50% or higher, further preferably 70% or higher, still further preferably 90% or higher.

Note that in order to efficiently make reverse intersystem crossing occur, the triplet excitation energy level ($T_E$) of the excited complex formed by two high molecular chains is preferably lower than the triplet excitation energy level ($T_H$) of the single high molecular chain of the high molecular material 131 which forms the excited complex. Thus, quenching of the triplet excitation energy of the excited complex due to another one or more high molecular chains in the high molecular material 131 is less likely to occur, which causes reverse intersystem crossing efficiently.

Thus, the triplet excitation energy level of the high molecular material 131 is preferably high, and the energy difference between the singlet excitation energy level and the triplet excitation energy level of the high molecular material 131 is preferably small.

Note that since direct transition from a singlet ground state to a triplet excited state in the guest material 132 is forbidden, energy transfer from the singlet excitation energy level ($S_E$) of the excited complex to the triplet excitation energy level ($T_G$) of the guest material 132 is unlikely to be a main energy transfer process.

When transfer of the triplet excitation energy from the triplet excitation energy level ($T_E$) of the excited complex to the triplet excitation energy level ($T_G$) of the guest material 132 occurs, the triplet excitation energy is deactivated (see Route $E_6$ in FIG. 1C). Thus, it is preferable that the energy transfer of Route $E_6$ be less likely to occur because the efficiency of generating the triplet excited state of the guest material 132 can be decreased and thermal deactivation can be reduced. In order to make this condition, the weight ratio of the guest material 132 to the high molecular material 131 is preferably low, specifically, preferably greater than or equal to 0.001 and less than or equal to 0.05, further preferably greater than or equal to 0.001 and less than or equal to 0.03, further preferably greater than or equal to 0.001 and less than or equal to 0.01.

Note that when the direct carrier recombination process in the guest material 132 is dominant, a large number of triplet excitons are generated in the light-emitting layer 130, resulting in decreased light emission efficiency due to thermal deactivation. Thus, it is preferable that the probability of the energy transfer process through the excited complex formation process (Routes $E_4$ and $E_5$ in FIG. 1C) be higher than the probability of the direct carrier recombination process in the guest material 132 because the efficiency of generating the triplet excited state of the guest material 132 can be decreased and thermal deactivation can be reduced. Therefore, as described above, the weight ratio of the guest material 132 to the high molecular material 131 is preferably low, specifically, preferably greater than or equal to 0.001 and less than or equal to 0.05, further preferably greater than or equal to 0.001 and less than or equal to 0.03, further preferably greater than or equal to 0.001 and less than or equal to 0.01.

By making all the energy transfer processes of Routes $E_4$ and $E_5$ efficiently occur in the above-described manner, both the singlet excitation energy and the triplet excitation energy of the high molecular material 131 can be efficiently converted into the singlet excitation energy of the guest material 132, whereby the light-emitting element 150 can emit light with high light emission efficiency.

Since an excited complex is called "an exciplex" in some cases, the above-described processes through Routes $E_3$, $E_4$, and $E_5$ may be referred to as exciplex-singlet energy transfer (ExSET) or exciplex-enhanced fluorescence (ExEF) in this specification and the like. In other words, in the light-emitting layer 130, excitation energy is transferred from the excited complex to the guest material 132.

When the light-emitting layer 130 has the above-described structure, light emission from the guest material 132 of the light-emitting layer 130 can be obtained efficiently.

As the material having a function of generating a singlet excited state from a triplet excited state, a thermally activated delayed fluorescent (TADF) material is known. The TADF material can generate the singlet excited state by itself from the triplet excited state by reverse intersystem crossing. In other words, the TADF material has a function of partly converting the energy of the triplet excitation energy into light emission.

Thus, the TADF material has a small difference between the triplet excitation energy level and the singlet excitation energy level and can up-convert the triplet excited state into a singlet excited state with little thermal energy. Specifically, the difference between the triplet excitation energy level and the singlet excitation energy level is preferably larger than 0 eV and smaller than or equal to 0.2 eV, further preferably larger than 0 eV and smaller than or equal to 0.1 eV.

As an example of the TADF material, a heterocyclic compound including a π-electron rich heteroaromatic skeleton and a π-electron deficient heteroaromatic skeleton is given. To make the heterocyclic compound have a function of exhibiting thermally activated delayed fluorescence, it is preferable that the π-electron rich heteroaromatic skeleton and the π-electron deficient heteroaromatic skeleton be directly bonded to each other and thus both the donor property of the π-electron rich heteroaromatic skeleton and the acceptor property of the π-electron deficient heteroaromatic skeleton be increased. Furthermore, it is preferable that the conjugation between the π-electron rich heteroaromatic skeleton and the π-electron deficient heteroaromatic skeleton be reduced and an overlap between the HOMO and the LUMO be reduced. However, it is preferable that a certain overlap between the HOMO and the LUMO be provided to increase probability of transition (oscillator strength) between the HOMO and the LUMO. In this manner, the difference between the singlet excitation energy level and the triplet excitation energy level can be reduced and light emission from the singlet excited state can be efficiently obtained.

For such a heterocyclic compound, a structure where the π-electron rich heteroaromatic skeleton, such as an acridine skeleton, a phenazine skeleton, and a phenoxazine skeleton, has a strong twist in a portion bonded to the π-electron deficient heteroaromatic skeleton, and the conjugation between the π-electron rich heteroaromatic skeleton and the π-electron deficient heteroaromatic skeleton is reduced is preferably used. However, the molecular structure of a skeleton having such a twist structure is limited.

Thus, in one embodiment of the present invention, it is preferable that, in the high molecular material 131, the skeleton 131_1 having a hole-transport property and the skeleton 131_2 having an electron-transport property be bonded or polymerized to each other through the skeleton 131_3. Alternatively, it is preferable that, in the high molecular material 131, the π-electron deficient heteroaromatic skeleton and at least one of the π-electron rich heteroaromatic skeleton and the aromatic amine skeleton be bonded or polymerized to each other through the skeleton 131_3. Note that the detail of the skeleton 131_3 will be described later.

<Energy Transfer Mechanism>

Next, factors controlling the processes of intermolecular energy transfer between the high molecular material 131 and the guest material 132 will be described. As mechanisms of the intermolecular energy transfer, two mechanisms, i.e., Förster mechanism (dipole-dipole interaction) and Dexter mechanism (electron exchange interaction), have been proposed. Although the intermolecular energy transfer process between the high molecular material 131 and the guest material 132 is described here, the same can apply to a case where the high molecular material 131 forms an excited complex.

<<Förster Mechanism>>

In Förster mechanism, energy transfer does not require direct contact between molecules and energy is transferred through a resonant phenomenon of dipolar oscillation between the high molecular material 131 and the guest material 132. By the resonant phenomenon of dipolar oscillation, the high molecular material 131 provides energy to the guest material 132, and thus, the high molecular material 131 in an excited state is brought to a ground state and the guest material 132 in a ground state is brought to an excited state. Note that the rate constant $k_{h^* \to g}$ of Förster mechanism is expressed by Formula (1).

$$k_{h^* \to g} = \frac{9000 c^4 K^2 \phi \ln 10}{128 \pi^5 n^4 N \tau R^6} \int \frac{f'_h(\nu) \varepsilon_g(\nu)}{\nu^4} d\nu \tag{1}$$

In Formula (1), ν denotes a frequency, $f'_h(\nu)$ denotes a normalized emission spectrum of the high molecular material 131 (a fluorescent spectrum in energy transfer from a singlet excited state, and a phosphorescent spectrum in energy transfer from a triplet excited state), $\varepsilon_g(\nu)$ denotes a molar absorption coefficient of the guest material 132, N denotes Avogadro's number, n denotes a refractive index of a medium, R denotes an intermolecular distance between the high molecular material 131 and the guest material 132, τ denotes a measured lifetime of an excited state (fluorescence lifetime or phosphorescence lifetime), c denotes the speed of light, ϕ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the high molecular material 131 and the guest material 132. Note that $K^2$ is ⅔ in random orientation.

<<Dexter Mechanism>>

In Dexter mechanism, the high molecular material 131 and the guest material 132 are close to a contact effective range where their orbitals overlap, and the high molecular material 131 in an excited state and the guest material 132 in a ground state exchange their electrons, which leads to energy transfer. Note that the rate constant $k_{h^* \to g}$ of Dexter mechanism is expressed by Formula (2).

$$k_{h^* \to g} = \left(\frac{2\pi}{h}\right) K^2 \exp\left(-\frac{2R}{L}\right) \int f'_h(\nu) \varepsilon'_g(\nu) d\nu \tag{2}$$

In Formula (2), h denotes a Planck constant, K denotes a constant having an energy dimension, ν denotes a frequency, $f'_h(\nu)$ denotes a normalized emission spectrum of the high molecular material 131 (a fluorescent spectrum in energy transfer from a singlet excited state, and a phosphorescent spectrum in energy transfer from a triplet excited state), $\varepsilon'_g(\nu)$ denotes a normalized absorption spectrum of the guest material 132, L denotes an effective molecular radius, and R denotes an intermolecular distance between the high molecular material 131 and the guest material 132.

Here, the efficiency of energy transfer from the high molecular material 131 to the guest material 132 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the high molecular material 131, $k_n$ denotes a rate constant of a non-light-emission process (thermal deactivation or intersystem crossing) of the high molecular material 131, and τ denotes a measured lifetime of an excited state of the high molecular material 131.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \tag{3}$$

According to Formula (3), it is found that the energy transfer efficiency $\phi_{ET}$ can be increased by increasing the rate constant $k_{h^* \to g}$ of energy transfer so that another competing rate constant $k_r + k_n$ (=1/τ) becomes relatively small.

<<Concept for Promoting Energy Transfer>>

First, energy transfer by Förster mechanism is considered. When Formula (1) is substituted into Formula (3), τ can be eliminated. Thus, in Förster mechanism, the energy transfer efficiency $\phi_{ET}$ does not depend on the lifetime τ of the excited state of the high molecular material 131. In addition, it can be said that the energy transfer efficiency $\phi_{ET}$ is higher when the luminescence quantum yield ϕ (here, the fluorescence quantum yield because energy transfer from a singlet excited state is discussed) is higher. In general, the luminescence quantum yield of an organic compound in a triplet excited state is extremely low at room temperature. Thus, in the case where the high molecular material 131 is in a triplet excited state, a process of energy transfer by Förster mechanism can be ignored, and a process of energy transfer by Förster mechanism is considered only in the case where the high molecular material 131 is in a singlet excited state.

Furthermore, it is preferable that the emission spectrum (the fluorescent spectrum in the case where energy transfer from a singlet excited state is discussed) of the high molecular material 131 largely overlap with the absorption spectrum (absorption corresponding to the transition from the singlet ground state to the singlet excited state) of the guest material 132. Moreover, it is preferable that the molar absorption coefficient of the guest material 132 be also high. This means that the emission spectrum of the high molecular material 131 overlaps with the absorption band of the guest material 132 which is on the longest wavelength side. Since direct transition from the singlet ground state to the triplet excited state of the guest material 132 is forbidden, the molar absorption coefficient of the guest material 132 in the triplet excited state can be ignored. Thus, a process of energy transfer to a triplet excited state of the guest material 132 by Förster mechanism can be ignored, and only a process of energy transfer to a singlet excited state of the guest material 132 is considered. That is, in Förster mechanism, a process of energy transfer from the singlet excited state of the high molecular material 131 to the singlet excited state of the guest material 132 is considered.

Next, energy transfer by Dexter mechanism is considered. According to Formula (2), in order to increase the rate constant $k_{h^*\rightarrow g}$, it is preferable that an emission spectrum of the high molecular material 131 (a fluorescent spectrum in the case where energy transfer from a singlet excited state is discussed) largely overlap with an absorption spectrum of the guest material 132 (absorption corresponding to transition from a singlet ground state to a singlet excited state). Therefore, the energy transfer efficiency can be optimized by making the emission spectrum of the high molecular material 131 overlap with the absorption band of the guest material 132 which is on the longest wavelength side.

When Formula (2) is substituted into Formula (3), it is found that the energy transfer efficiency $\phi_{ET}$ in Dexter mechanism depends on $\tau$. In Dexter mechanism, which is a process of energy transfer based on the electron exchange, as well as the energy transfer from the singlet excited state of the high molecular material 131 to the singlet excited state of the guest material 132, energy transfer from the triplet excited state of the high molecular material 131 to the triplet excited state of the guest material 132 occurs.

In the light-emitting element of one embodiment of the present invention in which the guest material 132 is a fluorescent compound, the efficiency of energy transfer to the triplet excited state of the guest material 132 is preferably low. That is, the energy transfer efficiency based on Dexter mechanism from the high molecular material 131 to the guest material 132 is preferably low and the energy transfer efficiency based on Förster mechanism from the high molecular material 131 to the guest material 132 is preferably high.

As described above, the energy transfer efficiency in Förster mechanism does not depend on the lifetime $\tau$ of the excited state of the high molecular material 131. In contrast, the energy transfer efficiency in Dexter mechanism depends on the excitation lifetime $\tau$ of the high molecular material 131. Thus, to reduce the energy transfer efficiency in Dexter mechanism, the excitation lifetime $\tau$ of the high molecular material 131 is preferably short.

In a manner similar to that of the energy transfer from the high molecular material 131 to the guest material 132, the energy transfer by both Förster mechanism and Dexter mechanism also occurs in the energy transfer process from the excited complex to the guest material 132.

Accordingly, one embodiment of the present invention provides a light-emitting element including the high molecular material 131 in which two high molecular chains form an excited complex which functions as an energy donor capable of efficiently transferring energy to the guest material 132. The excited complex formed by the two high molecular chains in the high molecular material 131 has a singlet excitation energy level and a triplet excitation energy level which are close to each other; accordingly, transition from a triplet exciton generated in the light-emitting layer 130 to a singlet exciton (reverse intersystem crossing) is likely to occur. This can increase the efficiency of generating singlet excitons in the light-emitting layer 130. Furthermore, in order to facilitate energy transfer from the singlet excited state of the excited complex to the singlet excited state of the guest material 132 serving as an energy acceptor, it is preferable that the emission spectrum of the excited complex overlap with the absorption band of the guest material 132 which is on the longest wavelength side (lowest energy side). Thus, the efficiency of generating the singlet excited state of the guest material 132 can be increased.

In addition, fluorescence lifetime of a thermally activated delayed fluorescence component in light emitted from the excited complex is preferably short, and specifically, preferably 10 ns or longer and 50 μs or shorter, further preferably 10 ns or longer and 30 μs or shorter.

The proportion of a thermally activated delayed fluorescence component in the light emitted from the excited complex is preferably high. Specifically, the proportion of a thermally activated delayed fluorescence component in the light emitted from the excited complex is preferably higher than or equal to 5%, further preferably higher than or equal to 10%.

Structure Example 2 of Light-Emitting Element

Next, a structure example of the light-emitting layer 130 different from that in FIG. 1B is described below with reference to FIG. 2.

Figure 2:
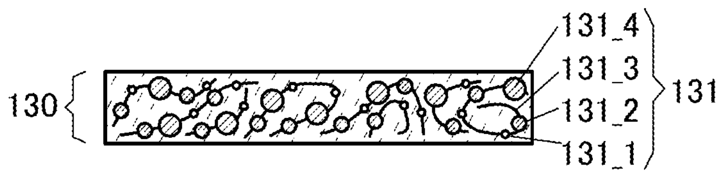
FIG. 2 is a schematic cross-sectional view of a light-emitting layer of one embodiment of the present invention.

FIG. 2 is a schematic cross-sectional view illustrating another example of the light-emitting layer 130 in FIG. 1A. Note that in FIG. 2, portions having functions similar to those of portions in FIG. 1B are denoted by the same reference numerals, and a detailed description of the portions is omitted in some cases.

The light-emitting layer 130 in FIG. 2 contains the high molecular material 131. The high molecular material 131 includes the skeleton 131_1, the skeleton 131_2, the skeleton 131_3, and a skeleton 131_4 as structural units. The skeleton 131_1 and the skeleton 131_2 are bonded or polymerized to each other through the skeleton 131_3.

The skeleton 131_4 may be a light-emitting skeleton, and the light-emitting skeleton is preferably a skeleton capable of emitting fluorescence (hereinafter also referred to as a fluorescent skeleton). A structure in which a fluorescent skeleton is used as the skeleton 131_4 will be described below. Note that the skeleton 131_4 may be rephrased as the fluorescent skeleton.

The skeleton 131_4 has a function similar to that of the guest material 132. Thus, this structure example can be described by rephrasing the guest material 132 shown in Structure example 1 of this embodiment as the skeleton 131_4. In addition, Structure example 1 of this embodiment may be referred to for the description of functions similar to those in Structure example 1 of this embodiment.

That is, in the light-emitting element of one embodiment of the present invention, the high molecular material 131 includes the skeleton having a hole-transport property included in the skeleton 131_1 and the skeleton having an electron-transport property included in the skeleton 131_2, and two high molecular chains form an excited complex. Then, the excitation energy is transferred from the excited complex to the skeleton 131_4, whereby light is emitted from the skeleton 131_4. Note that the skeleton 131_4 which receives the excitation energy from the excited complex may be included in one of the two high molecular chains forming the excited complex or may be included in another high molecular chain.

When the triplet excitation energy is transferred from the triplet excitation energy level of the excited complex formed by the skeleton 131_1 in one high molecular chain and the skeleton 131_2 in the other high molecular chain to the triplet excitation energy level of the skeleton 131_4, the triplet excitation energy is deactivated. Thus, the composition ratio of the skeleton 131_4 to all of the structural units of the high molecular material 131 is preferably low, specifically higher than or equal to 0.1 mol % and lower than or equal to 5 mol %, further preferably higher than or equal to 0.1 mol % and lower than or equal to 3 mol %, still further preferably higher than or equal to 0.1 mol % and lower than or equal to 1 mol %.

When the direct carrier recombination process in the skeleton 131_4 is dominant, a large number of triplet excitons are generated in the light-emitting layer 130, resulting in decreased light emission efficiency due to thermal deactivation. Thus, as described above, the composition ratio of the skeleton 131_4 to all of the structural units of the high molecular material 131 is preferably low, specifically higher than or equal to 0.1 mol % and lower than or equal to 5 mol %, further preferably higher than or equal to 0.1 mol % and lower than or equal to 3 mol %, still further preferably higher than or equal to 0.1 mol % and lower than or equal to 1 mol %.

<Material>

Next, components of a light-emitting element of one embodiment of the present invention are described in detail below.

<<Light-Emitting Layer>>

Next, materials that can be used for the light-emitting layer 130 will be described below.

The high molecular material 131 in the light-emitting layer 130 is not particularly limited as long as two high molecular chains of the high molecular material 131 have a function of forming an excited complex; however, the high molecular material 131 preferably includes the π-electron deficient heteroaromatic skeleton and at least one of the π-electron rich heteroaromatic skeleton and the aromatic amine skeleton. That is, it is preferable that the high molecular material 131 include at least the skeletons 131_1, 131_2, and 131_3, the skeleton 131_1 include at least one of the π-electron rich heteroaromatic skeleton and the aromatic amine skeleton, and the skeleton 131_2 include the π-electron deficient heteroaromatic skeleton.

As the aromatic amine skeleton included in the high molecular material 131, tertiary amine not including an NH bond, in particular, a triarylamine skeleton is preferably used. As an aryl group of a triarylamine skeleton, a substituted or unsubstituted aryl group having 6 to 13 carbon atoms included in a ring is preferably used and examples thereof include a phenyl group, a naphthyl group, and a fluorenyl group.

As the π-electron rich heteroaromatic skeleton included in the high molecular material 131, one or more of a furan skeleton, a thiophene skeleton, and a pyrrole skeleton are preferable because of their high stability and reliability. As a furan skeleton, a dibenzofuran skeleton is preferable. As a thiophene skeleton, a dibenzothiophene skeleton is preferable. Note that as a pyrrole skeleton, an indole skeleton or a carbazole skeleton, in particular, a 3-(9H-carbazol-3-yl)-9H-carbazole skeleton is preferable. Each of these skeletons may further have a substituent.

As examples of the above-described aromatic amine skeleton and π-electron rich heteroaromatic skeleton, skeletons represented by the following general formulae (101) to (110) are given. Note that X in the general formulae (105) to (107) represents an oxygen atom or a sulfur atom.

[Chemical Formulae 1]

(101)

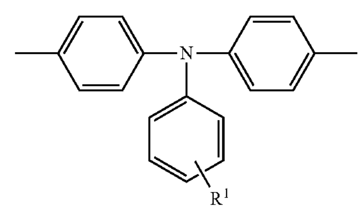

(102)

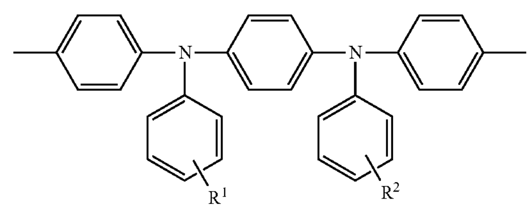

(103)

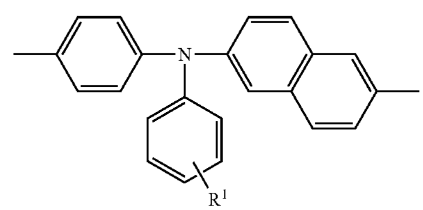

(104)

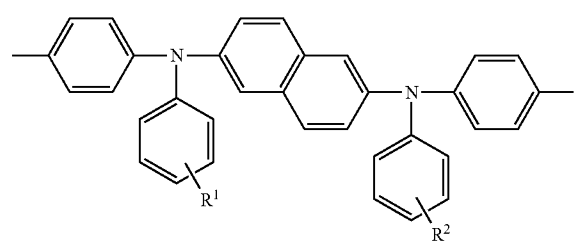

(105)

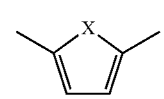

(106)

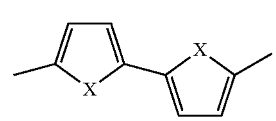

-continued

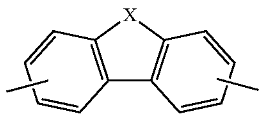
(107)

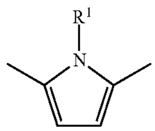
(108)

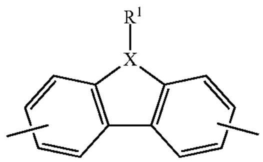
(109)

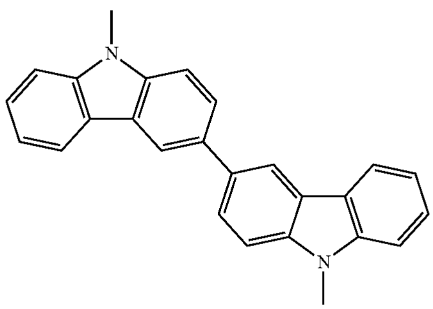
(110)

In addition, as the π-electron deficient heteroaromatic skeleton included in the second skeleton (the skeleton 131_2), a pyridine skeleton, a diazine skeleton (a pyrimidine skeleton, a pyrazine skeleton, or a pyridazine skeleton), or a triazine skeleton is preferable; in particular, the diazine skeleton or the triazine skeleton is preferable because of its high stability and reliability.

As examples of the above-described π-electron deficient heteroaromatic skeleton, skeletons represented by the following general formulae (201) to (210) are given.

[Chemical Formulae 2]

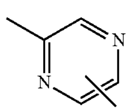
(201)

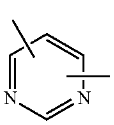
(202)

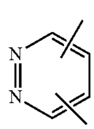
(203)

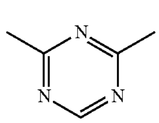
(204)

-continued

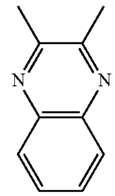
(205)

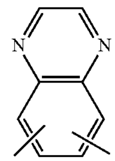
(206)

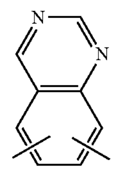
(207)

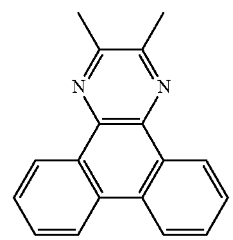
(208)

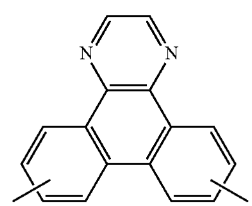
(209)

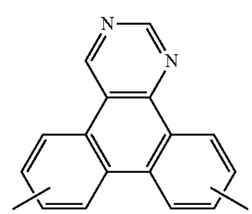
(210)

Note that as the second skeleton, instead of the above-described π-electron deficient heteroaromatic skeleton, an aromatic hydrocarbon skeleton whose triplet excitation energy is 2 eV or more, such as a biphenyl skeleton, a naphthalene skeleton, a phenanthrene skeleton, a triphenylene skeleton, or a fluorene skeleton may be used.

In addition, a skeleton having a hole-transport property included in the first skeleton (the skeleton 131_1) (specifically, at least one of the π-electron rich heteroaromatic skeleton and the aromatic amine skeleton) and a skeleton having an electron-transport property included in the second skeleton (specifically, the π-electron deficient heteroaromatic skeleton) are preferably bonded or polymerized to each other through at least the skeleton 131_3.

Examples of the skeleton 131_3 (the third skeleton) include a phenylene skeleton, a biphenyldiyl skeleton, a terphenyldiyl skeleton, a naphthalenediyl skeleton, a fluorenediyl skeleton, a 9,10-dihydroanthracenediyl skeleton, a phenanthrenediyl skeleton, and an arylenevinylene skeleton (a phenylenevinylene skeleton or the like), which are skeletons represented by the following general formulae (301) to (314), for example.

[Chemical Formulae 3]

(301)

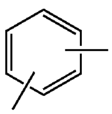

(302)

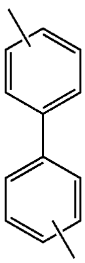

(303)

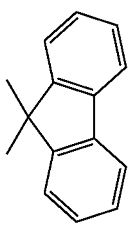

(304)

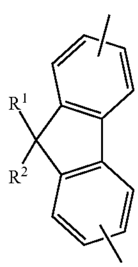

(305)

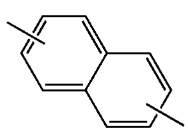

(306)

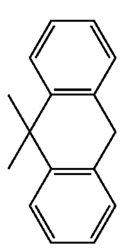

-continued (307)

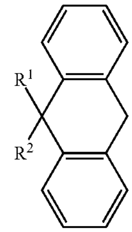

(308)

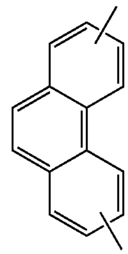

(309)

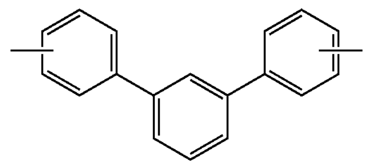

(310)

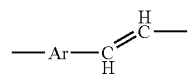

(311)

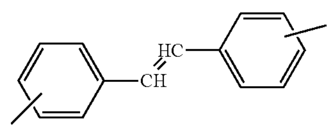

(312)

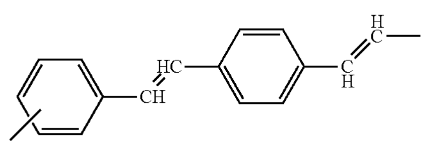

(313)

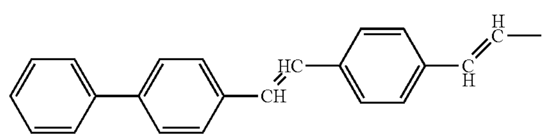

(314)

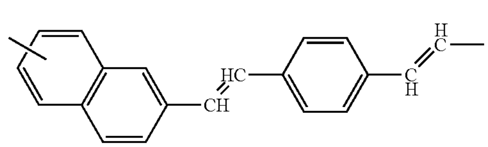

The above-described aromatic amine skeleton (e.g., the triarylamine skeleton), π-electron rich heteroaromatic skeleton (e.g., a ring including the furan skeleton, the thiophene skeleton, or the pyrrole skeleton), and π-electron deficient heteroaromatic skeleton (e.g., a ring including the pyridine skeleton, the diazine skeleton, or the triazine skeleton) or the above-described general formulae (101) to (110), general formulae (201) to (210), and general formulae (301) to (314) may each have a substituent. As the substituent, an alkyl group, an alkoxy group, or an alkylthio group having 1 to 20 carbon atoms, a cycloalkyl group having 3 to 20 carbon atoms, a substituted or unsubstituted aryl group or aryloxy group having 6 to 18 carbon atoms, or a heterocyclic compound group having 4 to 14 carbon atoms can also be selected. Specific examples of the alkyl group having 1 to 20 carbon atoms include a methyl group, an ethyl group, a propyl group, an isopropyl group, a butyl group, an isobutyl group, a tert-butyl group, a pentyl group, a hexyl group, a heptyl group, an octyl group, a decyl group, a lauryl group, a 2-ethyl-hexyl group, a 3-methyl-butyl group, and the like. In addition, specific examples of the alkoxy group having 1 to 20 carbon atoms include a methoxy group, an ethoxy group, a butoxy group, a pentyloxy group, a hexyloxy group, a heptyloxy group, an octyloxy group, a decyloxy group, a lauryloxy group, a 2-ethyl-hexyloxy group, a 3-methyl-butoxy group, an isopropyloxy group, and the like. In addition, specific examples of the alkylthio group having 1 to 20 carbon atoms include a methylthio group, an ethylthio group, a butylthio group, a pentylthio group, a hexylthio group, a heptylthio group, an octylthio group, a decylthio group, a laurylthio group, a 2-ethyl-hexylthio group, a 3-methyl-butylthio group, an isopropylthio group, and the like. Specific examples of the cycloalkyl group having 3 to 20 carbon atoms include a cyclopropyl group, a cyclobutyl group, a cyclopentyl group, a cyclohexyl group, a norbornyl group, a noradamantyl group, an adamantyl group, a homoadamantyl group, a tricyclodecanyl group, and the like. Specific examples of the aryl group having 6 to 18 carbon atoms include a substituted or unsubstituted phenyl group, naphthyl group, biphenyl group, fluorenyl group, anthracenyl group, pyrenyl group, and the like. In addition, specific examples of an aryloxy group having 6 to 18 carbon atoms include a substituted or unsubstituted alkoxyphenoxy group, alkylphenoxy group, naphthyloxy group, anthracenyloxy group, pyrenyloxy group, and the like. Specific examples of the heterocyclic compound group having 4 to 14 carbon atoms include a substituted or unsubstituted thienyl group, pyrrolyl group, furyl group, pyridyl group, and the like. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

Furthermore, Ar represents an arylene group having 6 to 18 carbon atoms. The arylene group may include one or more substituents and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 18 carbon atoms include a phenylene group, a naphthylene group, a biphenyldiyl group, a fluorenediyl group, an anthracenediyl group, a phenanthrenediyl group, a pyrenediyl group, a perylenediyl group, a chrysenediyl group, an alkoxyphenylene group, and the like. In the case where the arylene group has a substituent, as the substituent, an alkyl group, an alkoxy group, or an alkylthio group having 1 to 20 carbon atoms, a cycloalkyl group having 3 to 20 carbon atoms, a substituted or unsubstituted aryl group or aryloxy group having 6 to 18 carbon atoms, or a heterocyclic compound group having 4 to 14 carbon atoms can also be selected. Specific examples of the alkyl group having 1 to 20 carbon atoms include a methyl group, an ethyl group, a propyl group, an isopropyl group, a butyl group, an isobutyl group, a tert-butyl group, a pentyl group, a hexyl group, a heptyl group, an octyl group, a decyl group, a lauryl group, a 2-ethyl-hexyl group, a 3-methyl-butyl group, and the like. In addition, specific examples of the alkoxy group having 1 to 20 carbon atoms include a methoxy group, an ethoxy group, a butoxy group, a pentyloxy group, a hexyloxy group, a heptyloxy group, an octyloxy group, a decyloxy group, a lauryloxy group, a 2-ethyl-hexyloxy group, a 3-methyl-butoxy group, an isobutoxy group, and the like. In addition, specific examples of the alkylthio group having 1 to 20 carbon atoms include a methylthio group, an ethylthio group, a butylthio group, a pentylthio group, a hexylthio group, a heptylthio group, an octylthio group, a decylthio group, a laurylthio group, a 2-ethyl-hexylthio group, a 3-methyl-butylthio group, an isopropylthio group, and the like. Specific examples of the cycloalkyl group having 3 to 20 carbon atoms include a cyclopropyl group, a cyclobutyl group, a cyclopentyl group, a cyclohexyl group, a norbornyl group, a noradamantyl group, an adamantyl group, a homoadamantyl group, a tricyclodecanyl group, and the like. Specific examples of the aryl group having 6 to 18 carbon atoms include a substituted or unsubstituted phenyl group, naphthyl group, biphenyl group, fluorenyl group, anthracenyl group, pyrenyl group, and the like. In addition, specific examples of an aryloxy group having 6 to 18 carbon atoms include a substituted or unsubstituted alkoxyphenoxy group, alkylphenoxy group, naphthyloxy group, anthracenyloxy group, pyrenyloxy group, and the like. Specific examples of the heterocyclic compound group having 4 to 14 carbon atoms include a substituted or unsubstituted thienyl group, pyrrolyl group, furyl group, pyridyl group, and the like.

As the arylene group represented by Ar, for example, groups represented by the Following structural formulae (Ar-1) to (Ar-18) can be used. Note that the group that can be used as Ar is not limited to these.

[Chemical Formulae 4]

(Ar-1)

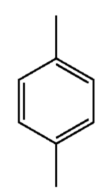

(Ar-2)

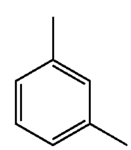

(Ar-3)

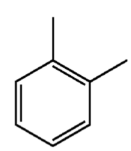

(Ar-4)

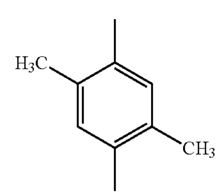

-continued
(Ar-5)
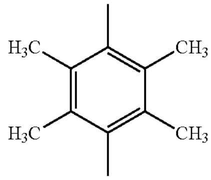
(Ar-6)
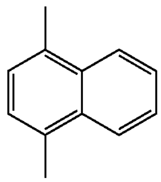
(Ar-7)
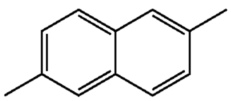
(Ar-8)
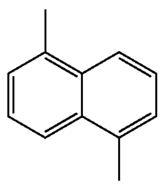
(Ar-9)
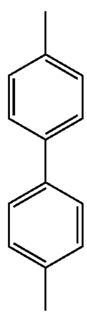
(Ar-10)
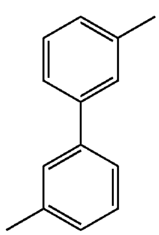
(Ar-11)
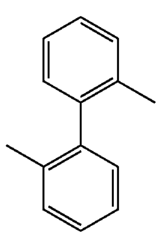
-continued
(Ar-12)
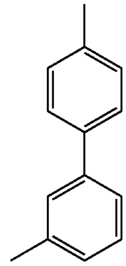
(Ar-13)
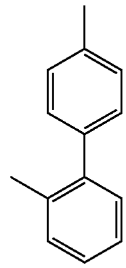
(Ar-14)
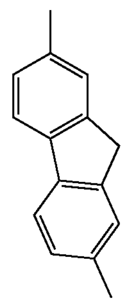
(Ar-15)
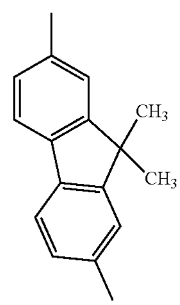
(Ar-16)
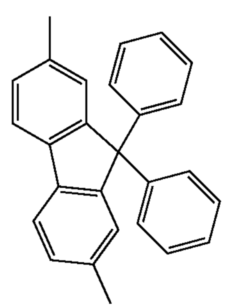

-continued (Ar-17)

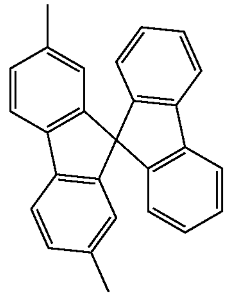

(Ar-18)

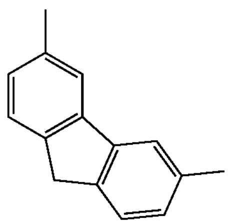

Furthermore, $R^1$ and $R^2$ each independently represent any of hydrogen, an alkyl group, an alkoxy group, or an alkylthio group having 1 to 20 carbon atoms, a cycloalkyl group having 3 to 20 carbon atoms, a substituted or unsubstituted aryl group or aryloxy group having 6 to 18 carbon atoms, and a heterocyclic compound group having 4 to 14 carbon atoms. Specific examples of the alkyl group having 1 to 20 carbon atoms include a methyl group, an ethyl group, a propyl group, an isopropyl group, a butyl group, an isobutyl group, a tert-butyl group, a pentyl group, a hexyl group, a heptyl group, an octyl group, a decyl group, a lauryl group, a 2-ethyl-hexyl group, a 3-methyl-butyl group, and the like. In addition, specific examples of the alkoxy group having 1 to 20 carbon atoms include a methoxy group, an ethoxy group, a butoxy group, a pentyloxy group, a hexyloxy group, a heptyloxy group, an octyloxy group, a decyloxy group, a lauryloxy group, a 2-ethyl-hexyloxy group, a 3-methyl-butoxy group, an isobutoxy group, and the like. In addition, specific examples of the alkylthio group having 1 to 20 carbon atoms include a methylthio group, an ethylthio group, a butylthio group, a pentylthio group, a hexylthio group, a heptylthio group, an octylthio group, a decylthio group, a laurylthio group, a 2-ethyl-hexylthio group, a 3-methyl-butylthio group, an isopropylthio group, and the like. Specific examples of the cycloalkyl group having 3 to 20 carbon atoms include a cyclopropyl group, a cyclobutyl group, a cyclopentyl group, a cyclohexyl group, a norbornyl group, a noradamantyl group, an adamantyl group, a homoadamantyl group, a tricyclodecanyl group, and the like. Specific examples of the aryl group having 6 to 18 carbon atoms include a substituted or unsubstituted phenyl group, naphthyl group, biphenyl group, fluorenyl group, anthracenyl group, pyrenyl group, and the like. In addition, specific examples of an aryloxy group having 6 to 18 carbon atoms include a substituted or unsubstituted alkoxyphenoxy group, alkylphenoxy group, naphthyloxy group, anthracenyloxy group, pyrenyloxy group, and the like. Specific examples of the heterocyclic compound group having 4 to 14 carbon atoms include a substituted or unsubstituted thienyl group, pyrrolyl group, furyl group, pyridyl group, and the like. The above $R^1$ and $R^2$ may each have a substituent, and the substituents may be bonded to each other to form a ring. As the substituent, an alkyl group, an alkoxy group, or an alkylthio group having 1 to 20 carbon atoms, a cycloalkyl group having 3 to 20 carbon atoms, a substituted or unsubstituted aryl group or aryloxy group having 6 to 18 carbon atoms, or a heterocyclic compound group having 4 to 14 carbon atoms can also be selected. Specific examples of the alkyl group having 1 to 20 carbon atoms include a methyl group, an ethyl group, a propyl group, an isopropyl group, a butyl group, an isobutyl group, a tert-butyl group, a pentyl group, a hexyl group, a heptyl group, an octyl group, a decyl group, a lauryl group, a 2-ethyl-hexyl group, a 3-methyl-butyl group, and the like. In addition, specific examples of the alkoxy group having 1 to 20 carbon atoms include a methoxy group, an ethoxy group, a butoxy group, a pentyloxy group, a hexyloxy group, a heptyloxy group, an octyloxy group, a decyloxy group, a lauryloxy group, a 2-ethyl-hexyloxy group, a 3-methyl-butoxy group, an isobutoxy group, and the like. In addition, specific examples of the alkylthio group having 1 to 20 carbon atoms include a methylthio group, an ethylthio group, a butylthio group, a pentylthio group, a hexylthio group, a heptylthio group, an octylthio group, a decylthio group, a laurylthio group, a 2-ethyl-hexylthio group, a 3-methyl-butylthio group, an isopropylthio group, and the like. Specific examples of the cycloalkyl group having 3 to 20 carbon atoms include a cyclopropyl group, a cyclobutyl group, a cyclopentyl group, a cyclohexyl group, a norbornyl group, a noradamantyl group, an adamantyl group, a homoadamantyl group, a tricyclodecanyl group, and the like. Specific examples of the aryl group having 6 to 18 carbon atoms include a substituted or unsubstituted phenyl group, naphthyl group, biphenyl group, fluorenyl group, anthracenyl group, pyrenyl group, and the like. In addition, specific examples of an aryloxy group having 6 to 18 carbon atoms include a substituted or unsubstituted alkoxyphenoxy group, alkylphenoxy group, naphthyloxy group, anthracenyloxy group, pyrenyloxy group, and the like. Specific examples of the heterocyclic compound group having 4 to 14 carbon atoms include a substituted or unsubstituted thienyl group, pyrrolyl group, furyl group, pyridyl group, and the like.

For example, groups represented by the following structural formulae (R-1) to (R-29) can be used as the alkyl group or aryl group represented by $R^1$ and $R^2$ and the substituents which can be included in the general formulae (101) to (110), the general formulae (201) to (210), the general formulae (301) to (314), Ar, $R^1$, and $R^2$. Note that the groups which can be used as an alkyl group or an aryl group are not limited thereto.

[Chemical Formulae 5]

(R-1)

(R-2)

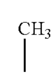

(R-3)

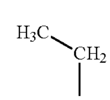

(R-4)

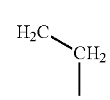

-continued
(R-5)
(R-6)
(R-7)
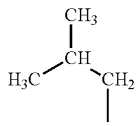
(R-8)
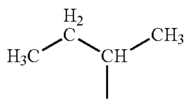
(R-9)
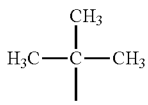
(R-10)
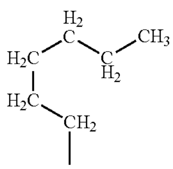
(R-11)
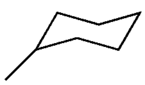
(R-12)
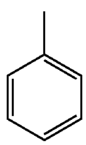
(R-13)
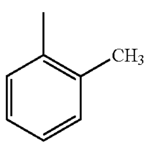
(R-14)
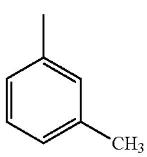
(R-15)
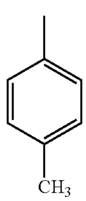
(R-16)
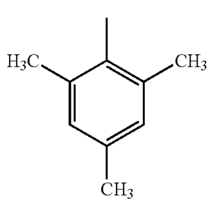
-continued
(R-17)
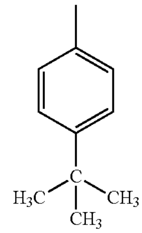
(R-18)
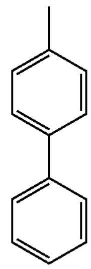
(R-19)
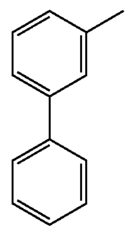
(R-20)
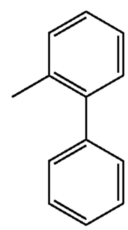
(R-21)
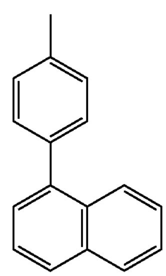
(R-22)
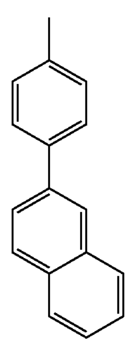

-continued (R-23)

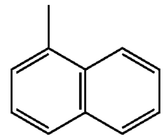

(R-24)

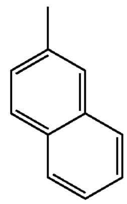

(R-25)

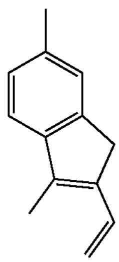

(R-26)

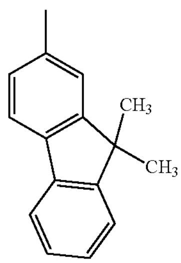

(R-27)

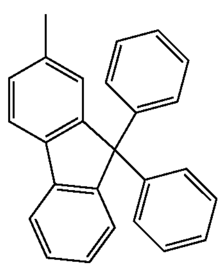

(R-28)

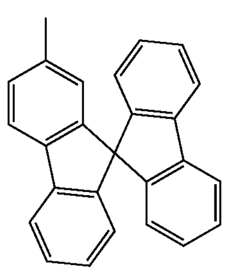

-continued (R-29)

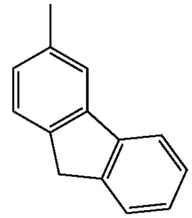

In the light-emitting layer 130, there is no particular limitation on the guest material 132, but the guest material 132 is preferably an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following substituted or unsubstituted materials can be used. As the substituent, any of the above-described substituents can be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-

(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As described above, the energy transfer efficiency based on Dexter mechanism from the high molecular material 131 to the guest material 132 is preferably low. The rate constant of Dexter mechanism is inversely proportional to the exponential function of the distance between the two molecules. Thus, when the distance between the two molecules is approximately 1 nm or less, Dexter mechanism is dominant, and when the distance is approximately 1 nm or more, Förster mechanism is dominant. To reduce the energy transfer efficiency in Dexter mechanism, the distance between the high molecular material 131 and the guest material 132 is preferably large, and specifically, 0.7 nm or more, preferably 0.9 nm or more, further preferably 1 nm or more. In view of the above, the guest material 132 preferably has a substituent that prevents the proximity to the high molecular material 131. The substituent is preferably aliphatic hydrocarbon, further preferably an alkyl group, still further preferably a branched alkyl group. Specifically, the guest material 132 preferably includes at least two alkyl groups each having 2 or more carbon atoms. Alternatively, the guest material 132 preferably includes at least two branched alkyl groups each having 3 to 10 carbon atoms. Alternatively, the guest material 132 preferably includes at least two cycloalkyl groups each having 3 to 10 carbon atoms.

Alternatively, the guest material 132 may be a high molecular compound, for example, a compound including a phenylene group, a naphthalenediyl group, an anthracenediyl group, a phenanthrenediyl group, a dihydrophenanthrenediyl group, a carbazoldiyl group, a phenoxazinediyl group, a phenothiazinediyl group, a pyrenediyl group, or the like.

In the light-emitting layer 130, the skeleton 131_4 is not particularly limited; however, the skeleton 131_4 preferably includes a light-emitting skeleton which is included in the guest material 132. That is, for example, a structure in which one or two hydrogen atoms are removed from an aromatic ring of a skeleton of anthracene, tetracene, chrysene, phenanthrene, pyrene, perylene, stilbene, acridone, coumarin, phenoxazine, phenothiazine, or the like is preferably used as the structural unit. As the light-emitting skeleton, any of the skeletons represented by the following general formulae (401) to (410) from which one or two hydrogen atoms are removed is used. In addition, each of the skeletons preferably includes a substituent. In order to suppress the above-described Dexter transfer, an aliphatic hydrocarbon group, preferably an alkyl group, further preferably a branched alkyl group may be introduced as the substituent. Specifically, the skeleton 131_4 preferably includes at least two alkyl groups each having 2 or more carbon atoms. Alternatively, the skeleton 131_4 preferably includes at least two branched alkyl groups each having 3 to 10 carbon atoms. Alternatively, the skeleton 131_4 preferably includes at least two cycloalkyl groups each having 3 to 10 carbon atoms.

[Chemical Formulae 6]

(401)

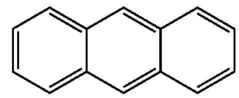

(402)

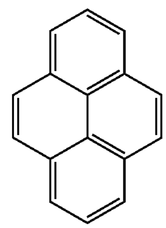

(403)

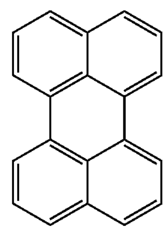

(404)

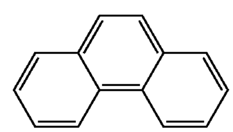

(405)

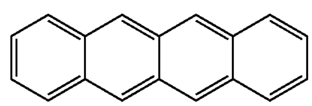

(406)

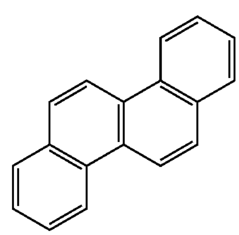

(407)

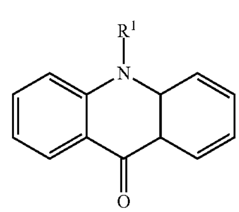

-continued (408)

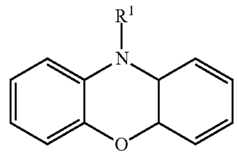

(409)

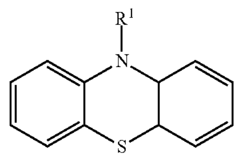

(410)

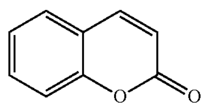

The light-emitting layer 130 may contain another material in addition to the high molecular material 131 and the guest material 132. For example, a substituted or unsubstituted material of any of the following hole-transport materials and electron-transport materials can be used. Note that as the substituent, any of the above-described substituents can be used.

A material having a property of transporting more holes than electrons can be used as the hole-transport material, and a material having a hole mobility of $1\times10^{-6}$ $cm^2/Vs$ or higher is preferable. Specifically, an aromatic amine, a carbazole derivative, an aromatic hydrocarbon, a stilbene derivative, or the like can be used. Furthermore, the hole-transport material may be a high molecular compound. Furthermore, a high molecular compound including the hole-transport skeleton, the π-electron rich heteroaromatic skeleton, or the aromatic amine skeleton, which is included in the high molecular material 131 may be used.

Examples of the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ $cm^2/Vs$ or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]

fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). The substances described here are mainly substances having a hole mobility of $1\times10^{-6}$ $cm^2/Vs$ or higher. Note that other than these substances, any substance that has a property of transporting more holes than electrons may be used.

As the electron-transport material, a material having a property of transporting more electrons than holes can be used, and a material having an electron mobility of $1\times10^{-6}$ $cm^2/Vs$ or higher is preferable. A π-electron deficient heteroaromatic compound such as a nitrogen-containing heteroaromatic compound, a metal complex, or the like can be used as the material which easily accepts electrons (the material having an electron-transport property). Specific examples include a metal complex having a quinoline ligand, a benzoquinoline ligand, an oxazole ligand, or a thiazole ligand, an oxadiazole derivative, a triazole derivative, a phenanthroline derivative, a pyridine derivative, a bipyridine derivative, a pyrimidine derivative, and the like. Furthermore, the electron-transport material may be a high molecular compound. Furthermore, a high molecular compound including the electron-transport skeleton or the π-electron deficient heteroaromatic skeleton, which is included in the high molecular material 131 may be used.

Examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(biphenyl-4-yl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy); and heteroaromatic compounds such as 4,4'-bis(5-methylbenzoxazol-2-yl)stilbene (abbreviation: BzOs). Among the heterocyclic compounds, the heterocyclic compounds having diazine skeletons (pyrimidine, pyrazine, pyridazine) or having a pyridine skeleton are highly reliable and stable and is thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ $cm^2/Vs$ or higher. Note that other substances may also be used as long as their electron-transport properties are higher than their hole-transport properties.

In addition, the high molecular material 131 may have a structure where one or two hydrogen atoms are removed from any of the above-described hole-transport materials and electron-transport materials.

In addition, the light-emitting layer 130 may contain a thermally activated delayed fluorescent emitter in addition to the high molecular material 131 and the guest material 132. Alternatively, a material having a function of exhibiting thermally activated delayed fluorescence at room temperature is preferably contained. Note that a thermally activated delayed fluorescent emitter is a material which can generate a singlet excited state from a triplet excited state by reverse intersystem crossing by thermal activation. The thermally activated delayed fluorescent emitter may contain a material which can generate a singlet excited state by itself from a triplet excited state by reverse intersystem crossing, for example, a TADF material. Such a material preferably has a difference between the singlet excitation energy level and the triplet excitation energy level of larger than 0 eV and smaller than or equal to 0.2 eV.

As the TADF material serving as the thermally activated delayed fluorescent emitter, for example, any of the following materials can be used.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

As the thermally activated delayed fluorescence material composed of one kind of material, a heterocyclic compound having a π-electron rich heteroaromatic ring and a π-electron deficient heteroaromatic ring can be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can be used. The heterocyclic compound is preferable because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the singlet excitation energy level and the triplet excitation energy level becomes small.

Alternatively, the thermally activated delayed fluorescent material may contain a combination of two kinds of materials which form an excited complex. As the combination of two kinds of materials, a combination of the above-described hole-transport material and electron-transport material is preferable. Specifically, a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, or the like can be used. Other examples are an aromatic amine and a carbazole derivative.

As the material that can be used for the light-emitting layer 130, a material capable of being dissolved in a solvent which can dissolve the high molecular material of one embodiment of the present invention is preferable.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the high molecular material and the second light-emitting layer is formed using a substance having an electron-transport property as the high molecular material.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene. In addition, polyvinylcarbazole and a derivative thereof, polyarylene including an aromatic amine skeleton or a π-electron rich heteroaromatic skeleton in a side chain or a main chain and a derivative thereof, and the like are given as examples.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2$/Vs or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

<<Hole-Transport Layer>>

A hole-transport layer may be provided between the hole-injection layer 111 and the light-emitting layer 130. The hole-transport layer is a layer containing a hole-transport material and can be formed using any of the hole-transport materials given as examples of the material of the hole-injection layer 111. In order that the hole-transport layer has a function of transporting holes injected into the hole-injection layer 111 to the light-emitting layer 130, the HOMO level of the hole-transport layer is preferably equal or close to the HOMO level of the hole-injection layer 111.

As the hole-transport material, a substance having a hole mobility of $1\times10^{-6}$ $cm^2/Vs$ or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

An electron-transport layer may be provided between the light-emitting layer 130 and the electron-injection layer 114. The electron-transport layer has a function of transporting, to the light-emitting layer 130, electrons injected from the other of the pair of electrodes (the electrode 101 or the electrode 102) through the electron-injection layer 114. A material having a property of transporting more electrons than holes can be used as the electron-transport material, and a material having an electron mobility of $1\times10^{-6}$ $cm^2/Vs$ or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, an oxadiazole derivative; a triazole derivative, a phenanthroline derivative, a pyridine derivative, a bipyridine derivative, a pyrimidine derivative, and the like, which are described as the electron-transport materials that can be used in the light-emitting layer 130, can be given. In addition, a high molecular compound such as polyphenylene, polyfluorene, and derivatives thereof may be used. A substance having an electron mobility of $1\times10^{-6}$ $cm^2/Vs$ or higher is preferable. Note that other than these substances, any substance that has a property of transporting more electrons than holes may be used for the electron-transport layer. The electron-transport layer is not limited to a single layer, and may include stacked two or more layers containing the aforementioned substances.

Between the electron-transport layer and the light-emitting layer 130, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 114 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layer 114. Examples of the electride include a substance in which electrons are added at high concentration to calcium oxide-aluminum oxide. The electron-injection layer 114 can be formed using the substance that can be used for the electron-transport layer 118.

A composite material in which an organic compound and an electron donor (donor) are mixed may also be used for the electron-injection layer 114. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, and ytterbium are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle-printing method, a gravure printing method, or the like. Besides the above-mentioned materials, an inorganic compound such as a quantum dot may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

Examples of a solvent which can be used in the case where the inkjet method, the coating method, the nozzle-printing method, the gravure printing method, or the like is used include: chlorine-based solvents such as dichloroethane, trichloroethane, chlorobenzene, and dichlorobenzene;

ether-based solvents such as tetrahydrofuran, dioxane, anisole, and methylanisole; aromatic hydrocarbon-based solvents such as toluene, xylene, mesitylene, ethylbenzene, hexylbenzene, and cyclohexylbenzene; aliphatic hydrocarbon-based solvents such as cyclohexane, methylcyclohexane, pentane, hexane, heptane, octane, nonane, decane, dodecane, and bicyclohexyl; ketone-based solvents such as acetone, methyl ethyl ketone, benzophenone, and acetophenone; ester-based solvents such as ethyl acetate, butyl acetate, ethyl cellosolve acetate, methyl benzoate, and phenyl acetate; polyalcohol-based solvents such as ethylene glycol, glycerin, and hexanediol; alcohol-based solvents such as isopropyl alcohol and cyclohexanol; a sulfoxide-based solvent such as dimethylsulfoxide; and amide-based solvents such as methylpyrrolidone and dimethylformamide. As the solvent, one or more materials can be used.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and ytterbium (Yb), or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductive containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1\times10^{5}$ Ω·cm, further preferably lower than or equal to $1\times10^{4}$ Ω·cm.

Alternatively, the electrode 101 and/or the electrode 102 may be formed by stacking two or more of these materials.

Furthermore, to increase light extraction efficiency, a material having a higher refractive index than an electrode that has a function of transmitting light may be formed in contact with the electrode. Such a material may be a conductive material or a non-conductive material as long as having a function of transmitting visible light. For example, in addition to the above-described oxide conductor, an oxide semiconductor and an organic material are given as examples. As examples of the organic material, materials of the light-emitting layer, the hole-injection layer, the hole-transport layer, the electron-transport layer, and the electron-injection layer are given. Alternatively, an inorganic carbon-based material or a metal thin film that allows transmission of light can be used. A plurality of layers each of which is formed using the material having a high refractive index and has a thickness of several nanometers to several tens of nanometers may be stacked.

In the case where the electrode 101 or the electrode 102 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, and the like.

In the case where the electrode 101 or the electrode 102 is used as an anode, a material having a high work function (higher than or equal to 4.0 eV) is preferably used.

Alternatively, the electrodes 101 and 102 may each be a stack of a conductive material having a function of reflecting light and a conductive material having a function of transmitting light. In that case, the electrodes 101 and 102 can each have a function of adjusting the optical path length so that light at a desired wavelength emitted from each light-emitting layer resonates and is intensified; thus, such a structure is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting element in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. There is no particular limitation on the type of substrate. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, and a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, which is formed over any of the above-described substrates. Accordingly, an active matrix display device in which the FET controls the driving of the light-emitting element 150 can be manufactured.

In Embodiment 1, one embodiment of the present invention has been described. Other embodiments of the present invention are described in Embodiments 2 to 9. Note that one embodiment of the present invention is not limited thereto. That is, since various embodiments of the present invention are disclosed in Embodiment 1 and Embodiments 2 to 9, one embodiment of the present invention is not limited to a specific embodiment. The example in which one embodiment of the present invention is used in a light-emitting element is described; however, one embodiment of the present invention is not limited thereto. For example, depending on circumstances or conditions, one embodiment of the present invention is not necessarily used in a light-emitting element. Although another example in which the EL layer includes the high molecular material and the guest material, the high molecular material has a structure where the first skeleton and the second skeleton are bonded to each other through the third skeleton, and the first high molecular chain and the second high molecular chain of the high molecular material form an excited complex is shown as one embodiment of the present invention, one embodiment of the present invention is not limited thereto. Depending on circumstances or conditions, the first high molecular chain and the second high molecular chain of the high molecular material do not need to form an excited complex in one embodiment of the present invention, for example. Alternatively, the structure where the first skeleton and the second skeleton in the high molecular material are bonded to each other through the third skeleton is not necessarily provided. Although another example in which the first skeleton in the high molecular material includes at least one of the π-electron rich heteroaromatic skeleton and the aromatic amine skeleton and the second skeleton includes the π-electron deficient heteroaromatic skeleton is shown as one embodiment of the present invention, one embodiment of the present invention is not limited thereto. Depending on circumstances or conditions, the first skeleton does not necessarily include the π-electron rich heteroaromatic skeleton or the aromatic amine skeleton in one embodiment of the present invention, for example. Alternatively, the second skeleton does not necessarily include the π-electron deficient heteroaromatic skeleton.

The structures described in this embodiment can be used in appropriate combination with any of the other embodiments.

Embodiment 2

In this embodiment, a light-emitting element having a structure different from that described in Embodiment 1 and light emission mechanisms of the light-emitting element are described below with reference to FIGS. 3A to 3C and FIG.

4. In FIG. 3A, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Structure Example 1 of Light-Emitting Element

Figure 3A:
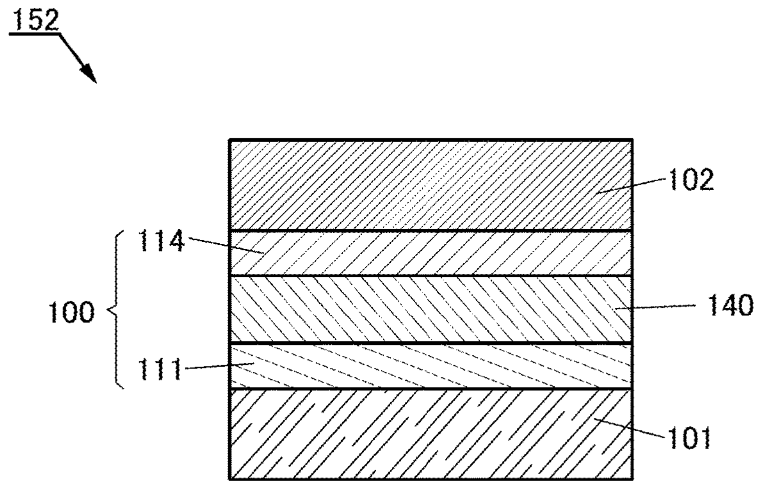
FIGS. 3A and 3B are schematic cross-sectional views of a light-emitting element of one embodiment of the present invention and FIG. 3C illustrates the correlation of energy levels in a light-emitting layer.

FIG. 3A is a schematic cross-sectional view of a light-emitting element 152 of one embodiment of the present invention.

The light-emitting element 152 includes a pair of electrodes (an electrode 101 and an electrode 102) and an EL layer 100 between the pair of electrodes. The EL layer 100 includes at least a light-emitting layer 140.

Note that the electrode 101 functions as an anode and the electrode 102 functions as a cathode in the following description of the light-emitting element 152; however, the functions may be interchanged in the light-emitting element 152.

Figure 3B:
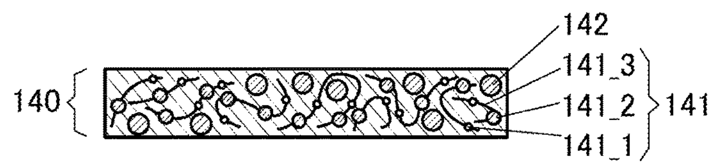

FIG. 3B is a schematic cross-sectional view illustrating an example of the light-emitting layer 140 in FIG. 3A. The light-emitting layer 140 in FIG. 3B includes a high molecular material 141 and a guest material 142.

The high molecular material 141 includes a skeleton 141_1, a skeleton 141_2, and a skeleton 141_3 as structural units. The skeleton 141_1 and the skeleton 141_2 are bonded or polymerized to each other through the skeleton 141_3.

The guest material 142 may be a light-emitting organic compound, and the light-emitting organic compound is preferably a substance capable of emitting phosphorescence (hereinafter also referred to as a phosphorescent compound). A structure in which a phosphorescent compound is used as the guest material 142 will be described below. The guest material 142 may be rephrased as the phosphorescent compound.

<Light Emission Mechanism of Light-Emitting Element>

Next, the light emission mechanism of the light-emitting layer 140 is described below.

In the high molecular material 141 in the light-emitting layer 140, it is preferable that the skeleton 141_1 include a skeleton having a function of transporting holes (a hole-transport property) and the skeleton 141_2 include a skeleton having a function of transporting electrons (an electron-transport property). Alternatively, it is preferable that the skeleton 141_1 include at least one of a π-electron rich heteroaromatic skeleton and an aromatic amine skeleton and the skeleton 141_2 include a π-electron deficient heteroaromatic skeleton.

In one embodiment of the present invention, the high molecular material 141 has a function of forming an excited complex (also referred to as an excited dimer) with two high molecular chains of the high molecular material 141. In particular, the skeleton having a hole-transport property and the skeleton having an electron-transport property of the high molecular material 141 preferably form an excited complex in two high molecular chains including the same structural units. Alternatively, at least one of the π-electron rich heteroaromatic skeleton and the aromatic amine skeleton included in the high molecular material 141 and the π-electron deficient heteroaromatic skeleton included in the high molecular material 141 preferably form an excited complex in two high molecular chains including the same structural units.

In other words, the high molecular material 141 has a function of forming an excited complex with a first high molecular chain and a second high molecular chain of the high molecular material 141. In particular, the skeleton having a hole-transport property in the first high molecular chain and the skeleton having an electron-transport property in the second high molecular chain of the high molecular material 141 preferably form an excited complex. Alternatively, at least one of the π-electron rich heteroaromatic skeleton and the aromatic amine skeleton in the first high molecular chain of the high molecular material 141 and the π-electron deficient heteroaromatic skeleton in the second high molecular chain of the high molecular material 141 preferably form an excited complex.

In the case where the high molecular material 141 includes the skeleton having a hole-transport property included in the skeleton 141_1 and the skeleton having an electron-transport property included in the skeleton 141_2, a donor-acceptor excited complex is easily formed by two high molecular chains; thus, efficient formation of an excited complex is possible. Alternatively, in the case where the high molecular material 141 includes at least one of the π-electron rich heteroaromatic skeleton and the aromatic amine skeleton included in the skeleton 141_1, and the π-electron deficient heteroaromatic skeleton included in the skeleton 141_2, a donor-acceptor excited complex is easily formed by two high molecular chains; thus, efficient formation of an excited complex is possible.

Thus, to increase both the donor property and the acceptor property in the high molecular chains of the high molecular material 141, a structure where the conjugation between the skeleton having a hole-transport property and the skeleton having an electron-transport property is reduced is preferably used. Alternatively, a structure where the conjugation between the π-electron deficient heteroaromatic skeleton and at least one of the π-electron rich heteroaromatic skeleton and the aromatic amine skeleton is reduced is preferably used. Thus, a difference between a singlet excitation energy level and a triplet excitation energy level of the high molecular material 141 can be reduced. Moreover, the triplet excitation energy level of the high molecular material 141 can be high.

Furthermore, in the excited complex formed by the two high molecular chains including the same structural units, one high molecular chain includes the HOMO and the other high molecular chain includes the LUMO; thus, an overlap between the HOMO and the LUMO is extremely small. That is, in the excited complex, a difference between a singlet excitation energy level and a triplet excitation energy level is small. Therefore, in the excited complex formed by the two high molecular chains of the high molecular material 141, a difference between a singlet excitation energy level and a triplet excitation energy level is small and is preferably larger than 0 eV and smaller than or equal to 0.2 eV.

In the case where the high molecular material 141 includes the skeleton having a hole-transport property and the skeleton having an electron-transport property, the carrier balance can be easily controlled. As a result, a carrier recombination region can also be controlled easily. In order to achieve this, it is preferable that the composition ratio of the skeleton 141_1 (including the skeleton having a hole-transport property) to the skeleton 141_2 (including the skeleton having an electron-transport property) be in the range of 1:9 to 9:1 (molar ratio), and it is further preferable that the proportion of the skeleton 141_2 (including the skeleton having an electron-transport property) be higher than the proportion of the skeleton 141_1 (including the skeleton having a hole-transport property).

Figure 3C:
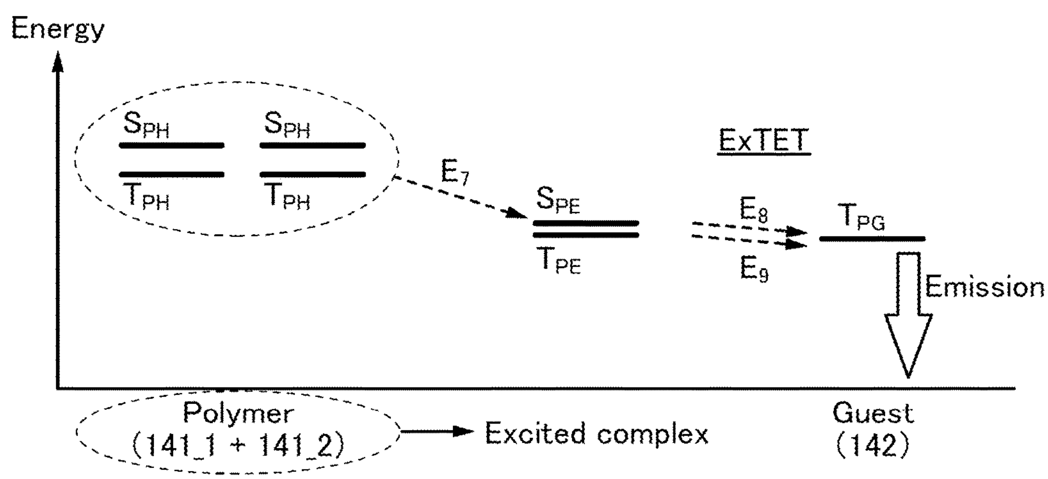

FIG. 3C shows a correlation of energy levels of the high molecular material 141 and the guest material 142 in the light-emitting layer 140. The following explains what terms and signs in FIG. 3C represent:

Polymer (141_1+141_2): the skeleton 141_1 in the first high molecular chain and the skeleton 141_2 in the second high molecular chain, which are close to each other, of the high molecular material 141;

Guest (142): the guest material 142 (the phosphorescent compound);

$S_{PH}$: the S1 level of the high molecular material 141;

$T_{PH}$: the T1 level of the high molecular material 141;

$T_{PG}$: the T1 level of the guest material 142 (the phosphorescent compound);

$S_{PE}$: the S1 level of the excited complex; and $T_{PE}$: the T1 level of the excited complex.

In the light-emitting layer 140, the high molecular material 141 is present in the largest proportion by weight, and the guest material 142 (the phosphorescent compound) is dispersed in the high molecular material 141. The T1 level of the high molecular material 141 in the light-emitting layer 140 is preferably higher than the T1 level of the guest material (the guest material 142) in the light-emitting layer 140.

In the light-emitting element of one embodiment of the present invention, an excited complex is formed by the two high molecular chains of the high molecular material 141 included in the light-emitting layer 140. The lowest energy level ($S_{PE}$) in a singlet excited state of the excited complex and the lowest energy level ($T_{PE}$) in a triplet excited state of the excited complex are close to each other (see Route $E_7$ in FIG. 3C).

In the two high molecular chains close to each other of the high molecular material 141, one high molecular chain receives a hole and the other high molecular chain receives an electron to immediately form an excited complex. Alternatively, one high molecular chain brought into an excited state immediately interacts with the other high molecular chain to form an excited complex. Therefore, most excitons in the light-emitting layer 140 exist as excited complexes. Because the excitation energy levels ($S_{PE}$ and $T_{PE}$) of the excited complex are lower than the singlet excitation energy level ($S_{PH}$) of the high molecular material 141 that forms the excited complex, the excited state of the high molecular material 141 can be formed with lower excitation energy. Accordingly, the driving voltage of the light-emitting element 152 can be reduced.

Both energies of $S_{PE}$ and $T_{PE}$ of the excited complex are then transferred to the lowest energy level in the triplet excited state of the guest material 142 (the phosphorescent compound); thus, light emission is obtained (see Routes $E_8$ and $E_9$ in FIG. 3C).

Furthermore, the triplet excitation energy level ($T_{PE}$) of the excited complex is preferably higher than the triplet excitation energy level ($T_{PG}$) of the guest material 142. In this way, the singlet excitation energy and the triplet excitation energy of the formed excited complex can be transferred from the singlet excitation energy level ($S_{PE}$) and the triplet excitation energy level ($T_{PE}$) of the excited complex to the triplet excitation energy level ($T_{PG}$) of the guest material 142.

When the light-emitting layer 140 has the above-described structure, light emission from the guest material 142 (the phosphorescent compound) of the light-emitting layer 140 can be obtained efficiently.

Since an excited complex is called "an exciplex" in some cases, the above-described processes through Routes $E_7$, $E_8$, and $E_9$ may be referred to as exciplex-triplet energy transfer (ExTET) in this specification and the like. In other words, in the light-emitting layer 140, excitation energy is transferred from the excited complex to the guest material 142. In this case, the efficiency of reverse intersystem crossing from $T_{PE}$ to $S_{PE}$ and the luminescence quantum yield from the singlet excited state having energy of $S_{PE}$ are not necessarily high; thus, materials can be selected from a wide range of options.

Note that in order to efficiently transfer excitation energy from the excited complex to the guest material 142, the triplet excitation energy level ($T_{PE}$) of the excited complex formed by two high molecular chains is preferably lower than the triplet excitation energy level ($T_{PH}$) of the single high molecular material 141 which forms the excited complex. Thus, quenching of the triplet excitation energy of the excited complex due to another one or more high molecular chains in the high molecular material 141 is less likely to occur, which causes efficient energy transfer to the guest material 142.

Furthermore, the mechanism of the energy transfer process between the molecules of the high molecular material 141 and the guest material 142 can be described using two mechanisms, i.e., Förster mechanism (dipole-dipole interaction) and Dexter mechanism (electron exchange interaction), as in Embodiment 1. For Förster mechanism and Dexter mechanism, Embodiment 1 can be referred to.

<<Concept for Promoting Energy Transfer>>

In energy transfer by Förster mechanism, the energy transfer efficiency $\phi_{ET}$ is higher when the luminescence quantum yield $\phi$ (the fluorescence quantum yield when energy transfer from a singlet excited state is discussed) is higher. Furthermore, it is preferable that the emission spectrum (the fluorescent spectrum in the case where energy transfer from a singlet excited state is discussed) of the high molecular material 141 largely overlap with the absorption spectrum (absorption corresponding to the transition from the singlet ground state to the triplet excited state) of the guest material 142. Moreover, it is preferable that the molar absorption coefficient of the guest material 142 be also high. This means that the emission spectrum of the high molecular material 141 overlaps with the absorption band of the guest material 142 which is on the longest wavelength side.

In energy transfer by Dexter mechanism, in order to increase the rate constant $k_{h^* \rightarrow g}$, it is preferable that an emission spectrum of the high molecular material 141 (a fluorescent spectrum in the case where energy transfer from a singlet excited state is discussed) largely overlap with an absorption spectrum of the guest material 142 (absorption corresponding to transition from a singlet ground state to a triplet excited state). Therefore, the energy transfer efficiency can be optimized by making the emission spectrum of the high molecular material 141 overlap with the absorption band of the guest material 142 which is on the longest wavelength side.

In a manner similar to that of the energy transfer from the high molecular material 141 to the guest material 142, the energy transfer by both Förster mechanism and Dexter mechanism also occurs in the energy transfer process from the excited complex to the guest material 142.

Accordingly, one embodiment of the present invention provides a light-emitting element including the high molecular material 141 in which two high molecular chains form an excited complex which functions as an energy donor capable of efficiently transferring energy to the guest material 142. The excited complex formed by the two high molecular chains of the high molecular material 141 has a singlet excitation energy level and a triplet excitation energy level which are close to each other; accordingly, the excited complex generated in the light-emitting layer 140 can be formed with lower excitation energy than the high molecular material 141 alone. This can reduce the driving voltage of the light-emitting element 152. Furthermore, in order to facilitate energy transfer from the singlet excited state of the excited complex to the triplet excited state of the guest material 142 serving as an energy acceptor, it is preferable that the emission spectrum of the excited complex overlap with the absorption band of the guest material 142 which is on the longest wavelength side (lowest energy side). Thus, the efficiency of generating the triplet excited state of the guest material 142 can be increased.

Structure Example 2 of Light-Emitting Element

Next, a structure example of the light-emitting layer 140 different from that in FIG. 3B is described below with reference to FIG. 4.

Figure 4:
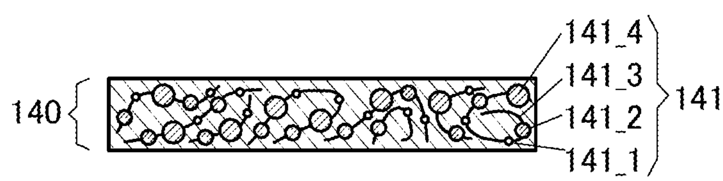
FIG. 4 is a schematic cross-sectional view of a light-emitting layer of one embodiment of the present invention.

FIG. 4 is a schematic cross-sectional view illustrating another example of the light-emitting layer 140 in FIG. 3A. Note that in FIG. 4, portions having functions similar to those of portions in FIG. 3B are denoted by the same reference numerals, and a detailed description of the portions is omitted in some cases.

The light-emitting layer 140 in FIG. 4 contains the high molecular material 141. The high molecular material 141 includes the skeleton 141_1, the skeleton 141_2, the skeleton 141_3, and a skeleton 141_4 as structural units. The skeleton 141_1 and the skeleton 141_2 are bonded or polymerized to each other through the skeleton 141_3.

The skeleton 141_4 may be a light-emitting skeleton, and the light-emitting skeleton is preferably a skeleton capable of emitting phosphorescence (hereinafter also referred to as a phosphorescent skeleton). A structure in which a phosphorescent skeleton is used as the skeleton 141_4 will be described below. Note that the skeleton 141_4 may be rephrased as the phosphorescent skeleton.

The skeleton 141_4 has a function similar to that of the guest material 142. Thus, this structure example can be described by rephrasing the guest material 142 shown in Structure example 1 as the skeleton 141_4. Thus, Structure example 1 of this embodiment may be referred to for the description of functions similar to those in Structure example 1 of this embodiment.

That is, the high molecular material 141 includes the skeleton having a hole-transport property included in the skeleton 141_1 and the skeleton having an electron-transport property included in the skeleton 141_2, and two high molecular chains form an excited complex. Then, the excitation energy is transferred from the excited complex to the skeleton 141_4, whereby light is emitted from the skeleton 141_4.

<Material that can be Used in Light-Emitting Layers>

Next, materials that can be used in the light-emitting layer 140 will be described below.

The high molecular material 141 in the light-emitting layer 140 is not particularly limited as long as two high molecular chains of the high molecular material 141 have a function of forming an excited complex; however, the high molecular material 141 preferably includes a π-electron deficient heteroaromatic skeleton and at least one of a π-electron rich heteroaromatic skeleton and an aromatic amine skeleton. As the high molecular material 141, any of the materials described in Embodiment 1 can be used.

As the guest material 142 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $Ir(mpptz\text{-}dmp)_3$), tris(5-methyl-3,4-diphenyl-4H-1,2,4-triazolato)iridium(III) (abbreviation: $Ir(Mptz)_3$), tris[4-(3-biphenyl)-5-isopropyl-3-phenyl-4H-1,2,4-triazolato]iridium(III) (abbreviation: $Ir(iPrptz\text{-}3b)_3$), and tris[3-(5-biphenyl)-5-isopropyl-4-phenyl-4H-1,2,4-triazolato]iridium(III) (abbreviation: $Ir(iPr5btz)_3$); organometallic iridium complexes having a 1H-triazole skeleton, such as tris[3-methyl-1-(2-methylphenyl)-5-phenyl-1H-1,2,4-triazolato]iridium(III) (abbreviation: $Ir(Mptz1\text{-}mp)_3$) and tris(1-methyl-5-phenyl-3-propyl-1H-1,2,4-triazolato)iridium(III) (abbreviation: $Ir(Prptz1\text{-}Me)_3$); organometallic iridium complexes having an imidazole skeleton, such as fac-tris[1-(2,6-diisopropylphenyl)-2-phenyl-1H-imidazole]iridium(III) (abbreviation: $Ir(iPrpmi)_3$) and tris[3-(2,6-dimethylphenyl)-7-methylimidazo[1,2-f]phenanthridinato]iridium(III) (abbreviation: $Ir(dmpimpt\text{-}Me)_3$); and organometallic iridium complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III)picolinate (abbreviation: $Ir(CF_3ppy)_2(pic)$), and bis[2-(4',6'-difluorophenyl)pyridinato-N,$C^{2'}$]iridium(III) acetylacetonate (abbreviation: FIr(acac)). Among the materials given above, the organometallic iridium complexes having a 4H-triazole skeleton have high reliability and high light emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: $Ir(mppm)_3$), tris(4-t-butyl-6-phenylpyrimidinato)iridium(III) (abbreviation: $Ir(tBuppm)_3$), (acetylacetonato)bis(6-methyl-4-phenylpyrimidinato)iridium(III) (abbreviation: $Ir(mppm)_2(acac)$), (acetylacetonato)bis(6-tert-butyl-4-phenylpyrimidinato)iridium(III) (abbreviation: $Ir(tBuppm)_2(acac)$), (acetylacetonato)bis[4-(2-norbornyl)-6-phenylpyrimidinato]iridium(III) (abbreviation: $Ir(nbppm)_2(acac)$), (acetylacetonato)bis[5-methyl-6-(2-methylphenyl)-4-phenylpyrimidinato]iridium(III) (abbreviation: $Ir(mpmppm)_2(acac)$), (acetylacetonato)bis{4,6-dimethyl-2-[6-(2,6-dimethylphenyl)-4-pyrimidinyl-κN3]phenyl-κC}iridium(III) (abbreviation: $Ir(dmppm\text{-}dmp)_2(acac)$), (acetylacetonato)bis(4,6-diphenylpyrimidinato)iridium(III) (abbreviation: $Ir(dppm)_2(acac)$); organometallic iridium complexes having a pyrazine skeleton, such as (acetylacetonato)bis(3,5-dimethyl-2-phenylpyrazinato)iridium(III) (abbreviation: $Ir(mppr\text{-}Me)_2(acac)$) and (acetylacetonato)bis(5-isopropyl-3-methyl-2-phenylpyrazinato)iridium(III) (abbreviation: $Ir(mppr\text{-}iPr)_2(acac)$); organometallic iridium complexes having a pyridine skeleton, such as tris(2-phenylpyridinato-N,$C^{2'}$)iridium(III) (abbreviation: $Ir(ppy)_3$), bis(2-phenylpyridinato-N,$C^{2'}$)iridium(III) acetylacetonate (abbreviation: $Ir(ppy)_2(acac)$), bis(benzo[h]quinolinato) iridium(III) acetylacetonate (abbreviation: $Ir(bzq)_2(acac)$), tris(benzo[h]quinolinato)iridium(III) (abbreviation: $Ir(bzq)_3$), tris(2-phenylquinolinato-N,$C^{2'}$)iridium(III) (abbreviation: $Ir(pq)_3$), and bis(2-phenylquinolinato-N,$C^{2'}$) iridium(III) acetylacetonate (abbreviation: $Ir(pq)_2(acac)$); organometallic iridium complexes such as bis(2,4-diphenyl-1,3-oxazolato-N,$C^{2'}$)iridium(III)acetylacetonate (abbreviation: $Ir(dpo)_2(acac)$), bis{2-[4'-(perfluorophenyl)phenyl] pyridinato-N,$C^{2'}$}iridium(III)acetylacetonate (abbreviation: $Ir(p\text{-}PF\text{-}ph)_2(acac)$), and bis(2-phenylbenzothiazolato-N,$C^{2'}$)iridium(III)acetylacetonate (abbreviation: $Ir(bt)_2(acac)$); and a rare earth metal complex such as tris(acetylacetonato) (monophenanthroline)terbium(III) (abbreviation: $Tb(acac)_3(Phen)$). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: $Ir(5mdppm)_2(dibm)$), bis [4,6-bis(3-methylphenyl)pyrimidinato](dipivaloylmethanato)iridium(III) (abbreviation: $Ir(5mdppm)_2(dpm)$), and bis[4,6-di(naphthalen-1-yl)pyrimidinato](dipivaloylmethanato)iridium(III) (abbreviation: $Ir(d1npm)_2(dpm)$); organometallic iridium complexes having a pyrazine skeleton, such as (acetylacetonato)bis(2,3,5-triphenylpyrazinato)iridium (III) (abbreviation: $Ir(tppr)_2(acac)$), bis(2,3,5-triphenylpyrazinato) (dipivaloylmethanato)iridium(III) (abbreviation: $Ir(tppr)_2(dpm)$), and (acetylacetonato)bis[2,3-bis(4-fluorophenyl)quinoxalinato]iridium(III) (abbreviation: $Ir(Fdpq)_2(acac)$); organometallic iridium complexes having a pyridine skeleton, such as tris(1-phenylisoquinolinato-N,$C^{2'}$)iridium(III) (abbreviation: $Ir(piq)_3$) and bis(1-phenylisoquinolinato-N,$C^{2'}$)iridium(III)acetylacetonate (abbreviation: $Ir(piq)_2(acac)$); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: $Eu(DBM)_3(Phen)$) and tris [1-(2-thenoyl)-3,3,3-trifluoroacetonato](monophenanthroline)europium(III) (abbreviation: $Eu(TTA)_3(Phen)$). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity.

As the light-emitting material included in the light-emitting layer 140, any material can be used as long as the material can convert the triplet excitation energy into light emission. As an example of the material that can convert the triplet excitation energy into light emission, a thermally activated delayed fluorescent (TADF) material can be given in addition to a phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the material exhibiting thermally activated delayed fluorescence is formed of one kind of material, any of the thermally activated delayed fluorescent materials described in Embodiment 1 can be specifically used.

The guest material 142 may be a high molecular compound, and for example, a high molecular compound including an iridium-, rhodium-, or platinum-based organometallic complex or metal complex as a structural unit is preferable.

In the light-emitting layer 140, the skeleton 141_4 is not particularly limited; however, a light-emitting skeleton which is included in the guest material 142 is preferably included in the skeleton 141_4. That is, a structure where one or two hydrogen atoms are removed from the iridium-, rhodium-, or platinum-based organometallic complex or metal complex is preferably used as the structural unit.

The light-emitting layer 140 can have a structure in which two or more layers are stacked. For example, in the case where the light-emitting layer 140 is formed by stacking a first light-emitting layer and a second light-emitting layer in this order from the hole-transport layer side, the first light-emitting layer is formed using a substance having a hole-transport property as the high molecular material and the second light-emitting layer is formed using a substance having an electron-transport property as the high molecular material.

The light-emitting layer 140 may include another material in addition to the high molecular material 141 and the guest material 142. Specifically, any of the materials described in Embodiment 1 can be used.

Note that the light-emitting layer 140 can be formed by an evaporation method (including a vacuum evaporation method), an inkjet method, a coating method, a nozzle-printing method, gravure printing, or the like. Besides the above-mentioned materials, an inorganic compound such as a quantum dot or a high molecular compound (e.g., an oligomer, a dendrimer, and a polymer) may be used.

The structure described in this embodiment can be used in appropriate combination with any of the structures described in the other embodiments.

Embodiment 3

In this embodiment, examples of light-emitting elements having structures different from those described in Embodiments 1 and 2 are described below with reference to FIGS. 5A and 5B, FIGS. 6A and 6B, FIGS. 7A to 7C, and FIGS. 8A and 8B.

Structure Example 1 of Light-Emitting Element

Figure 5A:
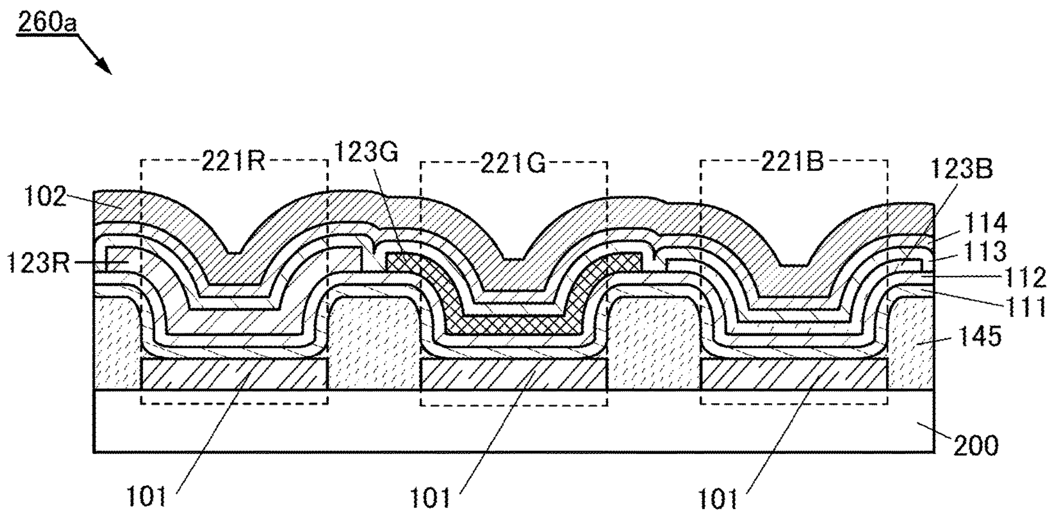
FIGS. 5A and 5B are each a schematic cross-sectional view of a light-emitting element of one embodiment of the present invention.
Figure 5B:
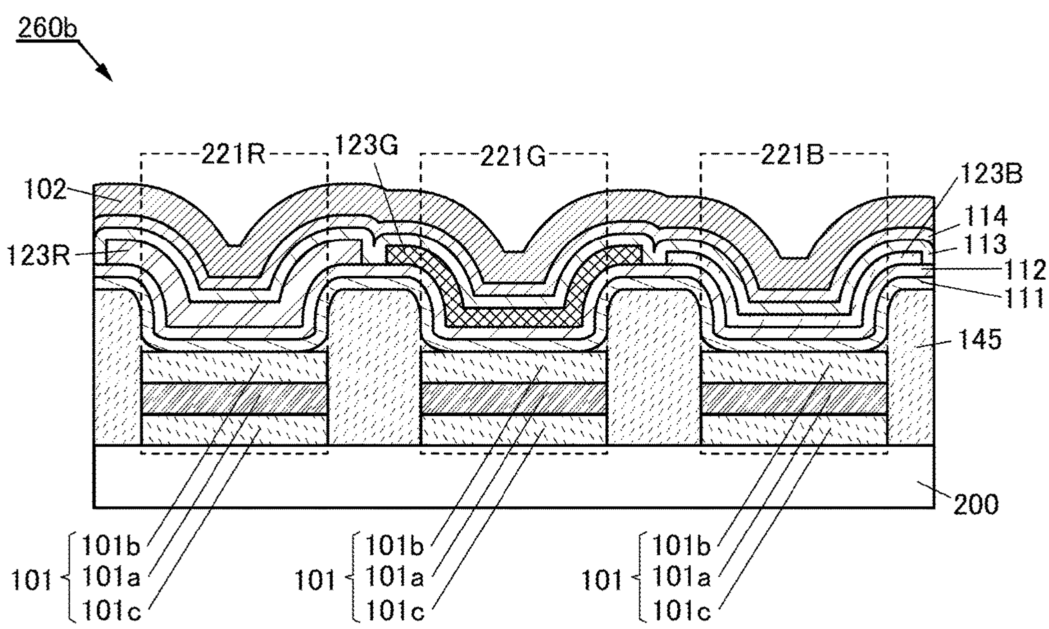

FIGS. 5A and 5B are cross-sectional views each illustrating a light-emitting element of one embodiment of the present invention. In FIGS. 5A and 5B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Light-emitting elements 260*a* and 260*b* in FIGS. 5A and 5B may have a bottom-emission structure in which light is extracted through the substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260*a* and 260*b* each have a bottom emission structure, the electrode 101 preferably has a function of transmitting light and the electrode 102 preferably has a function of reflecting light. Alternatively, in the case where the light-emitting elements 260*a* and 260*b* each have a top emission structure, the electrode 101 preferably has a function of reflecting light and the electrode 102 preferably has a function of transmitting light.

The light-emitting elements 260*a* and 260*b* each include the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 113, and the electron-injection layer 114 are also provided.

The light-emitting element 260*b* includes, as part of the electrode 101, a conductive layer 101*a*, a conductive layer 101*b* over the conductive layer 101*a*, and a conductive layer 101*c* under the conductive layer 101*a*. In other words, the light-emitting element 260*b* includes the electrode 101 having a structure in which the conductive layer 101*a* is sandwiched between the conductive layer 101*b* and the conductive layer 101*c*.

In the light-emitting element 260*b*, the conductive layer 101*b* and the conductive layer 101*c* may be formed with different materials or the same material. The electrode 101 preferably has a structure in which the conductive layer 101*a* is sandwiched by the layers formed of the same conductive material, in which case patterning by etching can be performed easily.

In the light-emitting element 260*b*, the electrode 101 may include one of the conductive layer 101*b* and the conductive layer 101*c*.

For each of the conductive layers 101*a*, 101*b*, and 101*c*, which are included in the electrode 101, the structure and materials of the electrode 101 or 102 described in Embodiment 1 can be used.

In FIGS. 5A and 5B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 260*a* or 260*b* having such a structure is used in a pixel of a display device, whereby a full-color display device can be fabricated. The thicknesses of the light-emitting layers may be the same or different.

Any one or more of the light-emitting layers 123B, 123G, and 123R preferably include at least one of the light-emitting layer 130 described in Embodiment 1 and the light-emitting layer 140 described in Embodiment 2, in which case a light-emitting element with high light emission efficiency can be fabricated.

One or more of the light-emitting layers 123B, 123G, and 123R may include two or more stacked layers.

When at least one light-emitting layer includes the light-emitting layer described in Embodiment 1 or 2 as described above and the light-emitting element 260*a* or 260*b* including the light-emitting layer is used in pixels in a display device, a display device with high light emission efficiency can be fabricated. The display device including the light-emitting element 260*a* or 260*b* can thus have reduced power consumption.

By providing an optical element (e.g., a color filter, a polarizing plate, and an anti-reflection film) on the light extraction side of the electrode through which light is extracted, the color purity of each of the light-emitting elements 260*a* and 260*b* can be improved. Therefore, the color purity of a display device including the light-emitting element 260*a* or 260*b* can be improved. Alternatively, the reflection of external light by each of the light-emitting elements 260*a* and 260*b* can be reduced. Therefore, the contrast ratio of a display device including the light-emitting element 260*a* or 260*b* can be improved.

For the other components of the light-emitting elements 260*a* and 260*b*, the components of the light-emitting elements in Embodiments 1 and 2 may be referred to.

Structure Example 2 of Light-Emitting Element

Next, structure examples of the light-emitting elements different from those in FIGS. 5A and 5B will be described below with reference to FIGS. 6A and 6B.

Figure 6A:
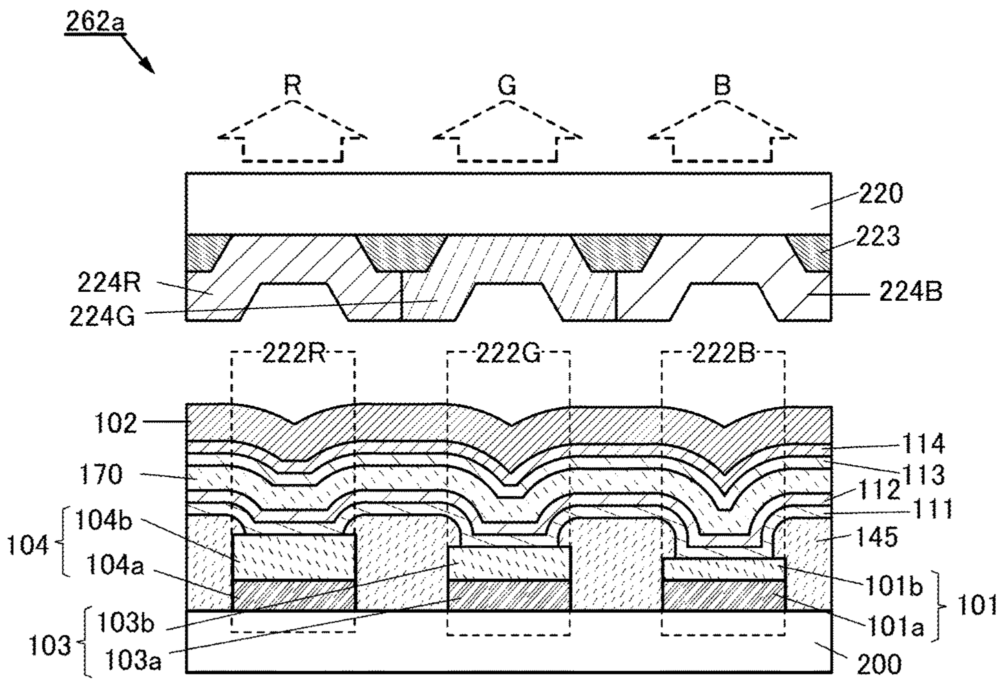
FIGS. 6A and 6B are each a schematic cross-sectional view of a light-emitting element of one embodiment of the present invention.
Figure 6B:
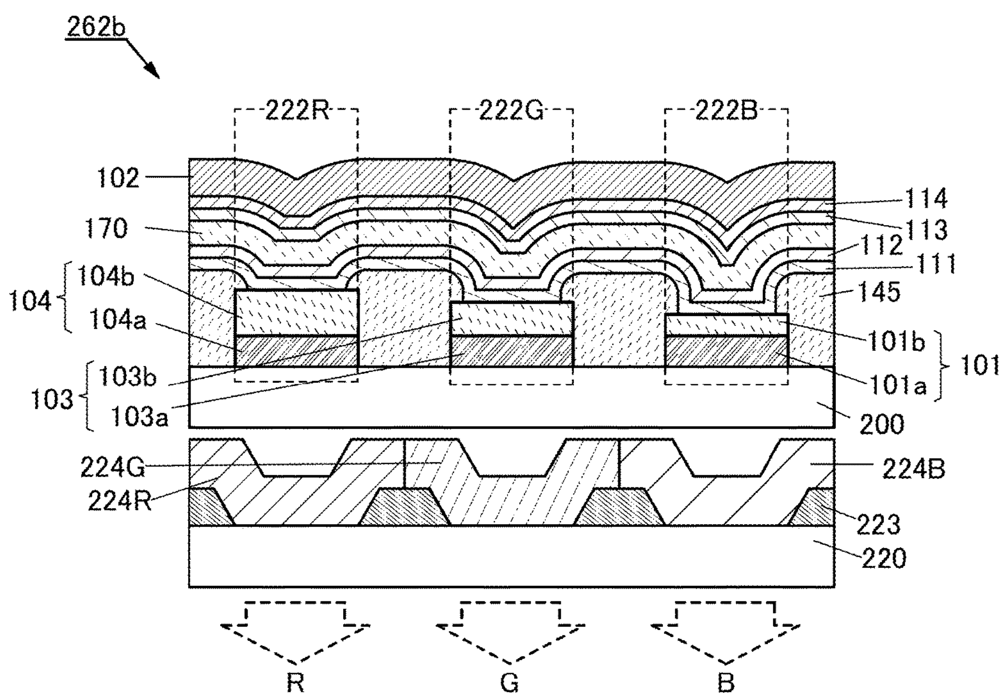

FIGS. 6A and 6B are cross-sectional views of a light-emitting element of one embodiment of the present invention. In FIGS. 6A and 6B, a portion having a function similar to that in FIGS. 5A and 5B is represented by the same hatch pattern as in FIGS. 5A and 5B and not especially denoted by a reference numeral in some cases. In addition, common reference numerals are used for portions having similar functions, and a detailed description of such portions is not repeated in some cases.

FIGS. 6A and 6B illustrate structure examples of a light-emitting element including the light-emitting layer between a pair of electrodes. A light-emitting element 262*a* illustrated in FIG. 6A has a top-emission structure in which light is extracted in a direction opposite to the substrate 200, and a light-emitting element 262*b* illustrated in FIG. 6B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262*a* and 262*b* each include the electrode 101, the electrode 102, an electrode 103, and an electrode 104 over the substrate 200. At least a light-emitting layer 170 is provided between the electrode 101 and the electrode 102, between the electrode 102 and the electrode 103, and between the electrode 102 and the electrode 104. The hole-injection layer 111, the hole-transport layer 112, the electron-transport layer 113, and the electron-injection layer 114 are further provided.

The electrode 101 includes a conductive layer 101*a* and a conductive layer 101*b* over and in contact with the conductive layer 101*a*. The electrode 103 includes a conductive layer 103*a* and a conductive layer 103*b* over and in contact with the conductive layer 103*a*. The electrode 104 includes a conductive layer 104*a* and a conductive layer 104*b* over and in contact with the conductive layer 104*a*.

The light-emitting element 262*a* illustrated in FIG. 6A and the light-emitting element 262*b* illustrated in FIG. 6B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be separated into island shapes.

The light-emitting elements 262*a* and 262*b* each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot type can increase color reproducibility of the display device.

One or more of optical elements may further be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 6A and 6B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

For the substrate 200 and the substrate 220 provided with the optical elements, the substrate in Embodiment 1 may be referred to.

Furthermore, the light-emitting elements 262*a* and 262*b* have a microcavity structure.

<<Microcavity Structure>>

Light emitted from the light-emitting layer 170 resonates between a pair of electrodes (e.g., the electrode 101 and the electrode 102). The light-emitting layer 170 is formed at such a position as to intensify the light of a desired wavelength among light to be emitted. For example, by adjusting the optical length from a reflective region of the electrode 101 to the light-emitting region of the light-emitting layer 170 and the optical length from a reflective region of the electrode 102 to the light-emitting region of the light-emitting layer 170, the light of a desired wavelength among light emitted from the light-emitting layer 170 can be intensified.

In each of the light-emitting elements 262*a* and 262*b*, by adjusting the thicknesses of the conductive layers (the conductive layer 101*b*, the conductive layer 103*b*, and the conductive layer 104*b*) in each region, the light of a desired wavelength among light emitted from the light-emitting layer 170 can be increased. Note that the thickness of at least one of the hole-injection layer 111 and the hole-transport layer 112 may differ between the regions to increase the light emitted from the light-emitting layer 170.

For example, in the case where the refractive index of the conductive material having a function of reflecting light in the electrodes 101 to 104 is lower than the refractive index of the light-emitting layer 170, the thickness of the conductive layer 101*b* of the electrode 101 is adjusted so that the optical length between the electrode 101 and the electrode 102 is $m_B\lambda_B/2$ ($m_B$ is a natural number and $\lambda_B$ is the wavelength of light intensified in the region 222B). Similarly, the thickness of the conductive layer 103*b* of the electrode 103 is adjusted so that the optical length between the electrode 103 and the electrode 102 is $m_G\lambda_G/2$ ($m_G$ is a natural number and $\lambda_G$ is the wavelength of light intensified in the region 222G). Furthermore, the thickness of the conductive layer 104*b* of the electrode 104 is adjusted so that the optical length between the electrode 104 and the electrode 102 is $m_R\lambda_R/2$ ($m_R$ is a natural number and $\lambda_R$ is the wavelength of light intensified in the region 222R).

In the case where it is difficult to precisely determine the reflective regions of the electrodes 101 to 104, the optical length for intensifying light emitted from the light-emitting layer 170 may be derived on the assumption that certain regions of the electrodes 101 to 104 are the reflective regions. In the case where it is difficult to precisely determine the light-emitting region of the light-emitting layer 170, the optical length for intensifying light emitted from the light-emitting layer 170 may be derived on the assumption that certain region of the light-emitting layer 170 is the light-emitting region.

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive layers 101*b*, 103*b*, and 104*b* preferably have a function of transmitting light. The materials of the conductive layers 101*b*, 103*b*, and 104*b* may be the same or different. The conductive layers 101*b*, 103*b*, and 104*b* are preferably formed using the same materials, in which case patterning by etching can be performed easily. Each of the conductive layers 101*b*, 103*b*, and 104*b* may have a stacked structure of two or more layers.

Since the light-emitting element 262*a* illustrated in FIG. 6A has a top-emission structure, it is preferable that the conductive layer 101*a*, the conductive layer 103*a*, and the conductive layer 104*a* have a function of reflecting light. In addition, it is preferable that the electrode 102 have functions of transmitting light and reflecting light.

Since the light-emitting element 262*b* illustrated in FIG. 6B has a bottom-emission structure, it is preferable that the conductive layer 101*a*, the conductive layer 103*a*, and the conductive layer 104*a* have functions of transmitting light and reflecting light. In addition, it is preferable that the electrode 102 have a function of reflecting light.

In each of the light-emitting elements 262*a* and 262*b*, the conductive layers 101*a*, 103*a*, and 104*a* may be formed of different materials or the same material. When the conductive layers 101*a*, 103*a*, and 104*a* are formed of the same material, manufacturing cost of the light-emitting elements 262*a* and 262*b* can be reduced. Note that each of the conductive layers 101*a*, 103*a*, and 104*a* may have a stacked structure including two or more layers.

The light-emitting layer 170 in the light-emitting elements 262*a* and 262*b* preferably has the structure described in Embodiment 1 or 2, in which case light-emitting elements with high light emission efficiency can be fabricated.

The light-emitting layer 170 may have a stacked structure of two layers. The two light-emitting layers including two kinds of light-emitting materials (a first compound and a second compound) for emitting different colors of light enable light emission of a plurality of colors. It is particularly preferable to select the light-emitting materials of the light-emitting layers so that white light can be obtained by combining light emissions from the light-emitting layer 170.

The light-emitting layer 170 may have a stacked structure of three or more layers, in which a layer not including a light-emitting material may be included.

In the above-described manner, the light-emitting element 262*a* or 262*b* including at least one of the light-emitting layers which have the structures described in Embodiments 1 and 2 is used in pixels in a display device, whereby a display device with high light emission efficiency can be fabricated. Accordingly, the display device including the light-emitting element 262*a* or 262*b* can have low power consumption.

For the other components of the light-emitting elements 262*a* and 262*b*, the components of the light-emitting elements 260*a* and 260*b* and the light-emitting elements in Embodiments 1 and 2 may be referred to.

<Fabrication Method of Light-Emitting Element>

Next, a method for fabricating a light-emitting element of one embodiment of the present invention is described below with reference to FIGS. 7A to 7C and FIGS. 8A and 8B. Here, a method for fabricating the light-emitting element 262*a* illustrated in FIG. 6A is described.

FIGS. 7A to 7C and FIGS. 8A and 8B are cross-sectional views illustrating a method for fabricating the light-emitting element of one embodiment of the present invention.

The method for manufacturing the light-emitting element 262*a* described below includes first to sixth steps.

<<First Step>>

Figure 7A:
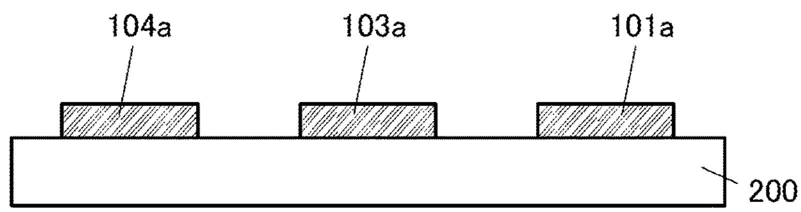
FIGS. 7A to 7C are schematic cross-sectional views illustrating a method for manufacturing a light-emitting element of one embodiment of the present invention.

In the first step, the electrodes (specifically the conductive layer 101*a* of the electrode 101, the conductive layer 103*a* of the electrode 103, and the conductive layer 104*a* of the electrode 104) of the light-emitting elements are formed over the substrate 200 (see FIG. 7A).

In this embodiment, a conductive layer having a function of reflecting light is formed over the substrate 200 and processed into a desired shape; whereby the conductive layers 101*a*, 103*a*, and 104*a* are formed. As the conductive layer having a function of reflecting light, an alloy film of silver, palladium, and copper (also referred to as an Ag—Pd—Cu film or APC) is used. The conductive layers 101*a*, 103*a*, and 104*a* are preferably formed through a step of processing the same conductive layer, because the manufacturing cost can be reduced.

Note that a plurality of transistors may be formed over the substrate 200 before the first step. The plurality of transistors may be electrically connected to the conductive layers 101*a*, 103*a*, and 104*a*.

<<Second Step>>

Figure 7B:
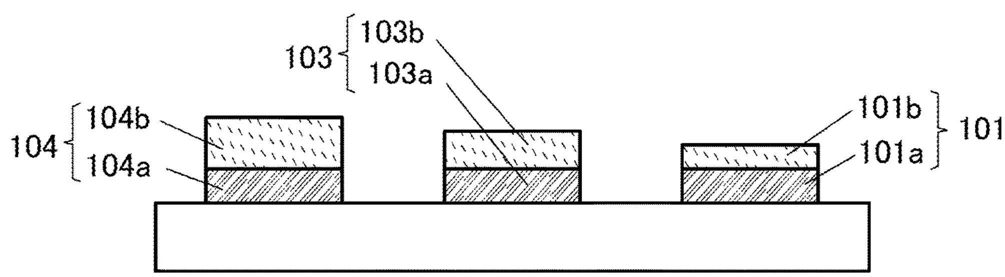

In the second step, the conductive layer 101*b* having a function of transmitting light is formed over the conductive layer 101*a* of the electrode 101, the conductive layer 103*b* having a function of transmitting light is formed over the conductive layer 103*a* of the electrode 103, and the conductive layer 104*b* having a function of transmitting light is formed over the conductive layer 104*a* of the electrode 104 (see FIG. 7B).

In this embodiment, the conductive layers 101*b*, 103*b*, and 104*b* each having a function of transmitting light are formed over the conductive layers 101*a*, 103*a*, and 104*a* each having a function of reflecting light, respectively, whereby the electrode 101, the electrode 103, and the electrode 104 are formed. As the conductive layers 101*b*, 103*b*, and 104*b*, ITSO films are used.

The conductive layers 101*b*, 103*b*, and 104*b* having a function of transmitting light may be formed through a plurality of steps. When the conductive layers 101*b*, 103*b*, and 104*b* having a function of transmitting light are formed through a plurality of steps, they can be formed to have thicknesses which enable microcavity structures appropriate in the respective regions.

<<Third Step>>

Figure 7C:
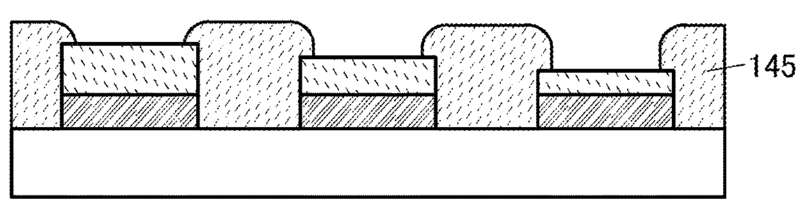

In the third step, the partition wall 145 that covers end portions of the electrodes of the light-emitting element is formed (see FIG. 7C).

The partition wall 145 includes an opening overlapping with the electrode. The conductive film exposed by the opening functions as the anode of the light-emitting element. As the partition wall 145, a polyimide-based resin is used in this embodiment.

In the first to third steps, since there is no possibility of damaging the EL layer (a layer containing an organic compound), a variety of film formation methods and fine processing technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101*a* of the electrode 101, the conductive layer 103*a* of the electrode 103, and the conductive layer 104*a* of the electrode 104. Then, a transparent conductive film is formed by a sputtering method, a pattern is formed over the transparent conductive film by a lithography method, and then the transparent conductive film is processed into island shapes by a wet etching method to form the electrodes 101, 103, and 104.

<<Fourth Step>>

Figure 8A:
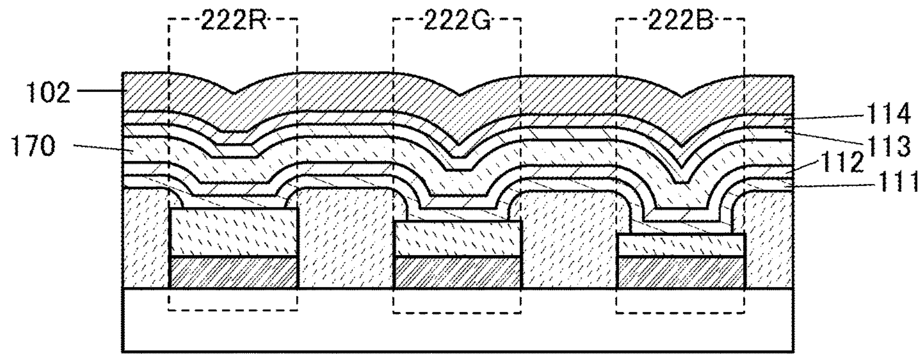
FIGS. 8A and 8B are schematic cross-sectional views illustrating a method for manufacturing a light-emitting element of one embodiment of the present invention.

In the fourth step, the hole-injection layer 111, the hole-transport layer 112, the light-emitting layer 170, the electron-transport layer 113, the electron-injection layer 114, and the electrode 102 are formed (see FIG. 8A).

The hole-injection layer 111 can be formed by spin-coating poly(ethylenedioxythiophene)/poly(styrenesulfonic acid), for example. The hole-transport layer 112 which can be formed using a hole-transport material can be formed by spin-coating polyvinylcarbazole, for example. After the formation of the hole-injection layer 111 and the hole-transport layer 112, heat treatment may be performed under an air atmosphere or an inert gas atmosphere such as nitrogen.

The light-emitting layer 170 can be formed using a high molecular material that emits light of at least one of violet, blue, blue green, green, yellow green, yellow, orange, and red. As the high molecular material, a fluorescent or phosphorescent organic compound can be used. The light-emitting layer 170 can be formed in such a manner that a solvent in which the high molecular material is dissolved is coated using a spin-coating method or the like. After the formation of the light-emitting layer 170, heat treatment may be performed under an air atmosphere or an inert gas atmosphere such as nitrogen. The fluorescent or phosphorescent organic compound may be used as a guest material, and the guest material may be dispersed into a high molecular material having higher excitation energy than the guest material. The light-emitting organic compound may be deposited alone or the light-emitting organic compound mixed with another material may be deposited. The light-emitting layer 170 may have a two-layer structure. In that case, the two light-emitting layers preferably contain light-emitting substances that emit light of different colors.

The electron-transport layer 113 can be formed using a substance having a high electron-transport property. The electron-injection layer 114 can be formed using a substance having a high electron-injection property. Note that the electron-transport layer 113 and the electron-injection layer 114 can be formed by an evaporation method.

The electrode 102 can be formed by stacking a reflective conductive film and a light-transmitting conductive film. The electrode 102 may have a single-layer structure or a stacked-layer structure.

Through the above-described steps, the light-emitting element including the region 222B, the region 222G, and the region 222R over the electrode 101, the electrode 103, and the electrode 104, respectively, are formed over the substrate 200.

<<Fifth Step>>

Figure 8B:
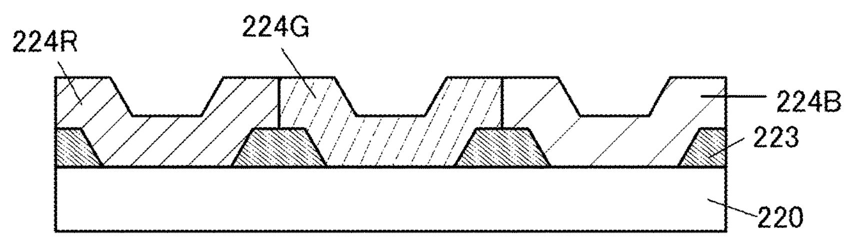

In the fifth step, the light-blocking layer 223, the optical element 224B, the optical element 224G, and the optical element 224R are formed over the substrate 220 (see FIG. 8B).

As the light-blocking layer 223, a resin film containing black pigment is formed in a desired region. Then, the optical element 224B, the optical element 224G, and the optical element 224R are formed over the substrate 220 and the light-blocking layer 223. As the optical element 224B, a resin film containing blue pigment is formed in a desired region. As the optical element 224G, a resin film containing green pigment is formed in a desired region. As the optical element 224R, a resin film containing red pigment is formed in a desired region.

<<Sixth Step>>

In the sixth step, the light-emitting element formed over the substrate 200 is attached to the light-blocking layer 223, the optical element 224B, the optical element 224G, and the optical element 224R formed over the substrate 220, and sealed with a sealant (not illustrated).

Through the above-described steps, the light-emitting element 262*a* illustrated in FIG. 6A can be formed.

Note that the structures described in this embodiment can be used in appropriate combination with any of the structures described in the other embodiments.

Embodiment 4

In this embodiment, a display device of one embodiment of the present invention will be described below with reference to FIGS. 9A and 9B, FIGS. 10A and 10B, FIG. 11, FIGS. 12A and 12B, FIGS. 13A and 13B, FIG. 14, FIGS. 15A and 15B, FIG. 16, FIGS. 17A and 17B, FIGS. 18A to 18D, and FIG. 19.

Structure Example 1 of Display Device

Figure 9A:
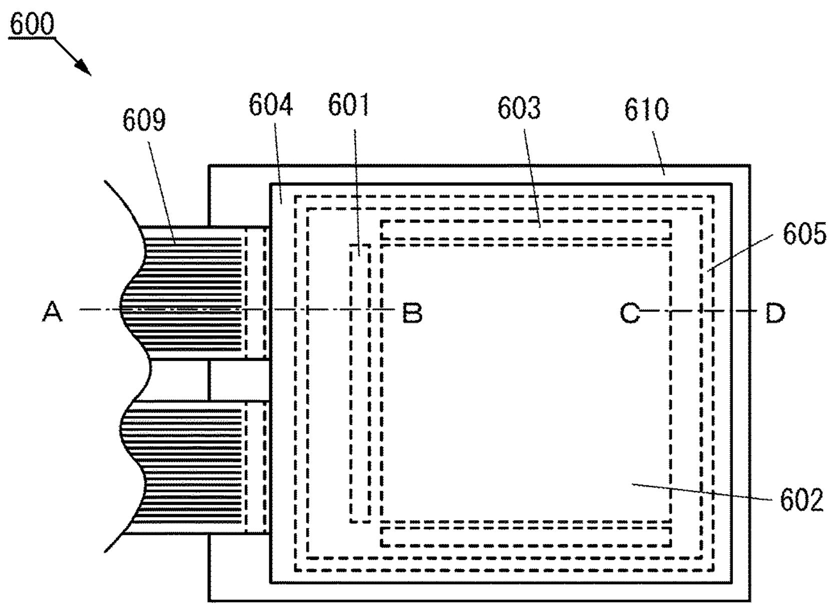
FIGS. 9A and 9B are a top view and a schematic cross-sectional view illustrating a display device of one embodiment of the present invention.
Figure 9B:
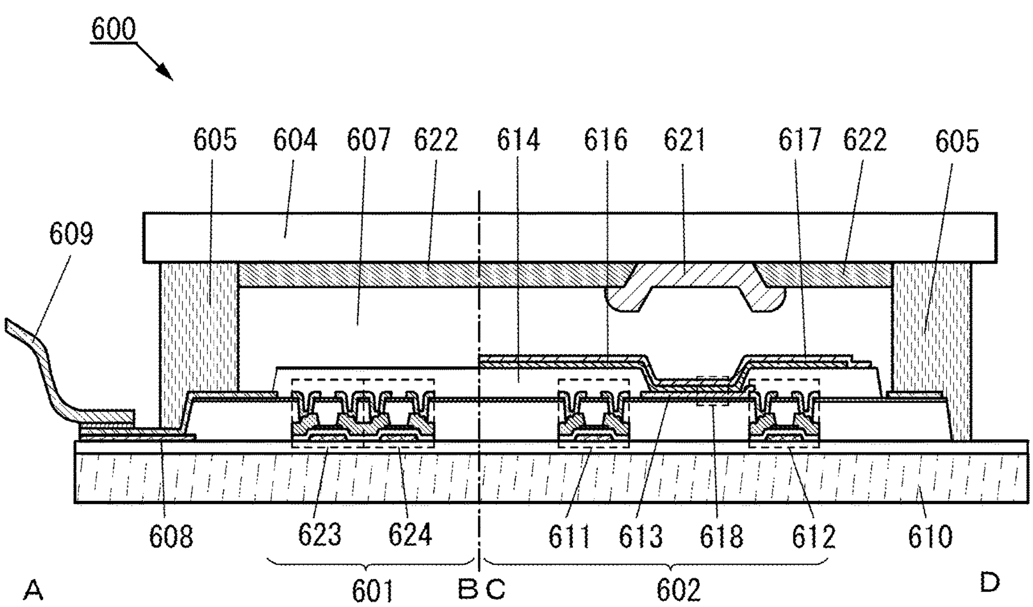

FIG. 9A is a top view illustrating a display device 600 and FIG. 9B is a cross-sectional view taken along the dashed-dotted line A-B and the dashed-dotted line C-D in FIG. 9A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission of a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage by a film which is formed over the partition wall 614, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is Al, Ga, Y, zirconium (Zr), La, cerium (Ce), Sn, hafnium (Hf), or Nd).

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an ink-jet method, or a spin coating method. As another material included in the EL layer 616, a low molecular compound or a high molecular compound may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and the desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

Here, a method for forming the EL layer 616 by a droplet discharge method is described with reference to FIGS. 18A to 18D. FIGS. 18A to 18D are cross-sectional views illustrating the method for forming the EL layer 616.

Figure 18A:
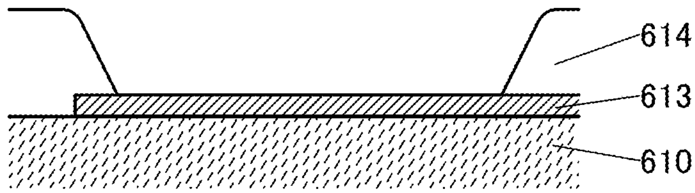
FIGS. 18A to 18D are schematic cross-sectional views illustrating a method for forming an EL layer.
Figure 18B:
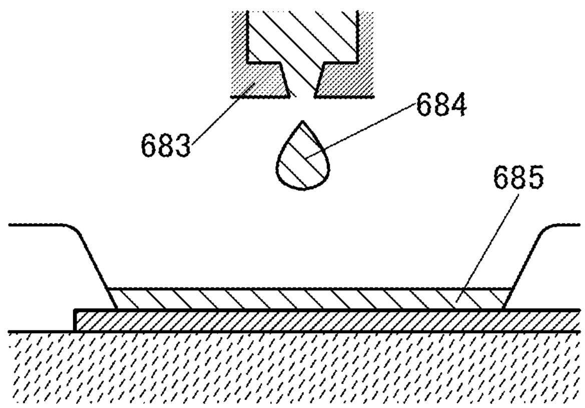

First, the element substrate 610 over which the lower electrode 613 and the partition wall 614 are formed is illustrated in FIG. 18A. However, as in FIG. 9B, the lower electrode 613 and the partition wall 614 may be formed over an insulating film over a substrate.

Next, in a portion where the lower electrode 613 is exposed, which is an opening portion of the partition wall 614, a droplet 684 is discharged from a droplet discharge apparatus 683 to form a layer 685 containing a composition. The droplet 684 is a composition containing a solvent and is attached to the lower electrode 613 (see FIG. 18B).

Note that the method for discharging the droplet 684 may be performed under reduced pressure.

Figure 18C:
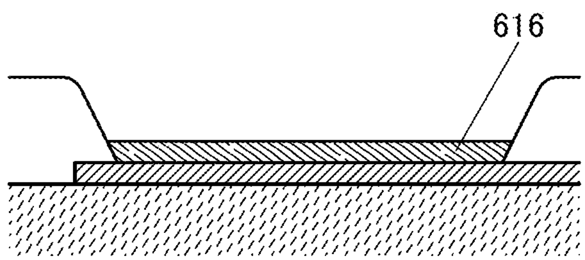

Then, the solvent is removed from the layer 685 containing the composition, and the resulting layer is solidified to form the EL layer 616 (see FIG. 18C).

The solvent may be removed by drying or heating.

Figure 18D:
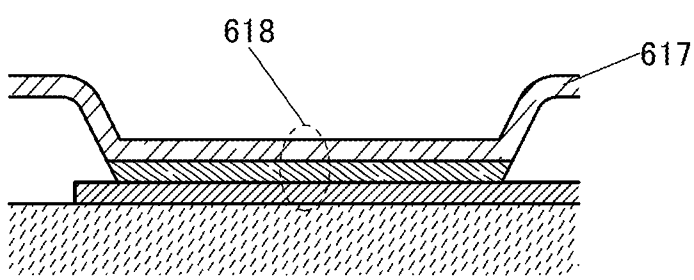

Next, the upper electrode 617 is formed over the EL layer 616, and the light-emitting element 618 is formed (see FIG. 18D).

When the EL layer 616 is formed by a droplet discharge method as described above, the composition can be selectively discharged, and accordingly, loss of materials can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 19:
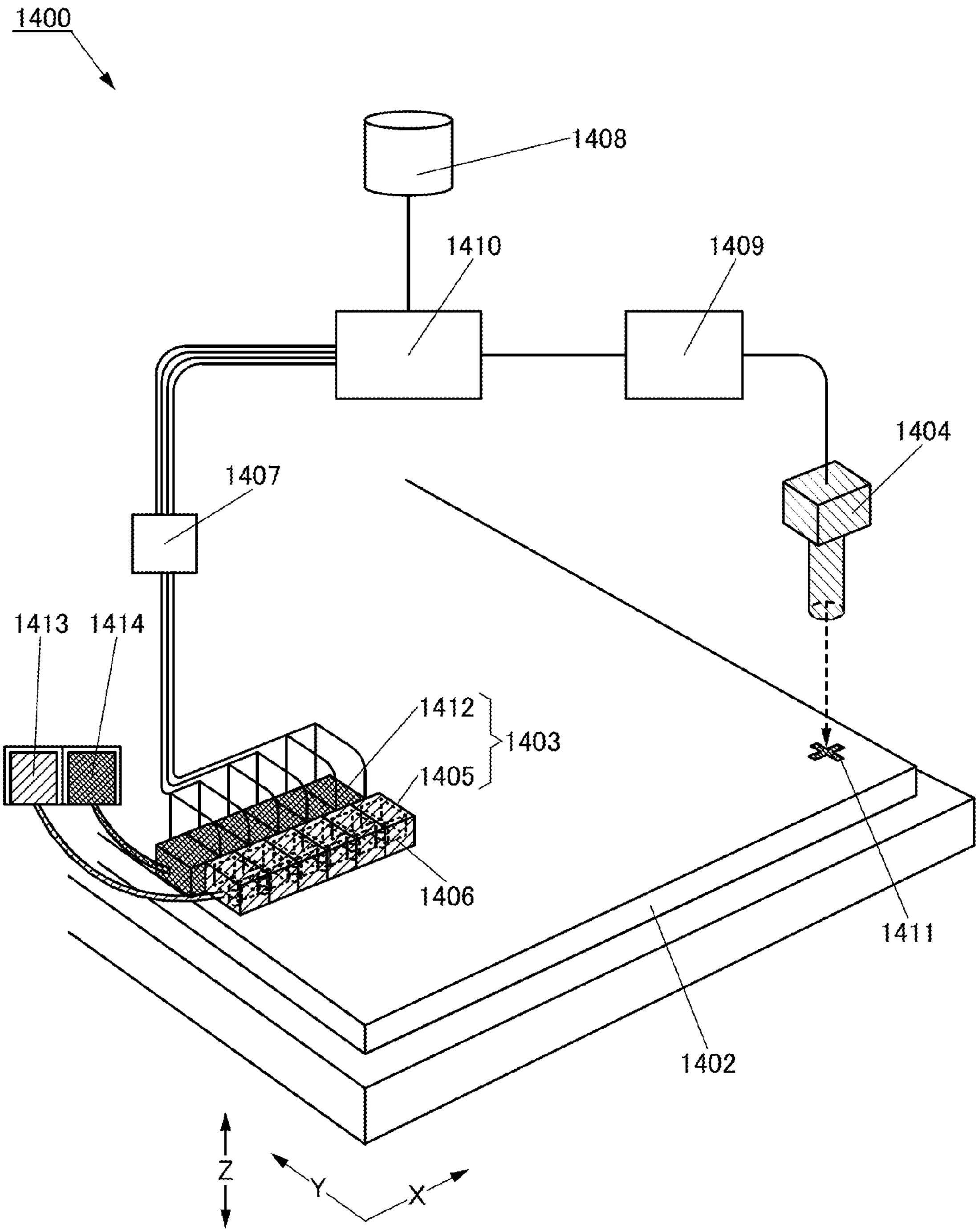
FIG. 19 is a conceptual diagram illustrating a droplet discharge apparatus.

Next, a droplet discharge apparatus used for the droplet discharge method is described with reference to FIG. 19. FIG. 19 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used for the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. A material to be discharged is supplied to the head 1405 and the head 1412 from a material source 1413 and a material source 1414, respectively, through pipes.

Inside the head 1405, a space 1406 filled with a liquid material as indicated by a dotted line and a nozzle serving as a discharge opening are provided. Although not illustrated, an internal structure of the head 1412 is similar to that of the head 1405. When the nozzle sizes of the heads 1405 and 1412 are different from each other, patterns of different materials can be drawn with different widths simultaneously. Alternatively, one head can discharge plural kinds of light-emitting materials or the like and draw a pattern. When a pattern is drawn in a large area, the same material can be simultaneously discharged from a plurality of nozzles and the pattern can be drawn to improve throughput. When a large substrate is used, the heads 1405 and 1412 can freely scan the substrate in directions indicated by arrows X, Y, and Z in FIG. 19, and a region in which a pattern is drawn can be freely set. Thus, a plurality of the same patterns can be drawn over one substrate.

In addition, the step of discharging the composition may be performed under reduced pressure. The substrate may be heated when the composition is discharged. After the composition is discharged, either or both steps of drying and baking are performed. Both the drying and baking steps are heat treatment steps but different in purpose, temperature, and time period. The steps of drying and baking are each performed under normal pressure or reduced pressure, by laser light irradiation, rapid thermal annealing, heating using a heating furnace, or the like. Note that there is no particular limitation on the timing and the number of steps of this heat treatment. The temperature for performing each of the steps of drying and baking in a favorable manner depends on the materials of the substrate and the properties of the composition.

In the above-described manner, the display device including any of the light-emitting elements and the optical elements which are described in Embodiments 1 to 3 can be obtained.

Structure Example 2 of Display Device

Next, another example of the display device is described with reference to FIGS. 10A and 10B and FIG. 11. Note that FIGS. 10A and 10B and FIG. 11 are each a cross-sectional view of a display device of one embodiment of the present invention.

Figure 10A:
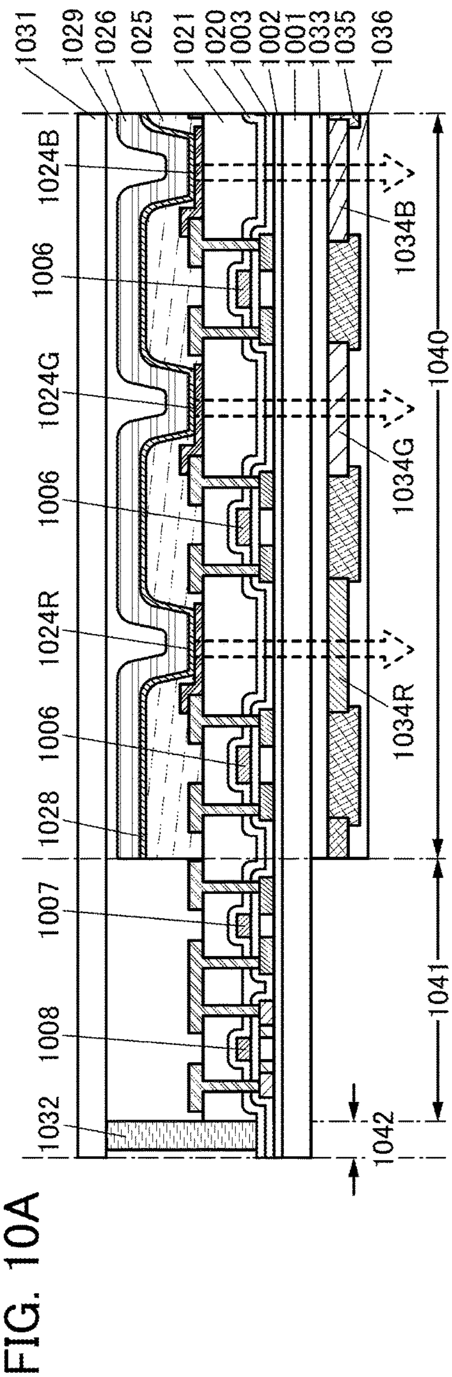
FIGS. 10A and 10B are schematic cross-sectional views each illustrating a display device of one embodiment of the present invention.
Figure 11:
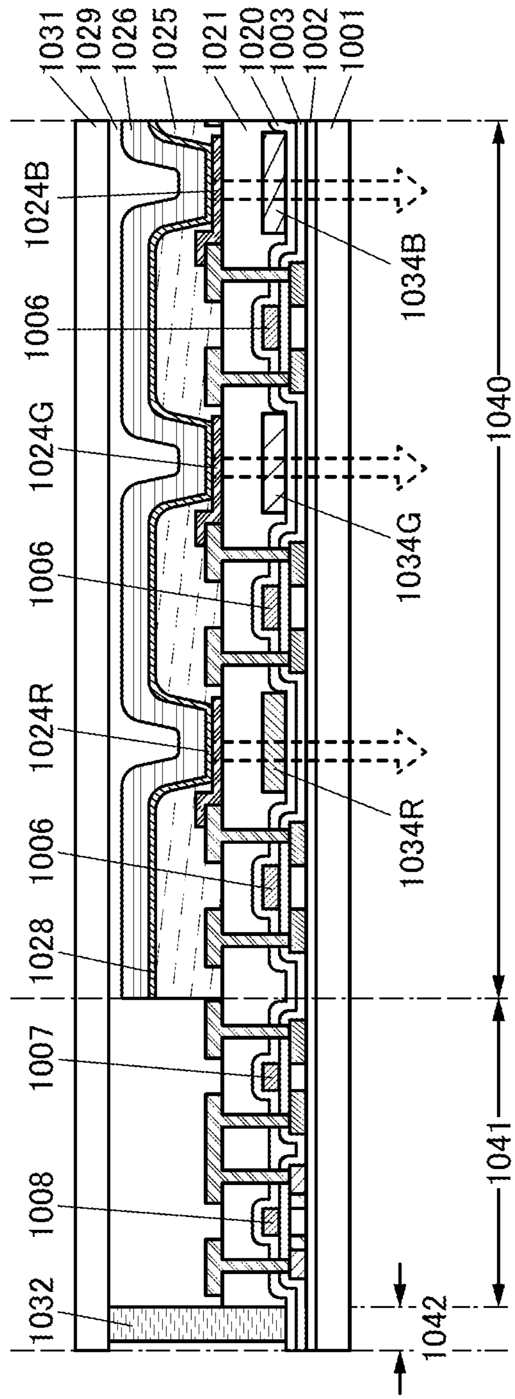
FIG. 11 is a schematic cross-sectional view illustrating a display device of one embodiment of the present invention.

In FIG. 10A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 10A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 10A, red light, green light, and blue light transmit the coloring layers, and thus an image can be displayed with the use of pixels of three colors.

Figure 10B:
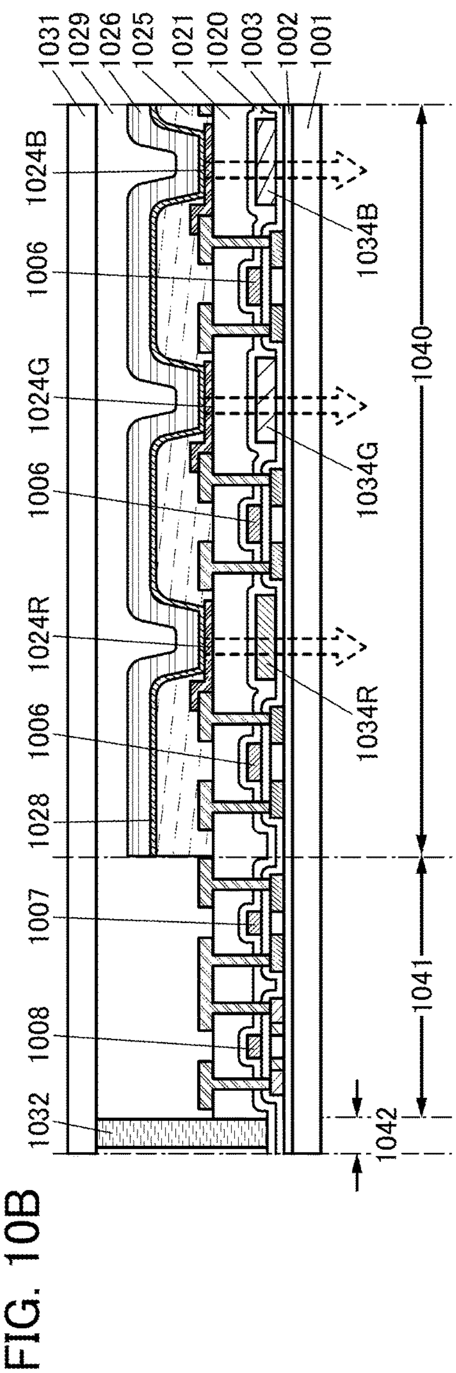

FIG. 10B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 11 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

Structure Example 3 of Display Device

Figure 12A:
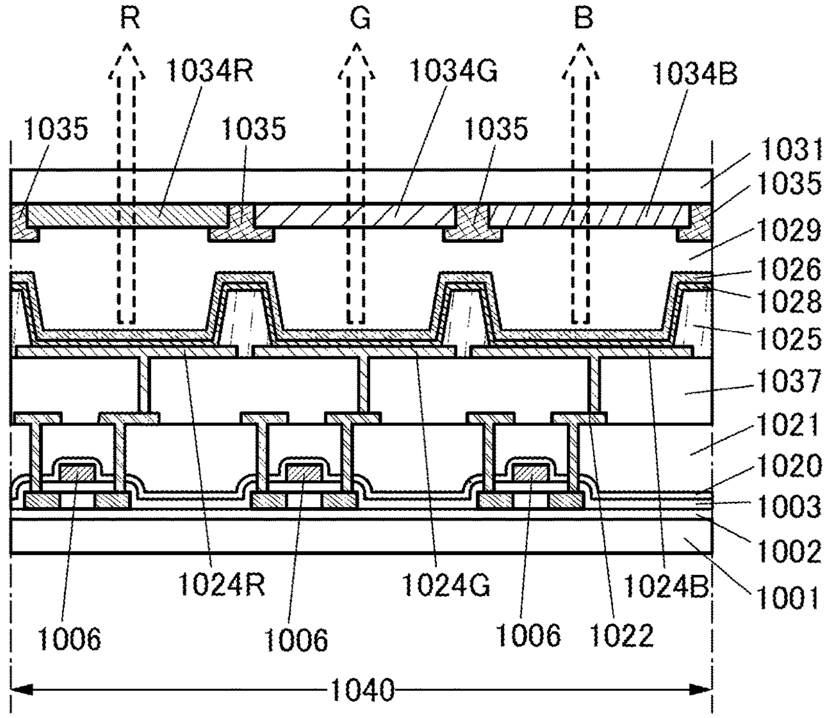
FIGS. 12A and 12B are schematic cross-sectional views each illustrating a display device of one embodiment of the present invention.
Figure 12B:
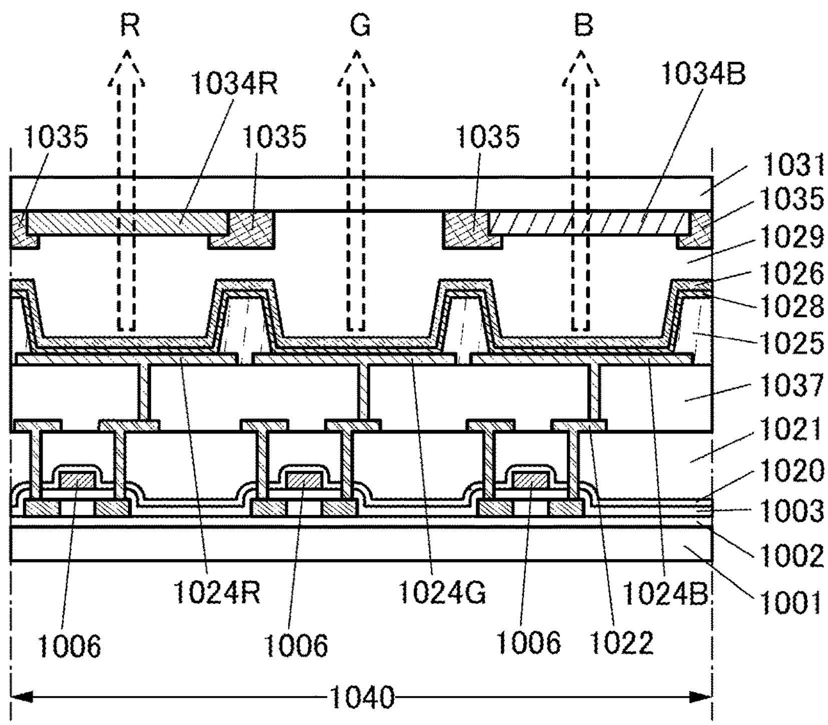

FIGS. 12A and 12B are each an example of a cross-sectional view of a display device having a top emission structure. Note that FIGS. 12A and 12B are each a cross-sectional view illustrating the display device of one embodiment of the present invention, and the driver circuit portion 1041, the peripheral portion 1042, and the like, which are illustrated in FIGS. 10A and 10B and FIG. 11, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed by using a material similar to that of the second interlayer insulating film, or can be formed by using any other known materials.

The lower electrodes 1024R, 1024G, and 1024B of the light-emitting elements each function as an anode here, but may function as a cathode. Further, in the case of a display device having a top-emission structure as illustrated in FIGS. 12A and 12B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 12A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 12A illustrates the structure provided with the light-emitting elements and the coloring layers for the light-emitting elements as an example; however, the structure is not limited thereto. For example, as shown in FIG. 12B, a structure including the red coloring layer 1034R and the blue coloring layer 1034B but not including a green coloring layer may be employed to achieve full color display with the three colors of red, green, and blue. The structure as illustrated in FIG. 12A where the light-emitting elements are provided with the coloring layers is effective to suppress reflection of external light. In contrast, the structure as illustrated in FIG. 12B where the light-emitting elements are provided with the red coloring layer and the blue coloring layer and without the green coloring layer is effective to reduce power consumption because of small energy loss of light emitted from the green light-emitting element.

Structure Example 4 of Display Device

Figure 13A:
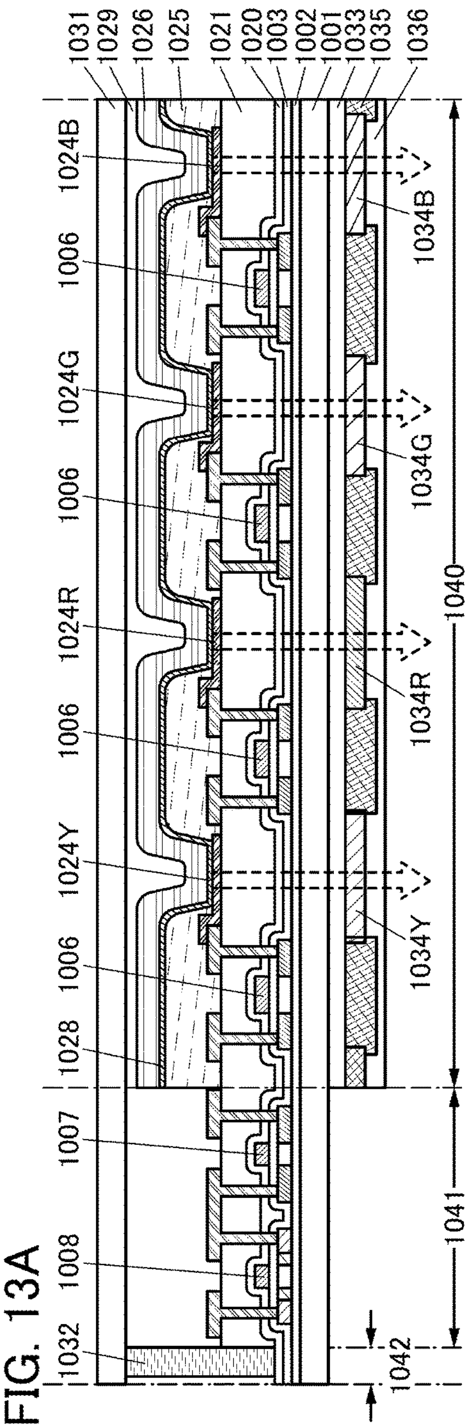
FIGS. 13A and 13B are schematic cross-sectional views each illustrating a display device of one embodiment of the present invention.
Figure 13B:
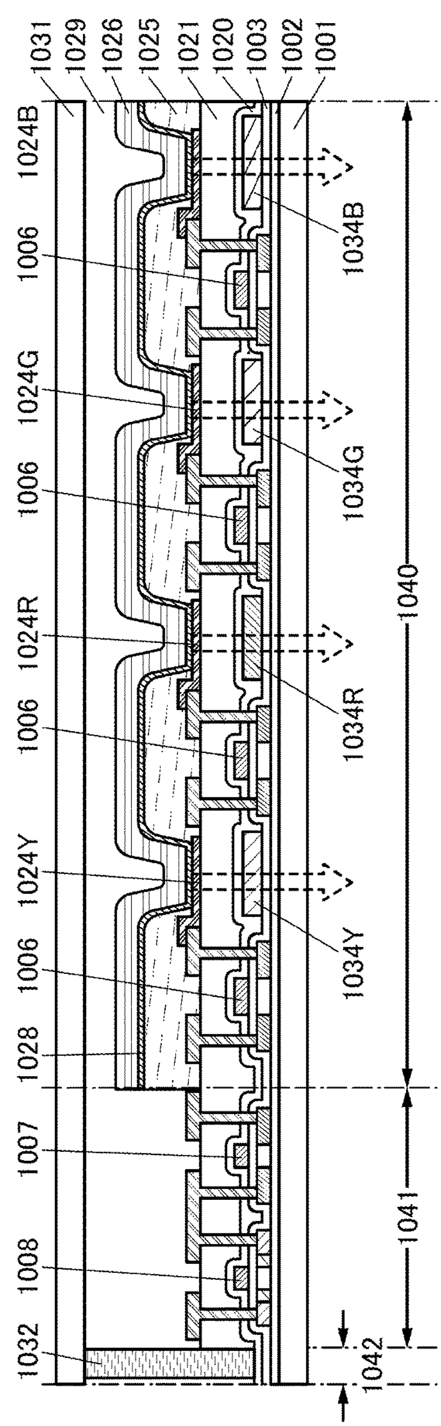
Figure 14:
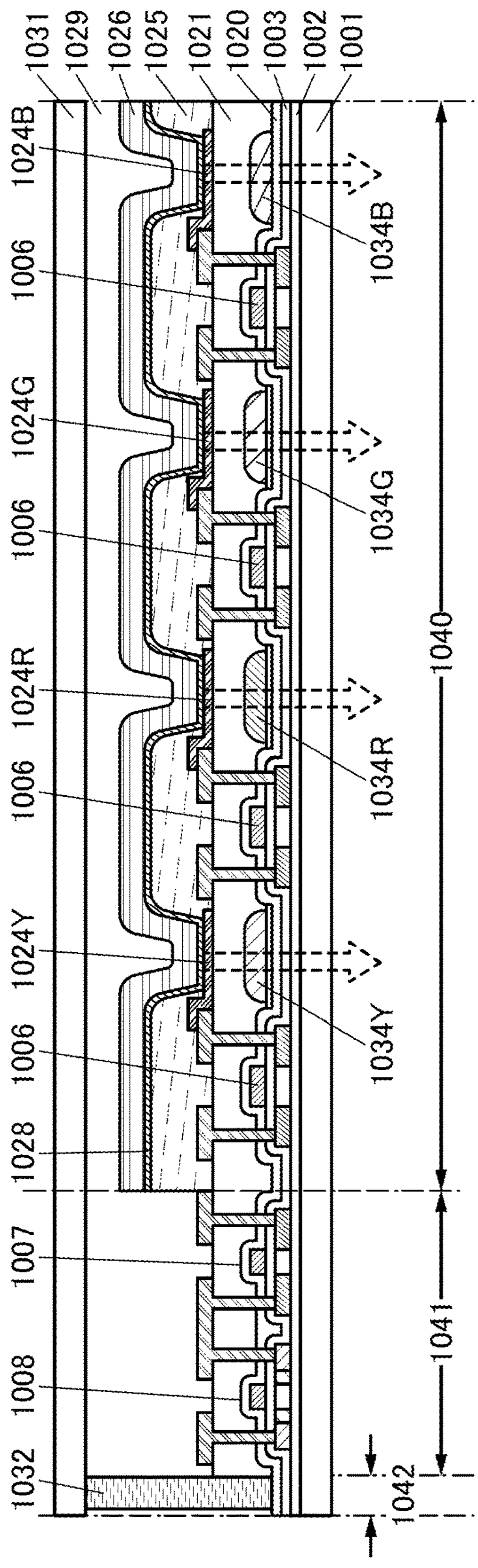
FIG. 14 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 13A and 13B, FIG. 14, and FIGS. 15A and 15B illustrate structures of display devices each including the lower electrodes 1024R, 1024G, 1024B, and 1024Y. FIGS. 13A and 13B and FIG. 14 each illustrate a display device having a structure in which light is extracted from the substrate 1001 side on which transistors are formed (bottom-emission structure), and FIGS. 15A and 15B each illustrate a display device having a structure in which light is extracted from the sealing substrate 1031 side (top-emission structure).

FIG. 13A illustrates an example of a display device in which optical elements (the coloring layer 1034R, the coloring layer 1034G, the coloring layer 1034B, and a coloring layer 1034Y) are provided on the transparent base material 1033. FIG. 13B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 14 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light released from the coloring layer 1034Y may be white light. Since the light-emitting element which transmits yellow or white light has high light emission efficiency, the display device including the coloring layer 1034Y can have lower power consumption.

Figure 15A:
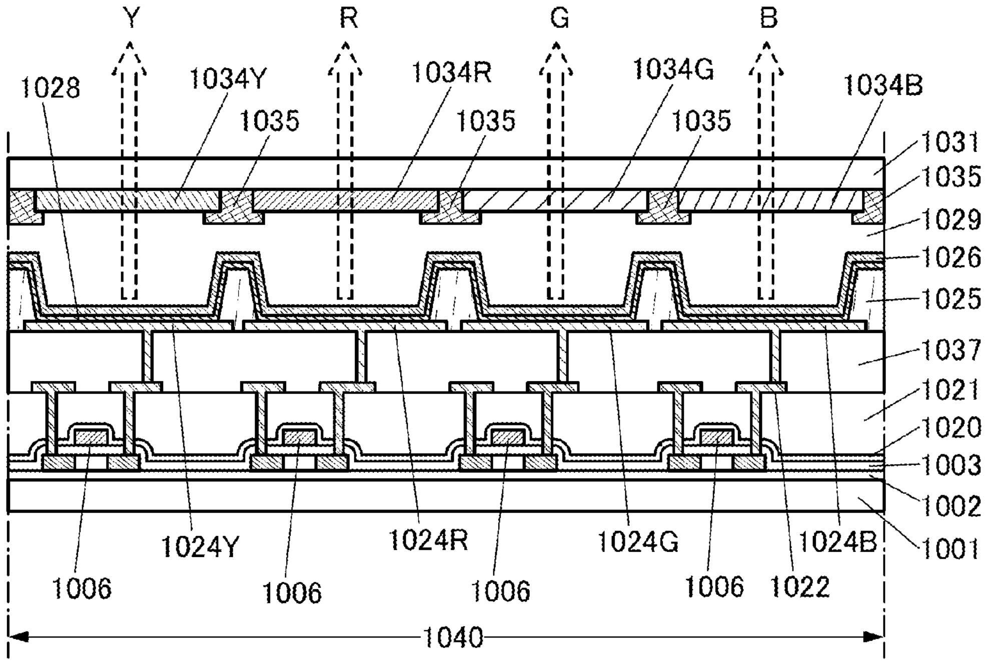
FIGS. 15A and 15B are schematic cross-sectional views each illustrating a display device of one embodiment of the present invention.
Figure 15B:
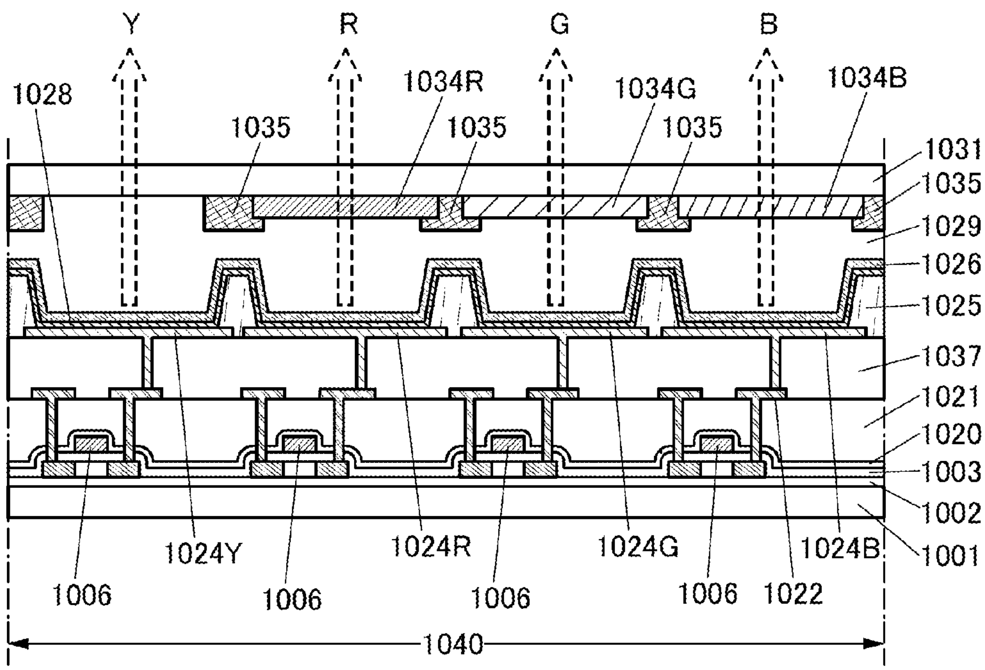

In the top-emission display devices illustrated in FIGS. 15A and 15B, a light-emitting element including the lower electrode 1024Y preferably has a microcavity structure between the upper electrode 1026 and the lower electrodes 1024R, 1024G, 1024B, and 1024Y as in the display device illustrated in FIG. 12A. In the display device illustrated in FIG. 15A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high light emission efficiency. Therefore, the display device of FIG. 15A can reduce power consumption.

FIG. 15A illustrates the structure provided with the light-emitting elements and the coloring layers for the light-emitting elements as an example; however, the structure is not limited thereto. For example, as shown in FIG. 15B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 15A where the light-emitting elements are provided with the coloring layers is effective to suppress reflection of external light. In contrast, the structure as illustrated in FIG. 15B where the light-emitting elements are provided with the red coloring layer, the green coloring layer, and the blue coloring layer and without the yellow coloring layer is effective to reduce power consumption because of small energy loss of light emitted from the yellow or white light-emitting element.

Structure Example 5 of Display Device

Figure 16:
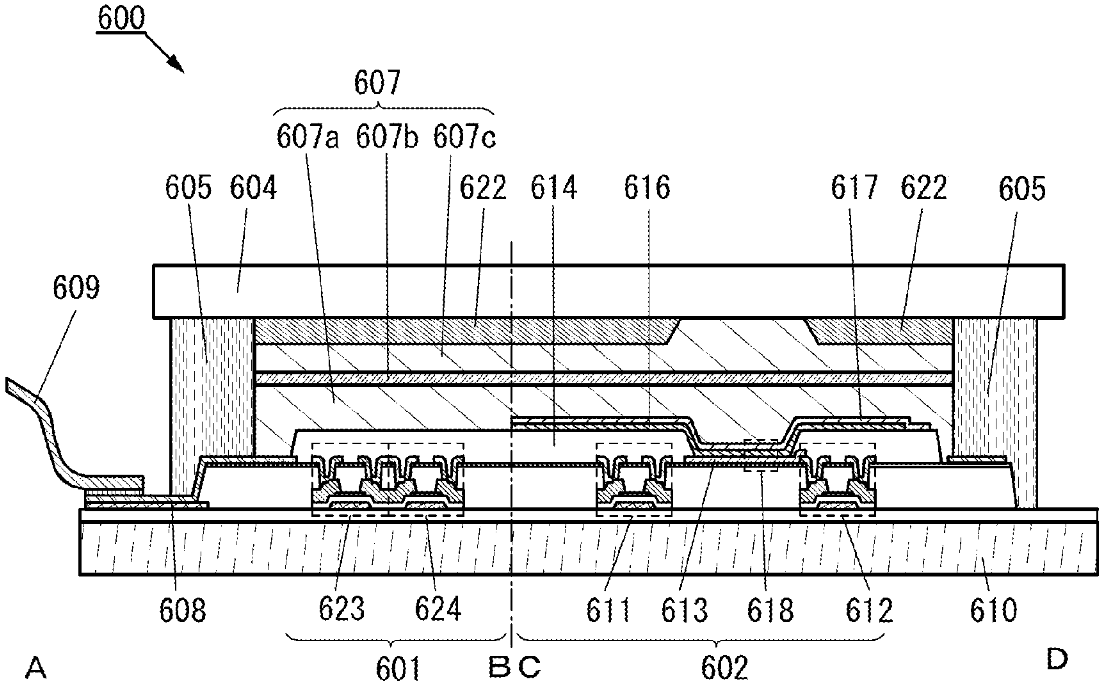
FIG. 16 is a schematic cross-sectional view illustrating a display device of one embodiment of the present invention.

Next, a display device of another embodiment of the present invention is described with reference to FIG. 16. FIG. 16 is a cross-sectional view taken along the dashed-dotted line A-B and the dashed-dotted line C-D in FIG. 9A. Note that in FIG. 16, portions having functions similar to those of portions in FIG. 9B are given the same reference numerals as in FIG. 9B, and a detailed description of the portions is omitted.

The display device 600 in FIG. 16 includes a sealing layer 607*a*, a sealing layer 607*b*, and a sealing layer 607*c* in a region 607 surrounded by the element substrate 610, the sealing substrate 604, and the sealant 605. For one or more of the sealing layer 607*a*, the sealing layer 607*b*, and the sealing layer 607*c*, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layers 607*a*, 607*b*, and 607*c* can prevent deterioration of the light-emitting element 618 due to impurities such as water, which is preferable. In the case where the sealing layers 607*a*, 607*b*, and 607*c* are formed, the sealant 605 is not necessarily provided.

Alternatively, any one or two of the sealing layers 607*a*, 607*b*, and 607*c* may be provided or four or more sealing layers may be formed. When the sealing layer has a multilayer structure, the impurities such as water can be effectively prevented from entering the light-emitting element 618 which is inside the display device from the outside of the display device 600. In the case where the sealing layer has a multilayer structure, a resin and an organic material are preferably stacked.

Structure Example 6 of Display Device

Although the display devices in the structure examples 1 to 4 in this embodiment each have a structure including optical elements, one embodiment of the present invention does not necessarily include an optical element.

Figure 17A:
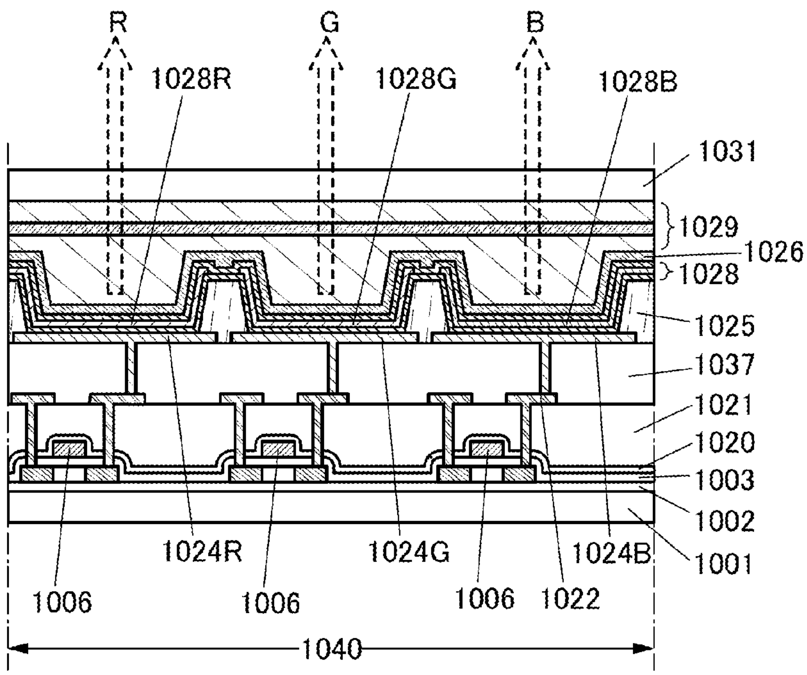
FIGS. 17A and 17B are schematic cross-sectional views each illustrating a display device of one embodiment of the present invention.
Figure 17B:
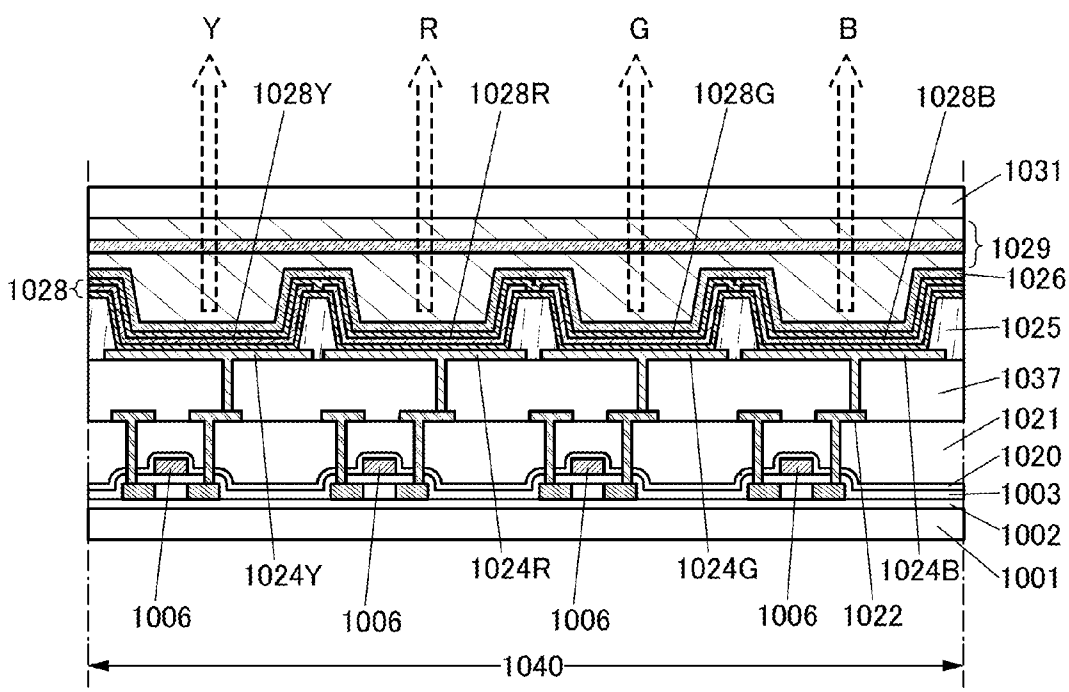

FIGS. 17A and 17B each illustrate a display device having a structure in which light is extracted from the sealing substrate 1031 side (a top-emission display device). FIG. 17A illustrates an example of a display device including a light-emitting layer 1028R, a light-emitting layer 1028G, and a light-emitting layer 1028B. FIG. 17B illustrates an example of a display device including a light-emitting layer 1028R, a light-emitting layer 1028G, a light-emitting layer 1028B, and a light-emitting layer 1028Y.

The light-emitting layer 1028R has a function of exhibiting red light, the light-emitting layer 1028G has a function of exhibiting green light, and the light-emitting layer 1028B has a function of exhibiting blue light. The light-emitting layer 1028Y has a function of exhibiting yellow light or a function of exhibiting light of a plurality of colors selected from blue, green, and red. The light-emitting layer 1028Y may exhibit whit light. Since the light-emitting element which exhibits yellow or white light has high light emission efficiency, the display device including the light-emitting layer 1028Y can have lower power consumption.

Each of the display devices in FIGS. 17A and 17B does not necessarily include coloring layers serving as optical elements because EL layers exhibiting lights of different colors are included in sub-pixels.

For the sealing layer 1029, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer 1029 can prevent deterioration of the light-emitting element due to impurities such as water, which is preferable.

Alternatively, the sealing layer 1029 may have a single-layer or two-layer structure, or four or more sealing layers may be formed as the sealing layer 1029. When the sealing layer has a multilayer structure, the impurities such as water can be effectively prevented from entering the inside of the display device from the outside of the display device. In the case where the sealing layer has a multilayer structure, a resin and an organic material are preferably stacked.

Note that the sealing substrate 1031 has a function of protecting the light-emitting element. Thus, for the sealing substrate 1031, a flexible substrate or a film can be used.

Note that the structures described in this embodiment can be combined as appropriate with any of the other structures in this embodiment and the other embodiments.

Embodiment 5

In this embodiment, a display device including a light-emitting element of one embodiment of the present invention will be described with reference to FIGS. 20A and 20B, FIGS. 21A and 21B, and FIGS. 22A and 22B.

Figure 20A:
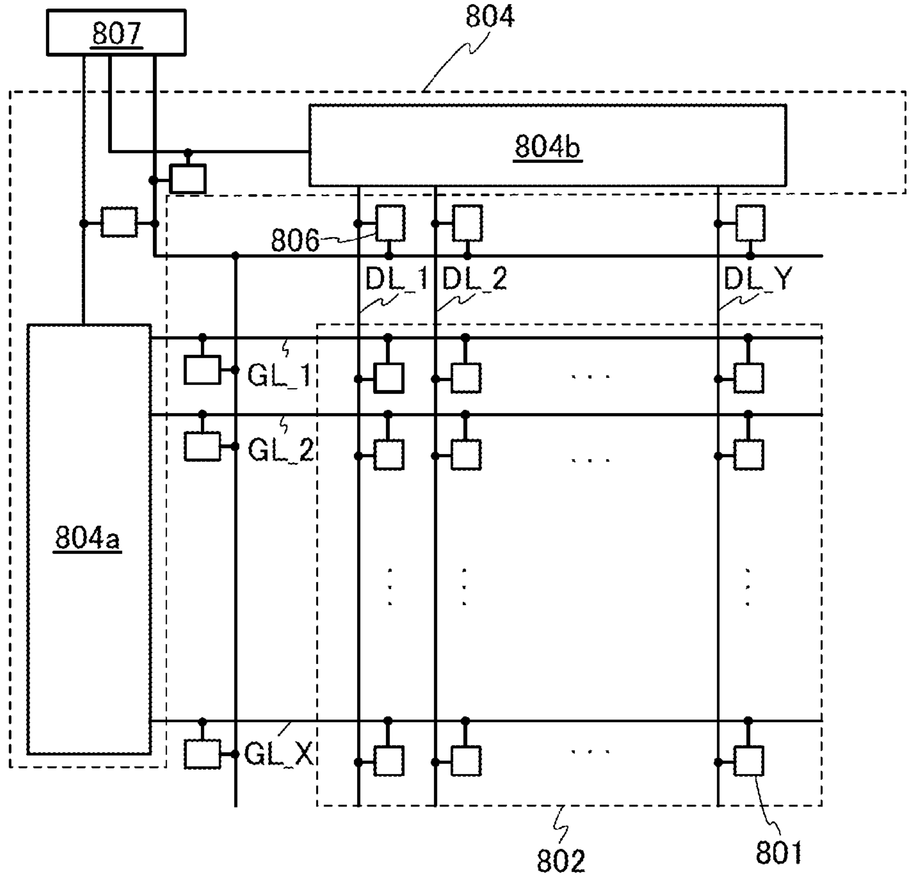
FIGS. 20A and 20B are a block diagram and a circuit diagram illustrating a display device of one embodiment of the present invention.
Figure 20B:
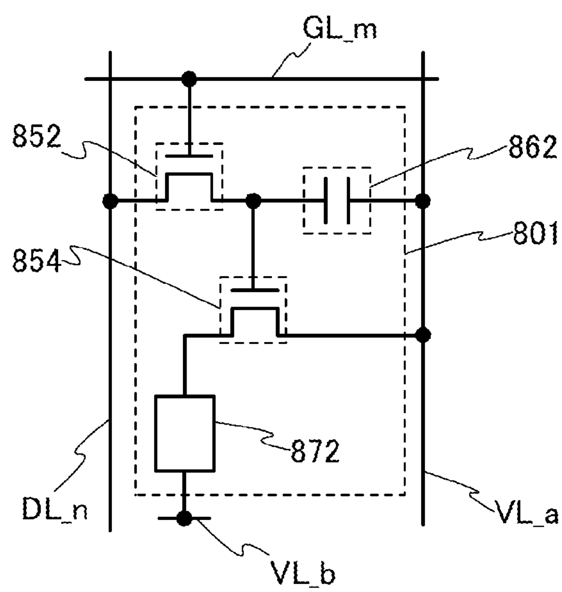

FIG. 20A is a block diagram illustrating the display device of one embodiment of the present invention, and FIG. 20B is a circuit diagram illustrating a pixel circuit of the display device of one embodiment of the present invention.

<Description of Display Device>

The display device illustrated in FIG. 20A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804*a*) and a circuit for supplying a signal (data signal) to drive a display element in a pixel (the circuit is hereinafter referred to as a signal line driver circuit 804*b*).

The scan line driver circuit 804*a* includes a shift register or the like. Through the terminal portion 807, the scan line driver circuit 804*a* receives a signal for driving the shift register and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (such wirings are hereinafter referred to as scan lines GL_1 to GL_X). Note that a plurality of scan line driver circuits 804*a* may be provided to control the scan lines GL_1 to GL_X separately. Alternatively, the scan line driver circuit 804*a* has a function of supplying an initialization signal. Without being limited thereto, the scan line driver circuit 804*a* can supply another signal.

The signal line driver circuit 804*b* includes a shift register or the like. The signal line driver circuit 804*b* receives a signal (image signal) from which a data signal is derived, as well as a signal for driving the shift register, through the terminal portion 807. The signal line driver circuit 804*b* has a function of generating a data signal to be written to the pixel circuit 801 which is based on the image signal. In addition, the signal line driver circuit 804*b* has a function of controlling output of a data signal in response to a pulse signal produced by input of a start pulse signal, a clock signal, or the like. Furthermore, the signal line driver circuit 804*b* has a function of controlling the potentials of wirings supplied with data signals (such wirings are hereinafter referred to as data lines DL_1 to DL_Y). Alternatively, the signal line driver circuit 804*b* has a function of supplying an initialization signal. Without being limited thereto, the signal line driver circuit 804*b* can supply another signal.

The signal line driver circuit 804*b* includes a plurality of analog switches or the like, for example. The signal line driver circuit 804*b* can output, as the data signals, signals obtained by time-dividing the image signal by sequentially turning on the plurality of analog switches. The signal line driver circuit 804*b* may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804*a*. For example, to the pixel circuit 801 in the m-th row and the n-th column (m is a natural number of less than or equal to X, and n is a natural number of less than or equal to Y), a pulse signal is input from the scan line driver circuit 804*a* through the scan line GL_m, and a data signal is input from the signal line driver circuit 804*b* through the data line DL_n in accordance with the potential of the scan line GL_m.

The protection circuit 806 shown in FIG. 20A is connected to, for example, the scan line GL between the scan line driver circuit 804*a* and the pixel circuit 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 20A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804*a* or a configuration in which the protection circuits 806 are connected to the signal line driver circuit 804*b* may be employed. Alternatively, the protection circuits 806 may be configured to be connected to the terminal portion 807.

In FIG. 20A, an example in which the driver circuit portion 804 includes the scan line driver circuit 804*a* and the signal line driver circuit 804*b* is shown; however, the structure is not limited thereto. For example, only the scan line driver circuit 804*a* may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 20A can have a structure illustrated in FIG. 20B, for example.

The pixel circuit 801 illustrated in FIG. 20B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 20B, the pixel circuits 801 are sequentially selected row by row by the scan line driver circuit 804*a* in FIG. 20A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 21A and 21B and FIGS. 22A and 22B illustrate examples of the pixel circuit.

Figure 21A:
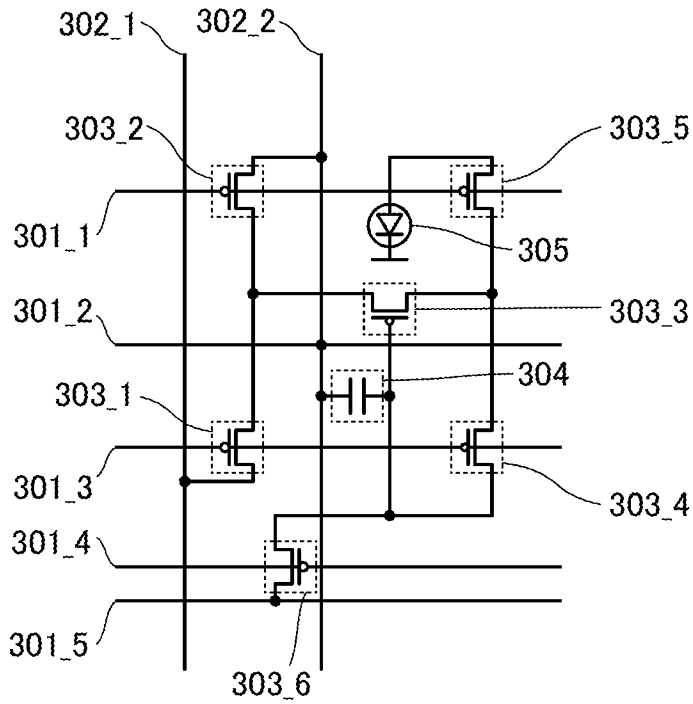
FIGS. 21A and 21B are circuit diagrams each illustrating a pixel circuit of a display device of one embodiment of the present invention.

The pixel circuit illustrated in FIG. 21A includes six transistors (transistors 303_1 to 303_6), a capacitor 304, and a light-emitting element 305. The pixel circuit illustrated in FIG. 21A is electrically connected to wirings 301_1 to 301_5 and wirings 302_1 and 302_2. Note that as the transistors 303_1 to 303_6, for example, p-channel transistors can be used.

Figure 21B:
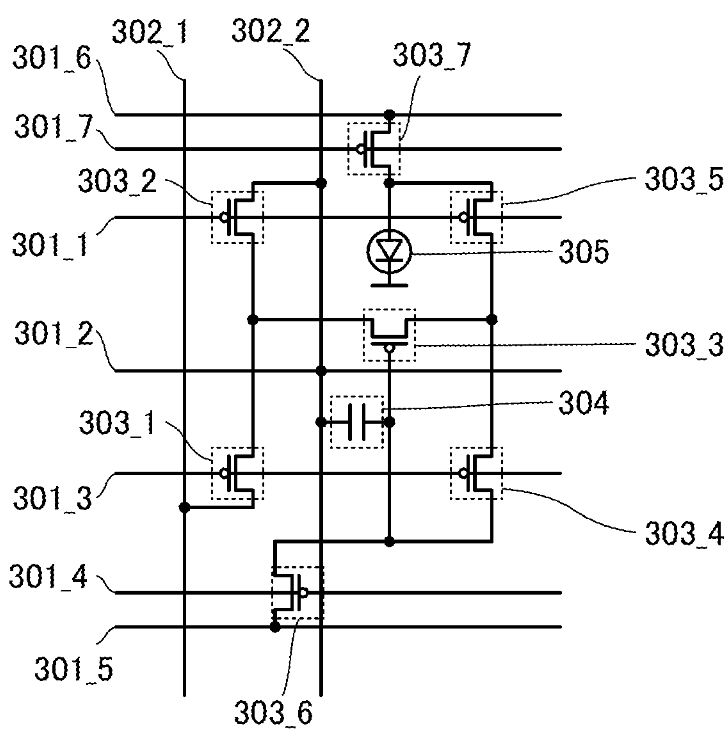

The pixel circuit shown in FIG. 21B has a configuration in which a transistor 303_7 is added to the pixel circuit shown in FIG. 21A. The pixel circuit illustrated in FIG. 21B is electrically connected to wirings 301_6 and 301_7. The wirings 301_5 and 301_6 may be electrically connected to each other. Note that as the transistor 303_7, for example, a p-channel transistor can be used.

Figure 22A:
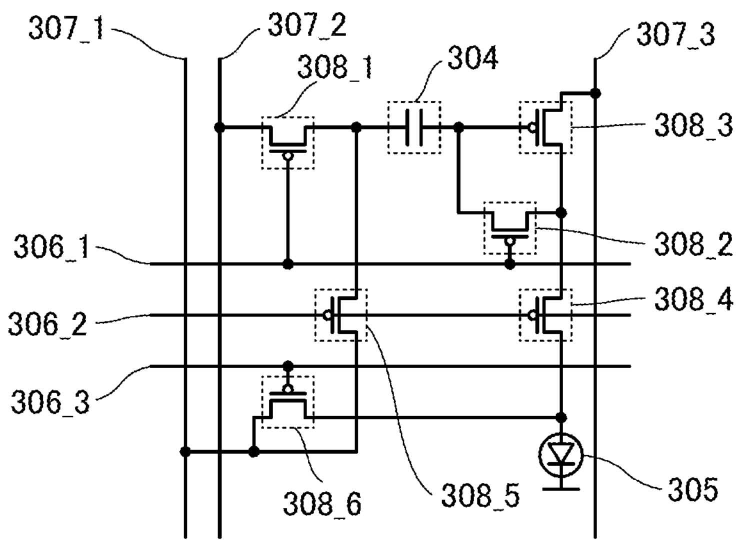
FIGS. 22A and 22B are circuit diagrams each illustrating a pixel circuit of a display device of one embodiment of the present invention.

The pixel circuit shown in FIG. 22A includes six transistors (transistors 308_1 to 308_6), the capacitor 304, and the light-emitting element 305. The pixel circuit illustrated in FIG. 22A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 22B:
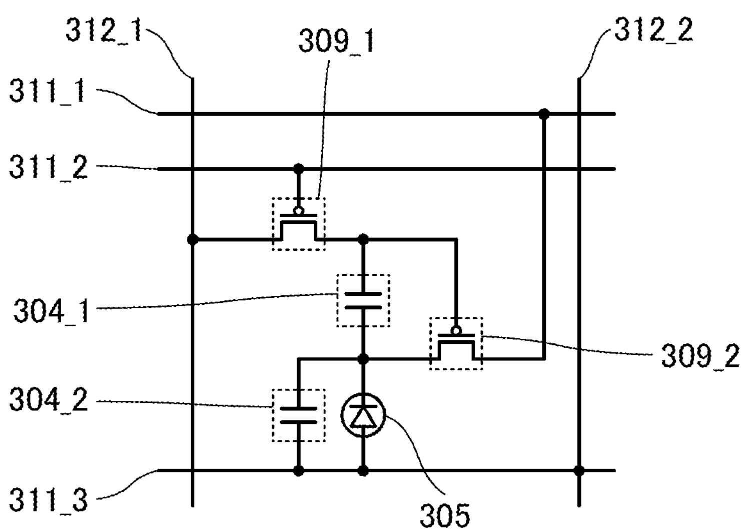

The pixel circuit illustrated in FIG. 22B includes two transistors (transistors 309_1 and 309_2), two capacitors (capacitors 304_1 and 304_2), and the light-emitting element 305. The pixel circuit illustrated in FIG. 22B is electrically connected to wirings 311_1 to 311_3 and wirings 312_1 and 312_2. With the configuration of the pixel circuit illustrated in FIG. 22B, the pixel circuit can be driven by a voltage inputting current driving method (also referred to as CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in appropriate combination with the structure described in any of the other embodiments.

Embodiment 6

In this embodiment, a display device including a light-emitting element of one embodiment of the present invention and an electronic device in which the display device is provided with an input device will be described with reference to FIGS. 23A and 23B, FIGS. 24A to 24C, FIGS. 25A and 25B, FIGS. 26A and 26B, and FIG. 27.

<Description 1 of Touch Panel>

In this embodiment, a touch panel 2000 including a display device and an input device will be described as an example of an electronic device. In addition, an example in which a touch sensor is used as an input device will be described.

Figure 23A:
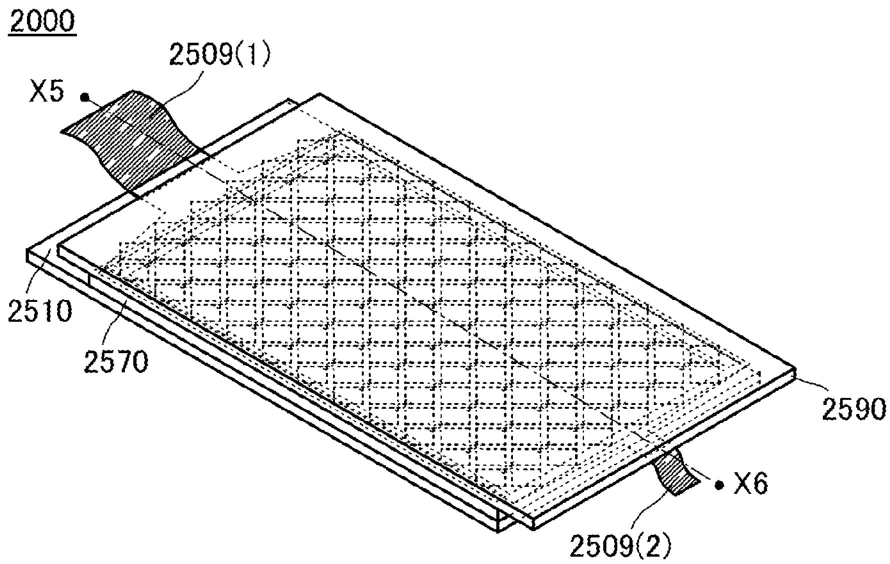
FIGS. 23A and 23B are perspective views of an example of a touch panel of one embodiment of the present invention.
Figure 23B:
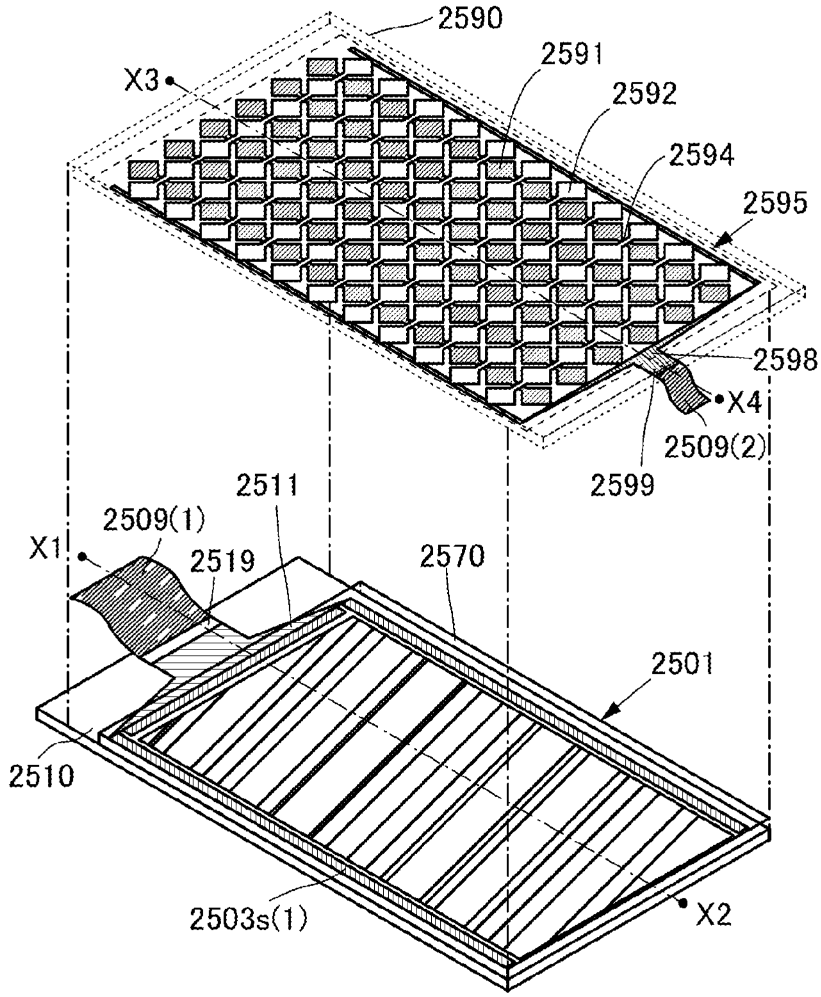

FIGS. 23A and 23B are perspective views of the touch panel 2000. Note that FIGS. 23A and 23B illustrate only main components of the touch panel 2000 for simplicity.

The touch panel 2000 includes a display device 2501 and a touch sensor 2595 (see FIG. 23B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503*s*(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 23B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 23B is an example of using a projected capacitive touch sensor.

Note that a variety of sensors that can sense approach or contact of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 23A and 23B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Next, the display device 2501 will be described in detail with reference to FIG. 24A.

Figure 24A:
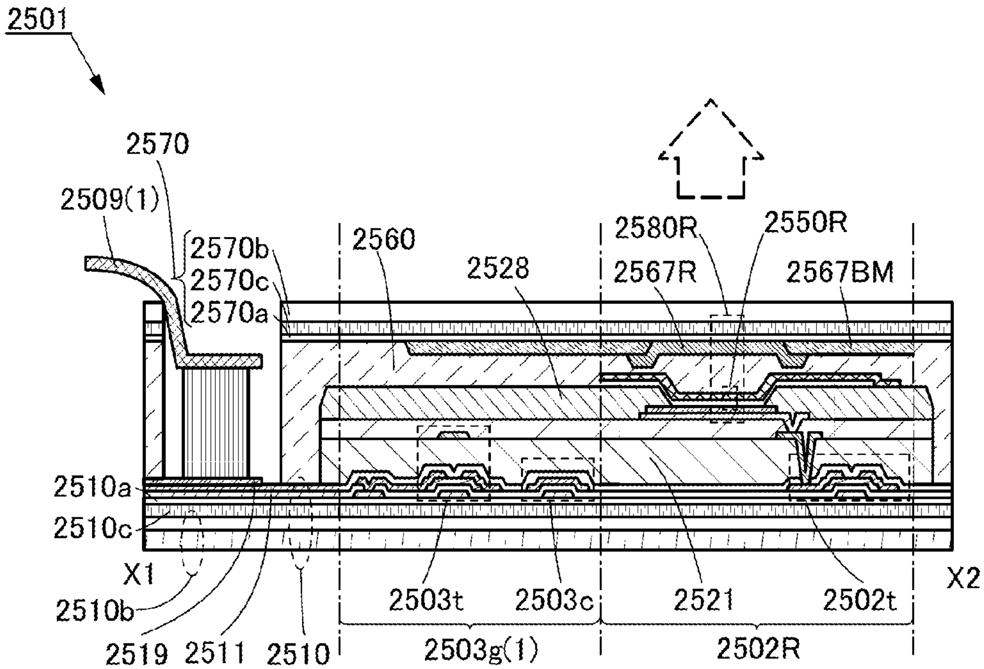
FIGS. 24A to 24C are cross-sectional views of examples of a display device and a touch sensor of one embodiment of the present invention.

FIG. 24A corresponds to a cross-sectional view taken along dashed-dotted line X1-X2 in FIG. 23B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer **2510*a* for preventing impurity diffusion into the light-emitting element, a flexible substrate 2510*b*, and an adhesive layer 2510*c* for attaching the insulating layer 2510*a* and the flexible substrate 2510*b* to each other. The substrate 2570 is a stacked body including an insulating layer 2570*a* for preventing impurity diffusion into the light-emitting element, a flexible substrate 2570*b*, and an adhesive layer 2570*c* for attaching the insulating layer 2570*a* and the flexible substrate 2570*b*** to each other.

For the adhesive layer **2510*c* and the adhesive layer 2570*c***, for example, polyester, polyolefin, polyamide (e.g., nylon, aramid), polyimide, polycarbonate, or acrylic, urethane, or epoxy can be used. Alternatively, a material that includes a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 24A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. Alternatively, a resin such as acrylic or epoxy may be used instead of the sealing layer 2560. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor **2502*t* that can supply electric power to the light-emitting element 2550R. Note that the transistor 2502*t* functions as part of the pixel circuit. The light-emitting module 2580R includes the light-emitting element 2550R and a coloring layer 2567**R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 24A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502*t*. Note that the insulating layer 2521 has a function of covering unevenness caused by the pixel circuit. The insulating layer 2521 may have a function of suppressing impurity diffusion. This can prevent the reliability of the transistor 2502*t* or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503*g*(1) includes a transistor 2503*t* and a capacitor 2503*c*. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 24B:
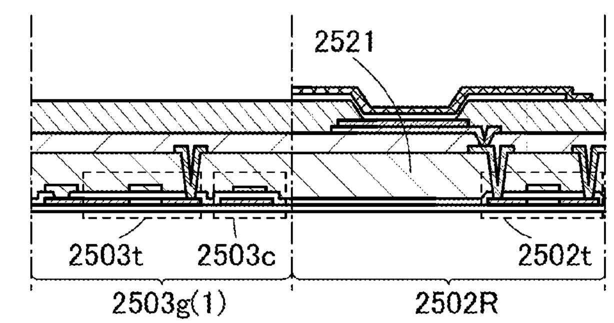

In the display device 2501, transistors with any of a variety of structures can be used. FIG. 24A illustrates an example of using bottom-gate transistors; however, the present invention is not limited to this example, and top-gate transistors may be used in the display device 2501 as illustrated in FIG. 24B.

In addition, there is no particular limitation on the polarity of the transistor 2502*t* and the transistor 2503*t*. For these transistors, n-channel and p-channel transistors may be used, or either n-channel transistors or p-channel transistors may be used, for example. Furthermore, there is no particular limitation on the crystallinity of a semiconductor film used for the transistors 2502*t* and 2503*t*. For example, an amorphous semiconductor film or a crystalline semiconductor film may be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502*t* and 2503*t* or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 24C:
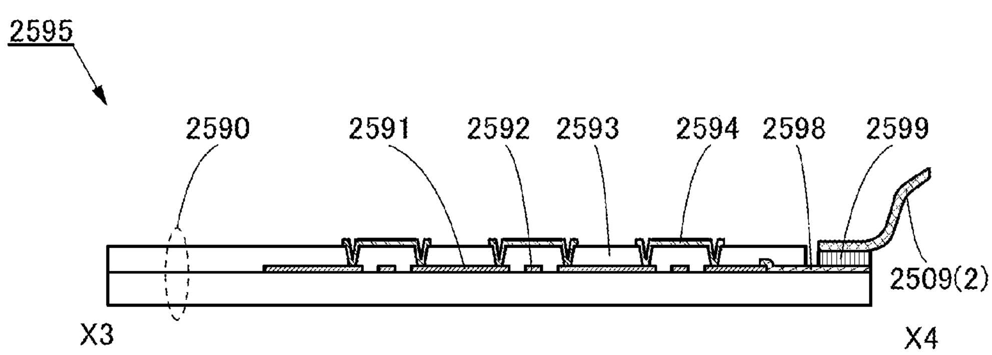

Next, the touch sensor 2595 will be described in detail with reference to FIG. 24C. FIG. 24C corresponds to a cross-sectional view taken along dashed-dotted line X3-X4 in FIG. 23B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), and the like can be used.

<Description 2 of Touch Panel>

Figure 25A:
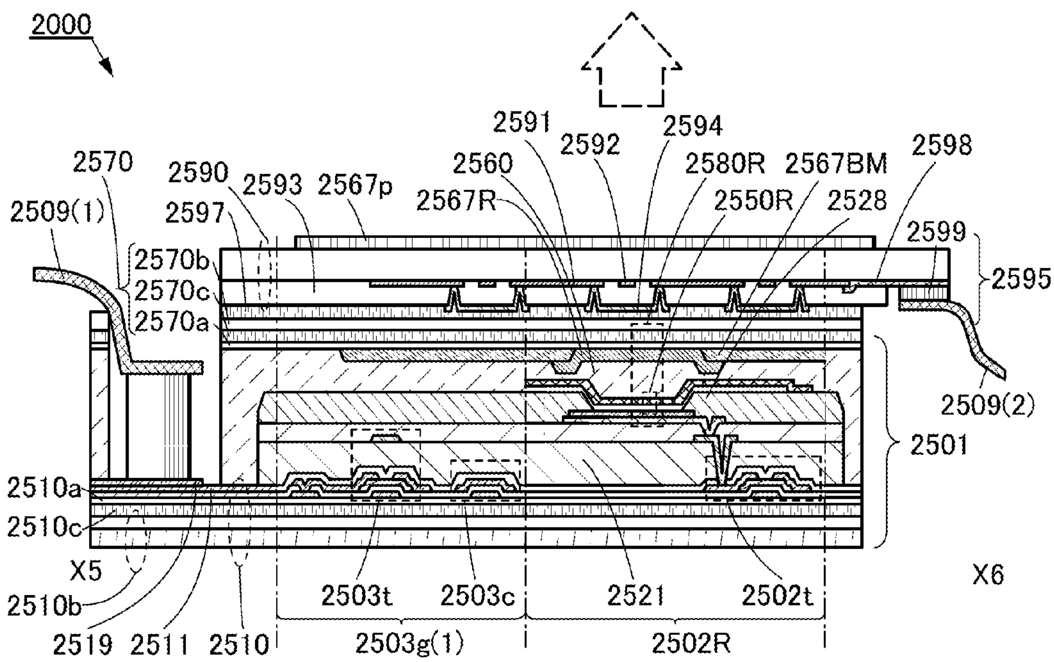
FIGS. 25A and 25B are cross-sectional views of examples of a touch panel of one embodiment of the present invention.

Next, the touch panel 2000 will be described in detail with reference to FIG. 25A. FIG. 25A corresponds to a cross-sectional view taken along dashed-dotted line X5-X6 in FIG. 23A.

In the touch panel 2000 illustrated in FIG. 25A, the display device 2501 described with reference to FIG. 24A and the touch sensor 2595 described with reference to FIG. 24C are attached to each other.

The touch panel 2000 illustrated in FIG. 25A includes an adhesive layer 2597 and an anti-reflective layer 2567*p* in addition to the components described with reference to FIGS. 24A and 24C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567*p* is positioned in a region overlapping with pixels. As the anti-reflective layer 2567*p*, a circularly polarizing plate can be used, for example.

Next, a touch panel having a structure different from that illustrated in FIG. 25A will be described with reference to FIG. 25B.

Figure 25B:
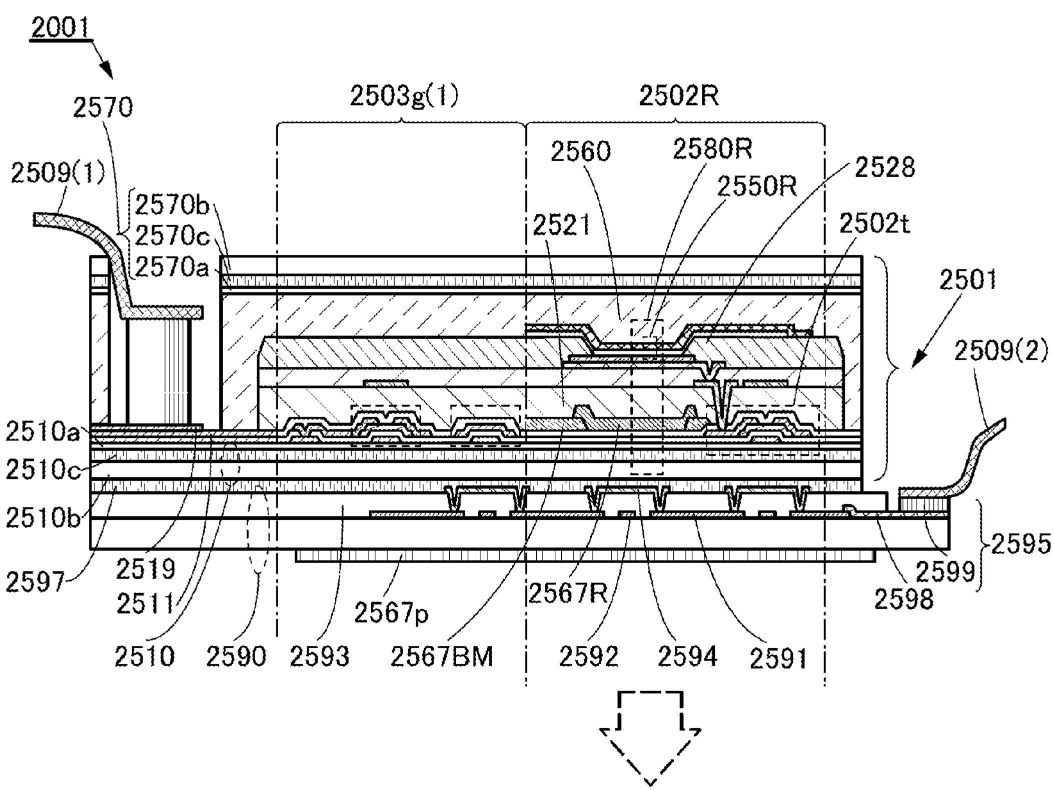

FIG. 25B is a cross-sectional view of a touch panel 2001. The touch panel 2001 illustrated in FIG. 25B differs from the touch panel 2000 illustrated in FIG. 25A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 25B emits light to the side where the transistor 2502*t* is provided. Accordingly, part of light emitted from the light-emitting element 2550R passes through the coloring layer 2567R and is emitted to the outside of the light-emitting module 2580R as indicated by an arrow in FIG. 25B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 25A or 25B, light may be emitted from the light-emitting element through one or both of the substrate 2510 and the substrate 2570.

<Description of Method for Driving Touch Panel>

Next, an example of a method for driving a touch panel will be described with reference to FIGS. 26A and 26B.

Figure 26A:
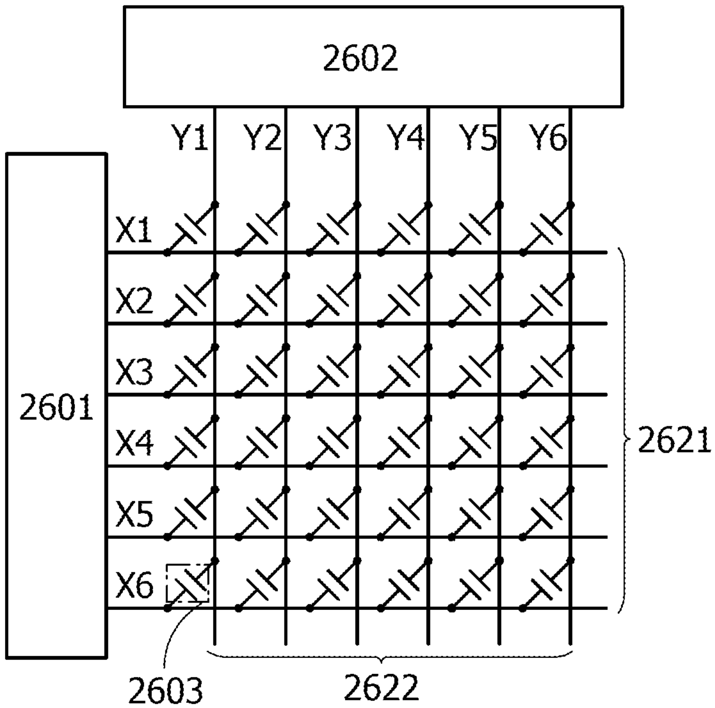
FIGS. 26A and 26B are a block diagram and a timing chart of a touch sensor of one embodiment of the present invention.

FIG. 26A is a block diagram illustrating the structure of a mutual capacitive touch sensor. FIG. 26A illustrates a pulse voltage output circuit 2601 and a current sensing circuit 2602. Note that in FIG. 26A, six wirings X1 to X6 represent the electrodes 2621 to which a pulse voltage is applied, and six wirings Y1 to Y6 represent the electrodes 2622 that detect changes in current. FIG. 26A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 26B:
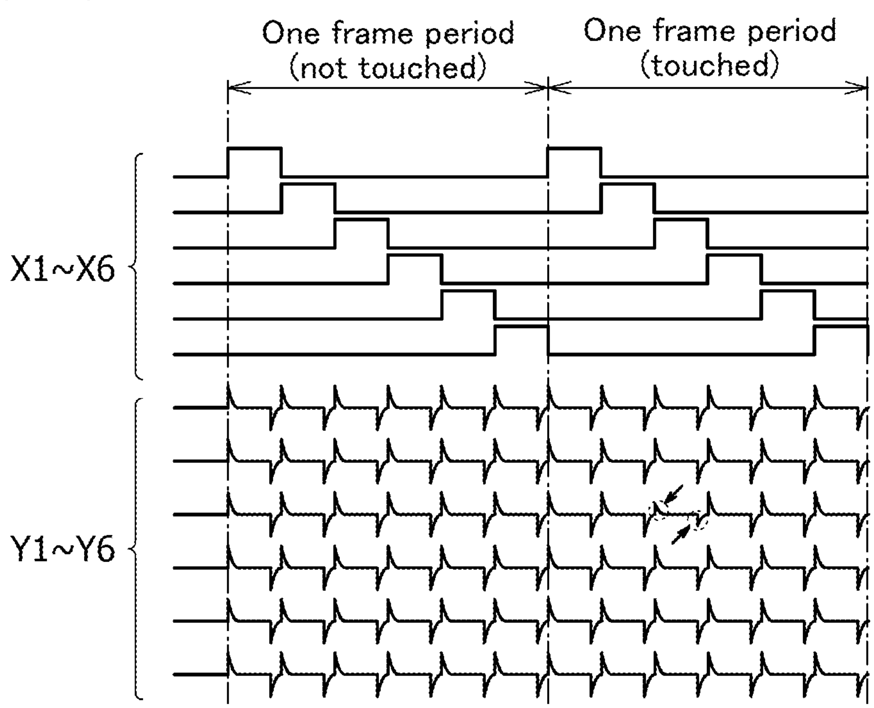

FIG. 26B is a timing chart showing input and output waveforms in the mutual capacitive touch sensor illustrated in FIG. 26A. In FIG. 26B, sensing of a sensing target is performed in all the rows and columns in one frame period. FIG. 26B shows a period when a sensing target is not sensed (not touched) and a period when a sensing target is sensed (touched). In FIG. 26B, sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 27:
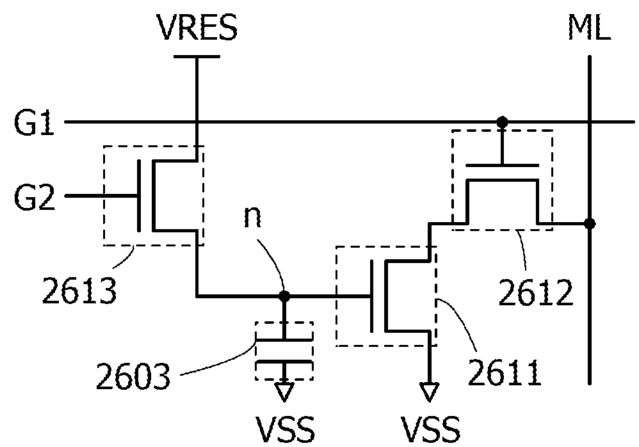
FIG. 27 is a circuit diagram of a touch sensor of one embodiment of the present invention.

Although FIG. 26A illustrates a passive matrix type touch sensor in which only the capacitor 2603 is provided at the intersection of wirings as a touch sensor, an active matrix type touch sensor including a transistor and a capacitor may be used. FIG. 27 illustrates an example of a sensor circuit included in an active matrix type touch sensor.

The sensor circuit in FIG. 27 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 27 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structures described in this embodiment can be used in appropriate combination with any of the structures described in the other embodiments.

Embodiment 7

In this embodiment, a display module and electronic devices including a light-emitting element of one embodiment of the present invention will be described with reference to FIG. 28, FIGS. 29A to 29G, FIGS. 30A to 30D, and FIGS. 31A and 31B.

<Description of Display Module>

Figure 28:
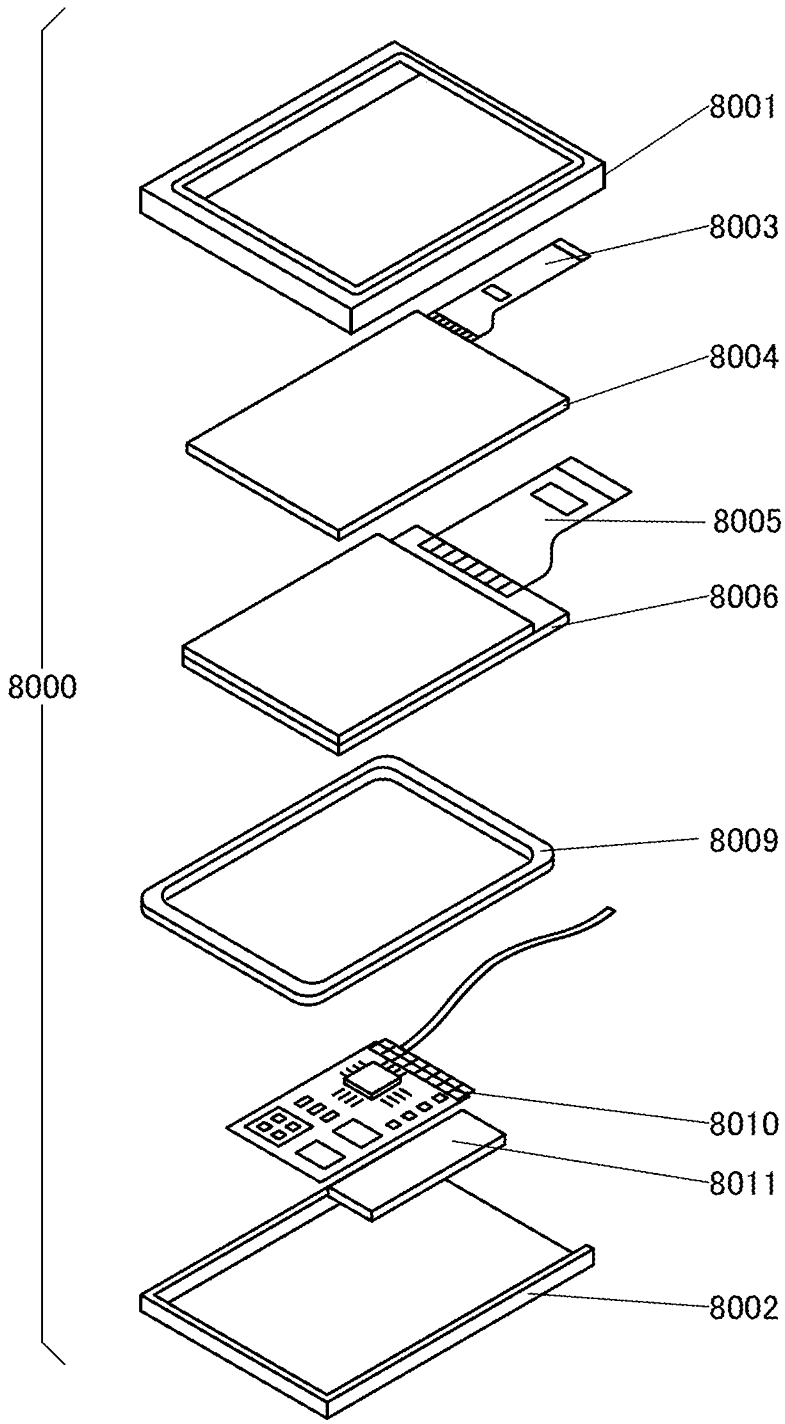
FIG. 28 is a perspective view illustrating a display module of one embodiment of the present invention.

In a display module 8000 in FIG. 28, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Description of Electronic Device>

FIGS. 29A to 29G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 29A to 29G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 29A to 29G are not limited to those described above, and the electronic devices can have a variety of functions. Although not illustrated in FIGS. 29A to 29G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 29A to 29G will be described in detail below.

Figure 29A:
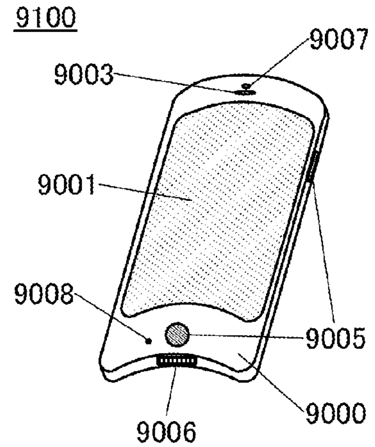
FIGS. 29A to 29G illustrate electronic devices of one embodiment of the present invention.

FIG. 29A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 29D:
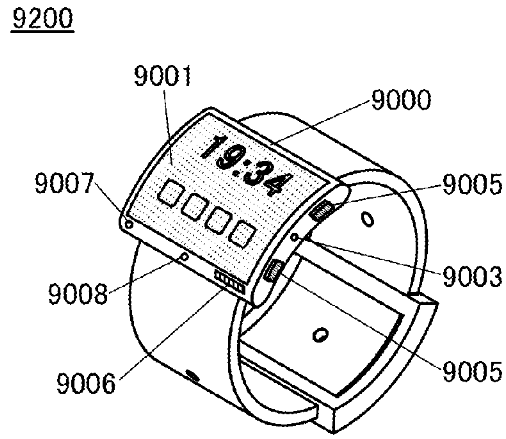
Figure 29B:
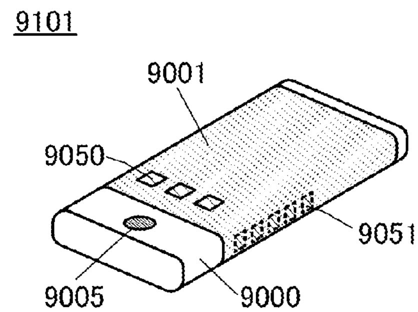

FIG. 29B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 29B, can be positioned in the portable information terminal 9101 as in the portable information terminal 9100 shown in FIG. 29A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 29E:
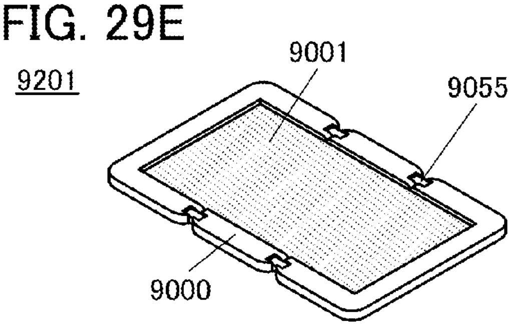
Figure 29F:
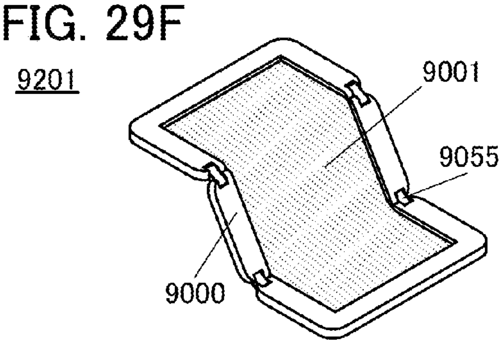
Figure 29C:
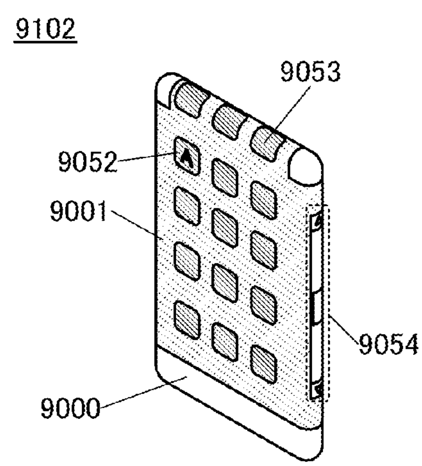

FIG. 29C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 29D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 29G:
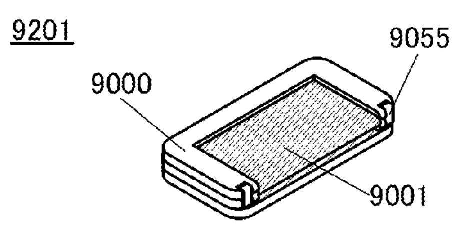

FIGS. 29E, 29F, and 29G are perspective views of a foldable portable information terminal 9201. FIG. 29E is a perspective view illustrating the portable information terminal 9201 that is opened. FIG. 29F is a perspective view illustrating the portable information terminal 9201 that is being opened or being folded. FIG. 29G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Figure 30A:
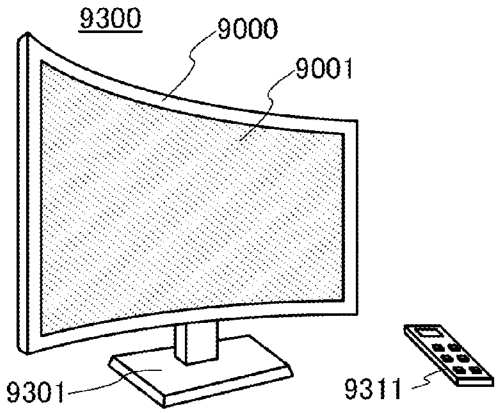
FIGS. 30A to 30D illustrate electronic devices of one embodiment of the present invention.

FIG. 30A illustrates an example of a television set. In the television set 9300, the display portion 9001 is incorporated into the housing 9000. Here, the housing 9000 is supported by a stand 9301.

The television set 9300 illustrated in FIG. 30A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

The electronic device or the lighting device of one embodiment of the present invention has flexibility and therefore can be incorporated along a curved inside/outside wall surface of a house or a building or a curved interior/exterior surface of a car.

Figure 30B:
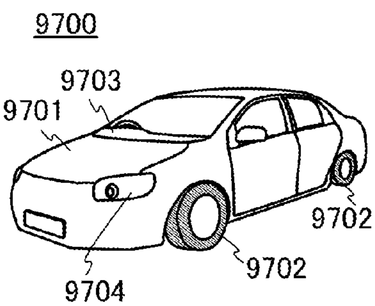
Figure 30C:
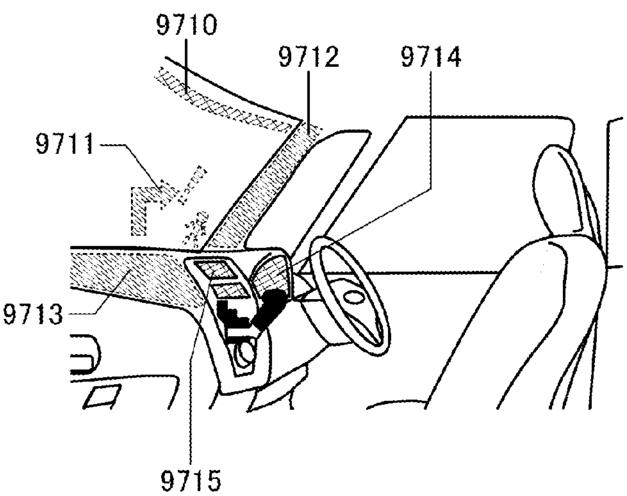

FIG. 30B is an external view of an automobile 9700. FIG. 30C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 30C.

The display portion 9710 and the display portion 9711 are each a display device provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 30D:
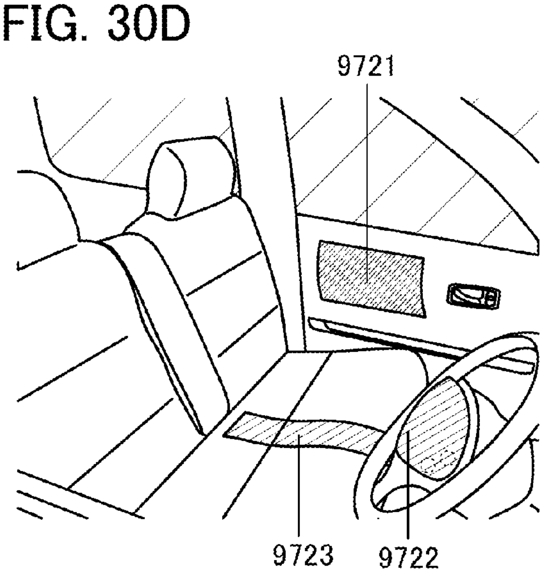

FIG. 30D illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 31A:
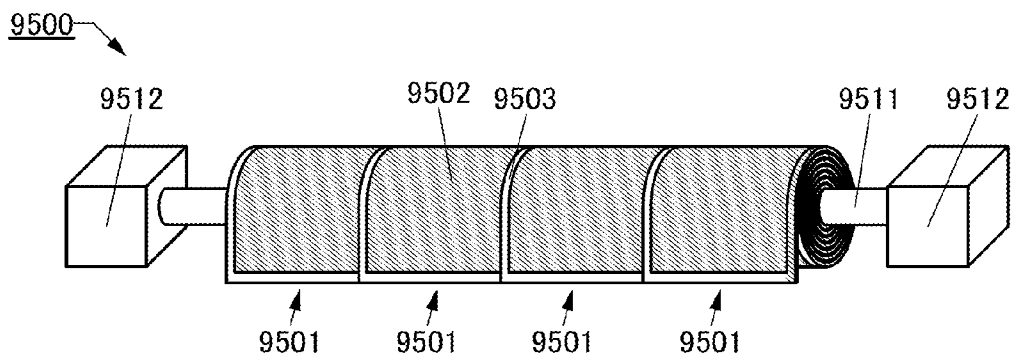
FIGS. 31A and 31B are perspective views illustrating a display device of one embodiment of the present invention.
Figure 31B:
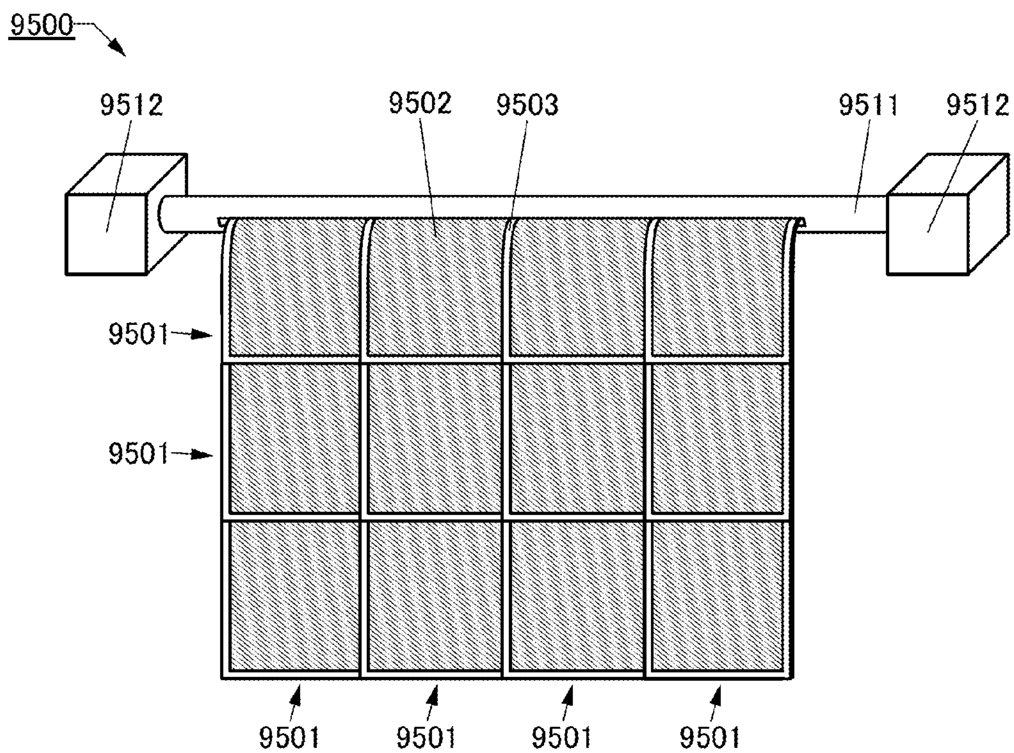

A display device 9500 illustrated in FIGS. 31A and 31B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 31A and 31B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with the structure described in any of the other embodiments.

Embodiment 8

In this embodiment, a light-emitting device including the light-emitting element of one embodiment of the present invention will be described with reference to FIGS. 32A to 32C and FIGS. 33A to 33D.

Figure 32A:
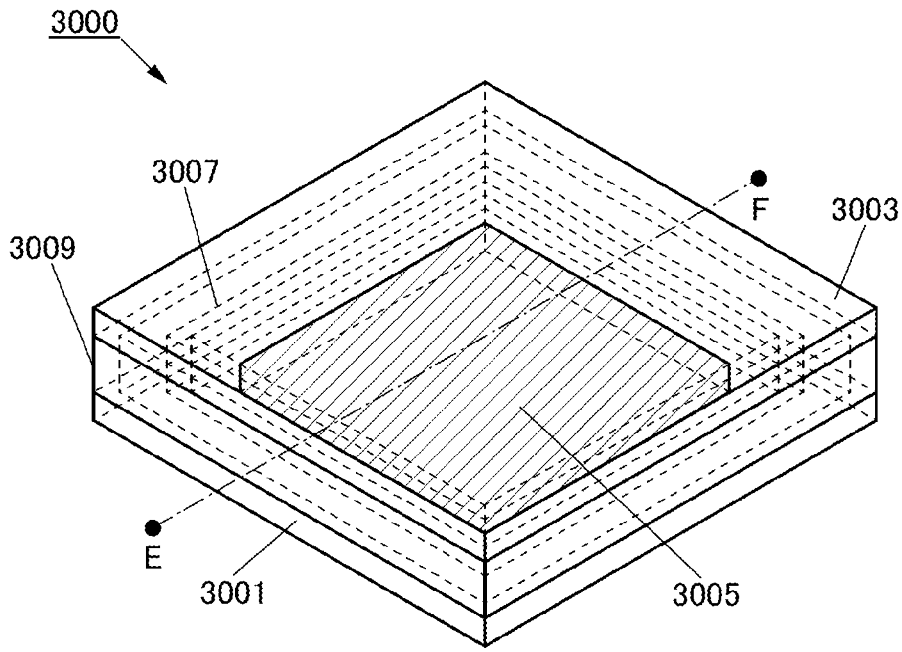
FIGS. 32A to 32C are a perspective view and cross-sectional views illustrating light-emitting devices of one embodiment of the present invention.
Figure 32B:
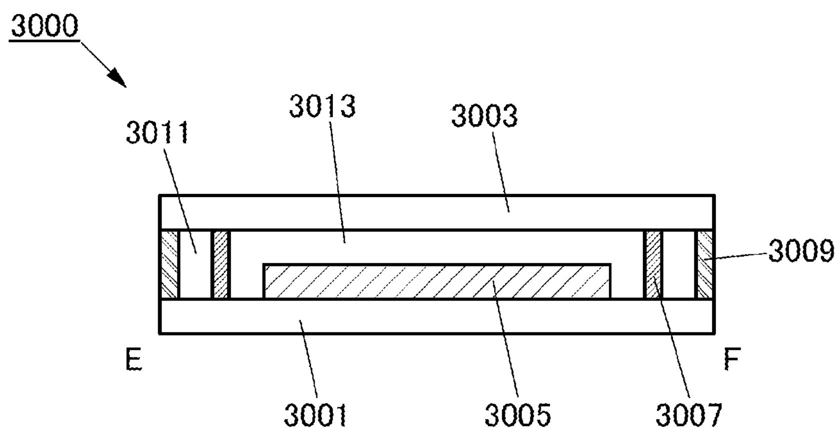

FIG. 32A is a perspective view of a light-emitting device 3000 shown in this embodiment, and FIG. 32B is a cross-sectional view along dashed-dotted line E-F in FIG. 32A. Note that in FIG. 32A, some components are illustrated by broken lines in order to avoid complexity of the drawing.

The light-emitting device 3000 illustrated in FIGS. 32A and 32B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 32A and 32B, a structure in which light is emitted from the light-emitting element 3005 to the lower side (the substrate 3001 side) is illustrated.

As illustrated in FIGS. 32A and 32B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 32B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in Embodiment 3, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, an acrylic resin, urethane, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 32B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with an inert gas such as a rare gas or a nitrogen gas, a resin such as acrylic or epoxy, or the like. Note that for the first region 3011 and the second region 3013, a reduced pressure state is preferred to an atmospheric pressure state.

Figure 32C:
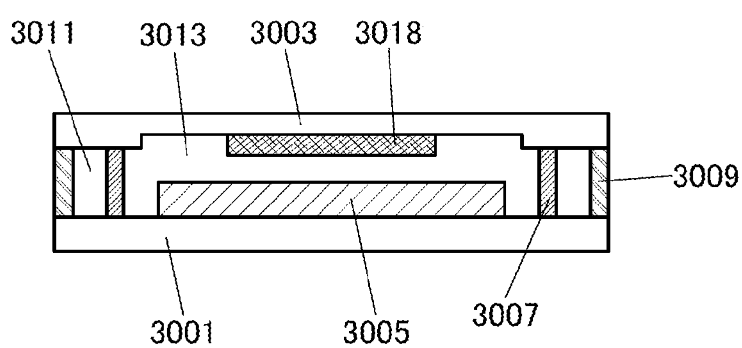

FIG. 32C illustrates a modification example of the structure in FIG. 32B. FIG. 32C is a cross-sectional view illustrating the modification example of the light-emitting device 3000.

FIG. 32C illustrates a structure in which a desiccant 3018 is provided in a recessed portion provided in part of the substrate 3003. The other components are the same as those of the structure illustrated in FIG. 32B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 32B are described with reference to FIGS. 33A to 33D. Note that FIGS. 33A to 33D are cross-sectional views illustrating the modification examples of the light-emitting device 3000 illustrated in FIG. 32B.

In each of the light-emitting devices illustrated in FIGS. 33A to 33D, the second sealing region 3009 is not provided but only the first sealing region 3007 is provided. Moreover, in each of the light-emitting devices illustrated in FIGS. 33A to 33D, a region 3014 is provided instead of the second region 3013 illustrated in FIG. 32B.

For the region 3014, for example, materials that include polyester, polyolefin, polyamide (e.g., nylon or aramid), polyimide, polycarbonate, an acrylic resin, an epoxy resin, urethane, an epoxy resin, or a resin having a siloxane bond can be used.

When the above-described material is used for the region 3014, what is called a solid-sealing light-emitting device can be obtained.

Figure 33A:
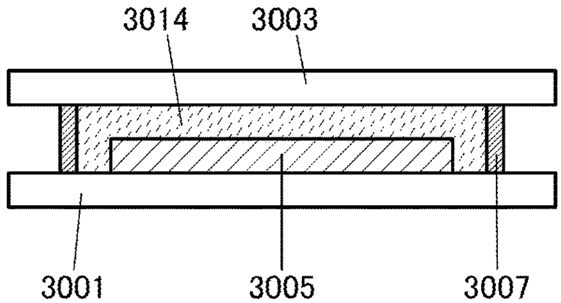
FIGS. 33A to 33D are cross-sectional views each illustrating a light-emitting device of one embodiment of the present invention.
Figure 33B:
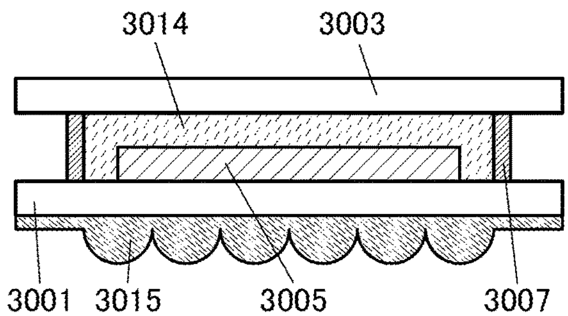

In the light-emitting device illustrated in FIG. 33B, a substrate 3015 is provided on the substrate 3001 side of the light-emitting device illustrated in FIG. 33A.

The substrate 3015 has unevenness as illustrated in FIG. 33B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 33B, a substrate having a function as a diffusion plate may be provided.

Figure 33C:
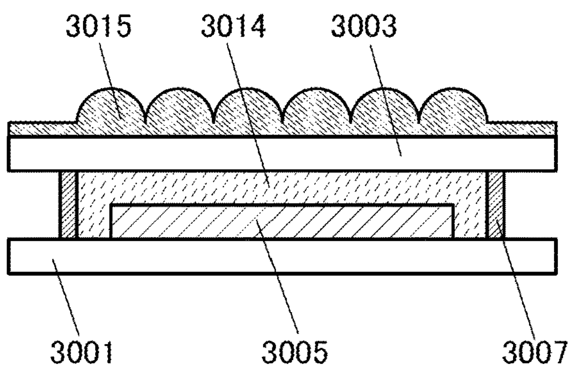

In the light-emitting device illustrated in FIG. 33C, light is extracted through the substrate 3003 side, unlike in the light-emitting device illustrated in FIG. 33A, in which light is extracted through the substrate 3001 side.

The light-emitting device illustrated in FIG. 33C includes the substrate 3015 on the substrate 3003 side. The other components are the same as those of the light-emitting device illustrated in FIG. 33B.

Figure 33D:
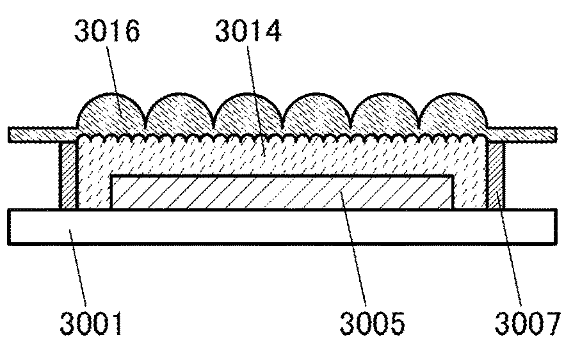

In the light-emitting device illustrated in FIG. 33D, the substrate 3003 and the substrate 3015 included in the light-emitting device illustrated in FIG. 33C are not provided but a substrate 3016 is provided.

The substrate 3016 includes first unevenness positioned closer to the light-emitting element 3005 and second unevenness positioned farther from the light-emitting element 3005. With the structure illustrated in FIG. 33D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined with the structure described in any of the other embodiments as appropriate.

Embodiment 9

In this embodiment, examples in which the light-emitting element of one embodiment of the present invention is used for various lighting devices and electronic devices will be described with reference to FIGS. 34A to 34C and FIG. 35.

An electronic device or a lighting device that has a light-emitting region with a curved surface can be obtained with the use of the light-emitting element of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 34A:
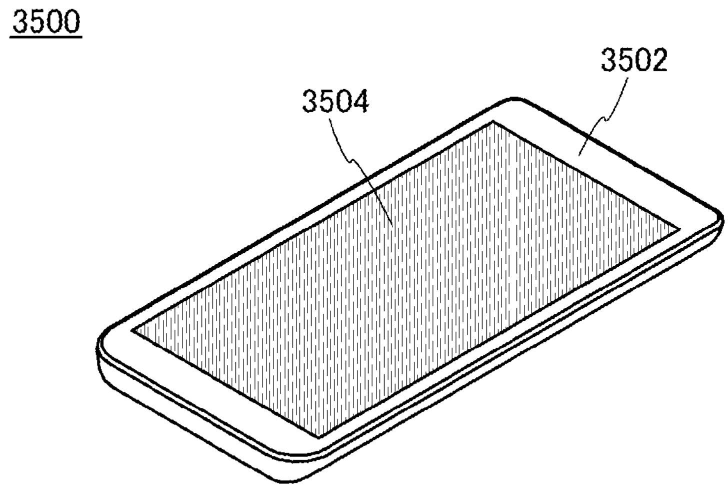
FIGS. 34A to 34C illustrate an electronic device and a lighting device of one embodiment of the present invention.
Figure 34B:
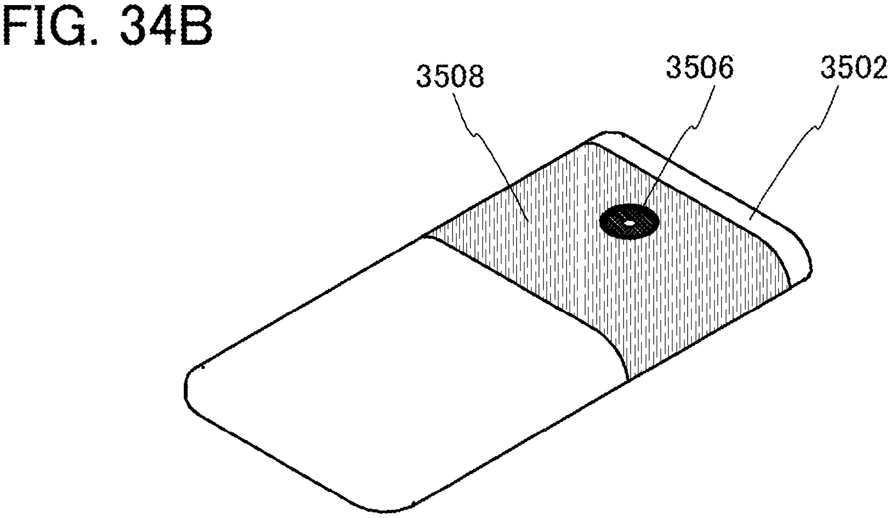

FIG. 34A is a perspective view illustrating one surface of a multifunction terminal 3500, and FIG. 34B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 34A and 34B can have a variety of functions as in the electronic devices illustrated in FIGS. 29A to 29G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 34C:
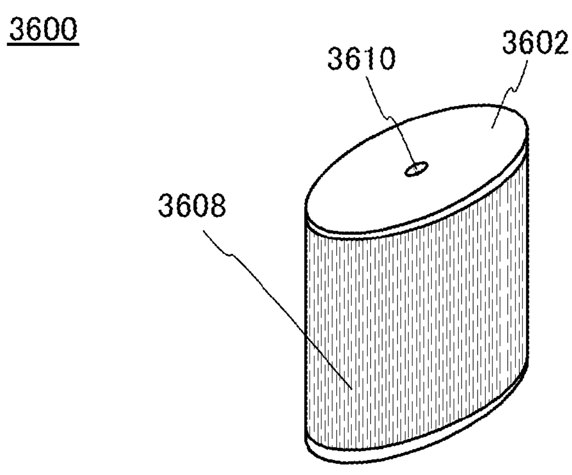

FIG. 34C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 35:
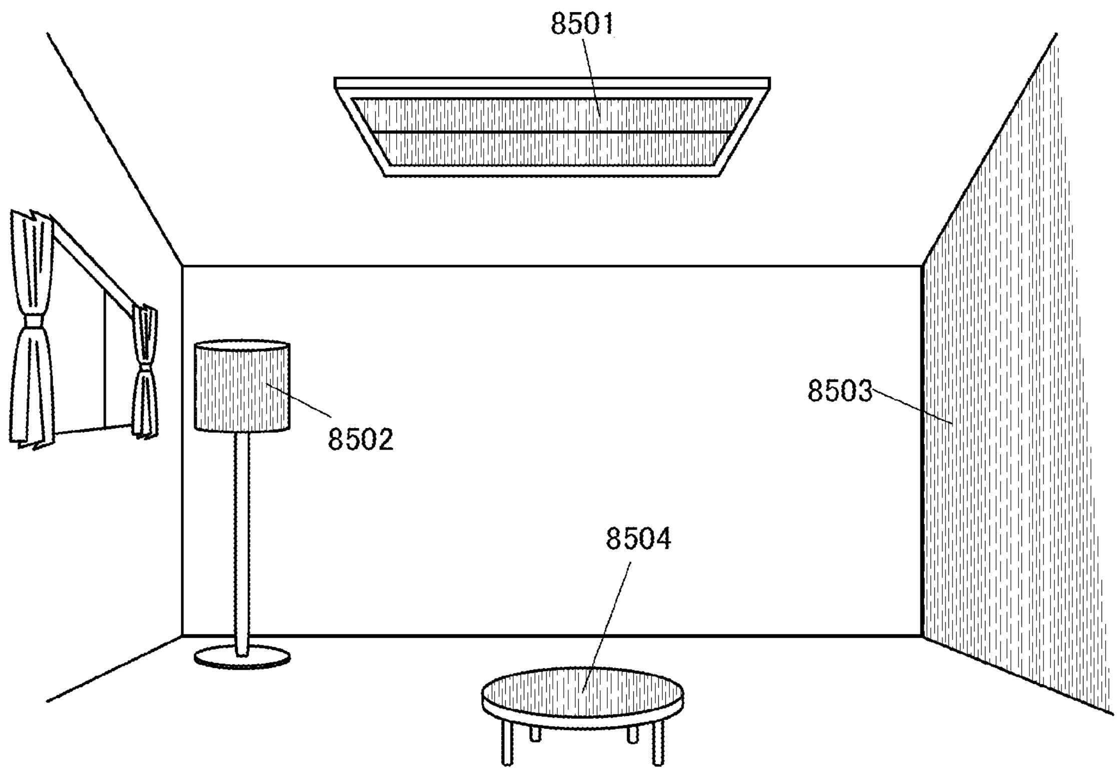
FIG. 35 illustrates lighting devices of one embodiment of the present invention.

FIG. 35 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

Note that the structures described in this embodiment can be used in appropriate combination with any of the structures described in the other embodiments.

EXPLANATION OF REFERENCE

100: EL layer, 101: electrode, 101*a*: conductive layer, 101*b*: conductive layer, 101*c*: conductive layer, 102: electrode,

103: electrode, 103*a*: conductive layer, 103*b*: conductive layer, 104: electrode, 104*a*: conductive layer, 104*b*: conductive layer, 111: hole-injection layer, 112: hole-transport layer, 113: electron-transport layer, 114: electron-injection layer, 123B: light-emitting layer, 123G: light-emitting layer, 123R: light-emitting layer, 130: light-emitting layer, 131: high molecular material, 131_1: skeleton, 131_2: skeleton, 131_3: skeleton, 131_4: skeleton, 132: guest material, 140: light-emitting layer, 141: high molecular material, 141_1: skeleton, 141_2: skeleton, 141_3: skeleton, 141_4: skeleton, 142: guest material, 145: partition wall, 150: light-emitting element, 152: light-emitting element, 170: light-emitting layer, 200: substrate, 220: substrate, 221B: region, 221G: region, 221R: region, 222B: region, 222G: region, 222R: region, 223: light-blocking layer, 224B: optical element, 224G: optical element, 224R: optical element, 260*a*: light-emitting element, 260*b*: light-emitting element, 262*a*: light-emitting element, 262*b*: light-emitting element, 301_1: wiring, 301_5: wiring, 301_6: wiring, 301_7: wiring, 302_1: wiring, 302_2: wiring, 303_1: transistor, 303_6: transistor, 303_7: transistor, 304: capacitor, 304_1: capacitor, 304_2: capacitor, 305: light-emitting element, 306_1: wiring, 306_3: wiring, 307_1: wiring, 307_3: wiring, 308_1: transistor, 308_6: transistor, 309_1: transistor, 309_2: transistor, 311_1: wiring, 311_3: wiring, 312_1: wiring, 312_2: wiring, 600: display device, 601: signal line driver circuit portion, 602: pixel portion, 603: scan line driver circuit portion, 604: sealing substrate, 605: sealant, 607: region, 607*a*: sealing layer, 607*b*: sealing layer, 607*c*: sealing layer, 608: wiring, 609: FPC, 610: element substrate, 611: transistor, 612: transistor, 613: lower electrode, 614: partition wall, 616: EL layer, 617: upper electrode, 618: light-emitting element, 621: optical element, 622: light-blocking layer, 623: transistor, 624: transistor, 683: droplet discharge apparatus, 684: droplet, 685: layer containing composition, 801: pixel circuit, 802: pixel portion, 804: driver circuit portion, 804*a*: scan line driver circuit, 804*b*: signal line driver circuit, 806: protection circuit, 807: terminal portion, 852: transistor, 854: transistor, 862: capacitor, 872: light-emitting element, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: lower electrode, 1024G: lower electrode, 1024R: lower electrode, 1024Y: lower electrode, 1025: partition wall, 1026: upper electrode, 1028: EL layer, 1028B: light-emitting layer, 1028G: light-emitting layer, 1028R: light-emitting layer, 1028Y: light-emitting layer, 1029: sealing layer, 1031: sealing substrate, 1032: sealant, 1033: base material, 1034B: coloring layer, 1034G: coloring layer, 1034R: coloring layer, 1034Y: coloring layer, 1035: light-blocking layer, 1036: overcoat layer, 1037: interlayer insulating film, 1040: pixel portion, 1041: driver circuit portion, 1042: peripheral portion, 1400: droplet discharge apparatus, 1402: substrate, 1403: droplet discharge means, 1404: imaging means, 1405: head, 1407: control means, 1406: space, 1408: storage medium, 1409: image processing means, 1410: computer, 1411: marker, 1412: head, 1413: material source, 1414: material source, 2000: touch panel, 2001: touch panel, 2501: display device, 2502R: pixel, 2502*t*: transistor, 2503*c*: capacitor, 2503*g*: scan line driver circuit, 2503*s*: signal line driver circuit, 2503*t*: transistor, 2509: FPC, 2510: substrate, 2510*a*: insulating layer, 2510*b*: flexible substrate, 2510*c*: adhesive layer, 2511: wiring, 2519: terminal, 2521: insulating layer, 2528: partition wall, 2550R: light-emitting element, 2560: sealing layer, 2567BM: light-blocking layer, 2567*p*: anti-reflective layer, 2567R: coloring layer, 2570: substrate, 2570*a*: insulating layer, 2570*b*: flexible substrate, 2570*c*: adhesive layer, 2580R: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 3000: light-emitting device, 3001: substrate, 3003: substrate, 3005: light-emitting element, 3007: sealing region, 3009: sealing region, 3011: region, 3013: region, 3014: region, 3015: substrate, 3016: substrate, 3018: desiccant, 3500: multifunction terminal, 3502: housing, 3504: display portion, 3506: camera, 3508: lighting, 3600: light, 3602: housing, 3608: lighting, 3610: speaker, 8000: display module, 8001: upper cover, 8002: lower cover, 8003: FPC, 8004: touch sensor, 8005: FPC, 8006: display device, 8009: frame, 8010: printed board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9300: television set, 9301: stand, 9311: remote controller, 9500: display device, 9501: display panel, 9502: display region, 9503: region, 9511: hinge, 9512: bearing, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2015-103759 filed with Japan Patent Office on May 21, 2015, the entire contents of which are hereby incorporated by reference.

The invention claimed is:

1. A light-emitting element comprising:

a high molecular material comprising at least a first high molecular chain and a second high molecular chain; and a guest material, wherein each of the first high molecular chain and the second high molecular chain comprises:

a first skeleton comprising at least one of a π-electron rich heteroaromatic skeleton and an aromatic amine skeleton;

a second skeleton comprising a π-electron deficient heteroaromatic skeleton; and a third skeleton, wherein the first skeleton and the second skeleton are bonded to each other through the third skeleton, and wherein the first high molecular chain and the second high molecular chain are configured to form an excited complex.

2. The light-emitting element according to claim 1, wherein the π-electron rich heteroaromatic skeleton comprises at least one of a thiophene skeleton, a furan skeleton, and a pyrrole skeleton.

3. The light-emitting element according to claim 1, wherein the π-electron deficient heteroaromatic skeleton comprises at least one of a pyridine skeleton, a diazine skeleton, and a triazine skeleton.

4. The light-emitting element according to claim 1, wherein the guest material is configured to exhibit fluorescence.

5. The light-emitting element according to claim 1, wherein the guest material is configured to convert triplet excitation energy into light emission.

6. The light-emitting element according to claim 1, wherein the third skeleton comprises at least one of a biphenyl skeleton and a fluorene skeleton.

7. The light-emitting element according to claim 1, wherein the first high molecular chain and the second high molecular chain are configured to form the excited complex with the first skeleton in the first high molecular chain and the second skeleton in the second high molecular chain.

8. The light-emitting element according to claim 1, wherein the excited complex is configured to exhibit thermally activated delayed fluorescence at room temperature.

9. An electronic device comprising the light-emitting element according to claim 1.

* * * * *